United States Patent
New et al.

(10) Patent No.: US 7,145,360 B2
(45) Date of Patent: *Dec. 5, 2006

(54) CONFIGURABLE LOGIC ELEMENT WITH EXPANDER STRUCTURES

(75) Inventors: Bernard J. New, Carmel Valley, CA (US); Ralph D. Wittig, Menlo Park, CA (US); Sundararajarao Mohan, Sunnyvale, CA (US)

(73) Assignee: Xilinx, Inc., San Jose, CA (US)

(\*) Notice: Subject to any disclaimer, the term of this patent is extended or adjusted under 35 U.S.C. 154(b) by 77 days.

This patent is subject to a terminal disclaimer.

(21) Appl. No.: 10/990,227

(22) Filed: Nov. 16, 2004

(65) Prior Publication Data

US 2005/0062498 A1    Mar. 24, 2005

Related U.S. Application Data

(60) Division of application No. 10/639,874, filed on Aug. 12, 2003, now Pat. No. 6,847,229, which is a division of application No. 10/097,522, filed on Mar. 12, 2002, now Pat. No. 6,630,841, which is a division of application No. 09/860,863, filed on May 18, 2001, now Pat. No. 6,396,302, and a continuation-in-part of application No. 09/591,762, filed on Jun. 12, 2000, now Pat. No. 6,288,569, which is a division of application No. 09/258,024, filed on Feb. 25, 1999, now Pat. No. 6,150,838.

(60) Provisional application No. 60/238,403, filed on Oct. 6, 2000.

(51) Int. Cl.
*H03K 19/173* (2006.01)

(52) U.S. Cl. .......................... 326/38; 326/39; 326/41; 326/47

(58) Field of Classification Search ............ 326/37–41, 326/46–47
See application file for complete search history.

(56) References Cited

U.S. PATENT DOCUMENTS 5,362,999 A    11/1994    Chiang
5,432,719 A     7/1995    Freeman et al.

(Continued)

FOREIGN PATENT DOCUMENTS

EP            913 944 A2       5/1999

OTHER PUBLICATIONS

Xilinx, Inc.; "Virtex-II Platform FPGA Handbook"; published Dec. 2000; available from Xilinx, Inc., 2100 Logic Drive, San Jose, California 95124; pp. 46-54.

(Continued)

*Primary Examiner*—Anh Q. Tran
(74) *Attorney, Agent, or Firm*—Lois D. Cartier

(57) ABSTRACT

A configurable logic element (CLE) for a field programmable gate array (FPGA) includes "expanders", i.e., connectors that allow fast signal communication between logic blocks. Expanders allow the configurable interconnection of a plurality of logic blocks, or portions thereof, to form a single logical entity that can implement large user circuits such as PALs, lookup tables, multiplexers, tristate buffers, and memories. One embodiment includes a configurable logic block. In a first mode, the logic block provides two N-input LUTs having N shared inputs and two separate outputs. The outputs are then combined using an expander to generate an (N+1)-input function. In a second mode, the logic block provides two N-input LUTs having M unshared inputs. An optional third mode provides a plurality of product term output signals based on the values of the N input signals.

13 Claims, 34 Drawing Sheets

U.S. PATENT DOCUMENTS

| | | |
|---|---|---|
| 5,473,266 A | 12/1995 | Ahanin et al. |
| 5,473,267 A | 12/1995 | Stansfield |
| 5,801,547 A | 9/1998 | Kean |
| 5,815,726 A | 9/1998 | Cliff |
| 5,828,229 A | 10/1998 | Cliff et al. |
| 5,936,424 A | 8/1999 | Young et al. |
| 6,020,759 A | 2/2000 | Heile |
| 6,144,573 A | 11/2000 | Heile |
| 6,150,838 A | 11/2000 | Wittig et al. |
| 6,288,970 B1 | 9/2001 | Reddy et al. |
| 6,480,025 B1 | 11/2002 | Altaf |
| 6,847,229 B1 * | 1/2005 | New et al. .................... 326/39 |

OTHER PUBLICATIONS

Xilinx, Inc.; "The Programmable Logic Data Book" Sep. 1996; available from Xilinx, Inc. 2100 Logic Drive, San Jose, California 95124; pp. 4-11 to 4-20 and 4-294 to 4-296.

Xilinx, Inc.; "The Programmable Logic Data Book" 2000; available from Xilinx, Inc. 2100 Logic Drive, San Jose, California 95124; pp. 3-9 to 3-11 and 3-79 to 3-82, no month.

Wilton, Steve J. E.; "SMAP: Heterogenous Technology Mapping for Area Reduction in FPGAs with Embedded Memory Arrays", published Feb. 1998; ACM/SIGDA International Symposium on Field-Programmable Gate Arrays.

* cited by examiner (v-expander)

(h-expander)

(AB expander)

(SOP expander)

(4 Pterms with 16 inputs, or 2 PALs of 2 Pterms with 16 inputs)

(4 Pterms with 32 inputs)

FIG. 9 (1 PAL of 4 Pterms with (m*16) inputs)

(1 PAL of 4(r*c) Pterms with (m*16) inputs)

(Two 5-input LUTs)

(6-input LUT)

(7-input LUT)

(8-input LUT)

(9-input LUT)

(portion of >9-input LUT)

(4:1 MUX)

(8:1 MUX)

(16:1 MUX)

(32:1 MUX)

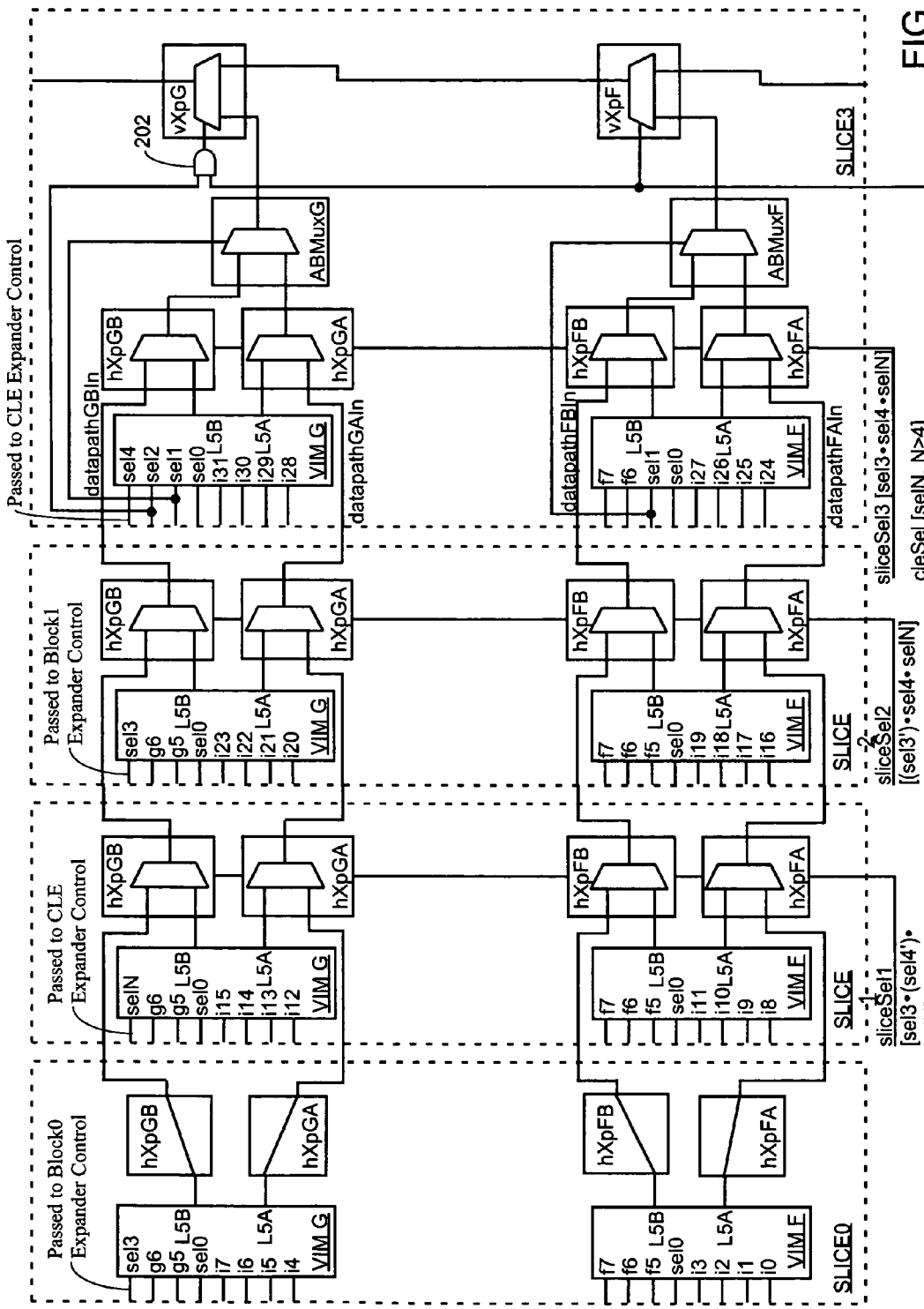
FIG. 21 (portion of >32:1 MUX)

(TBuf: MUX Chain)

(TBuf: AND Chain 1)

(TBuf: AND Chain 2)

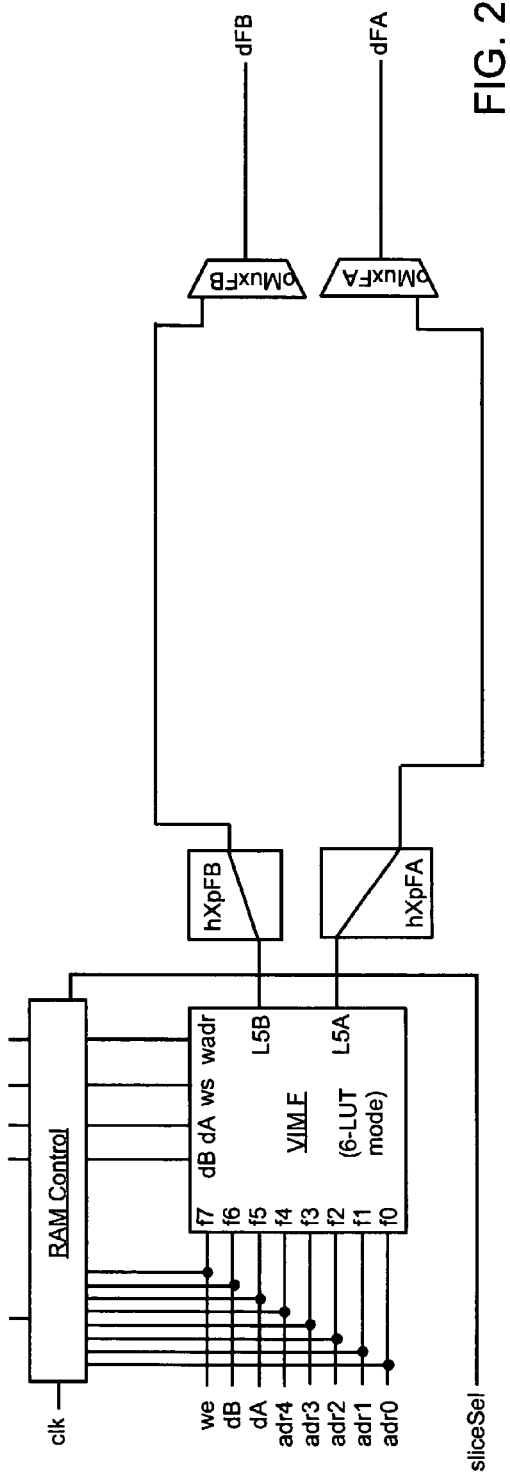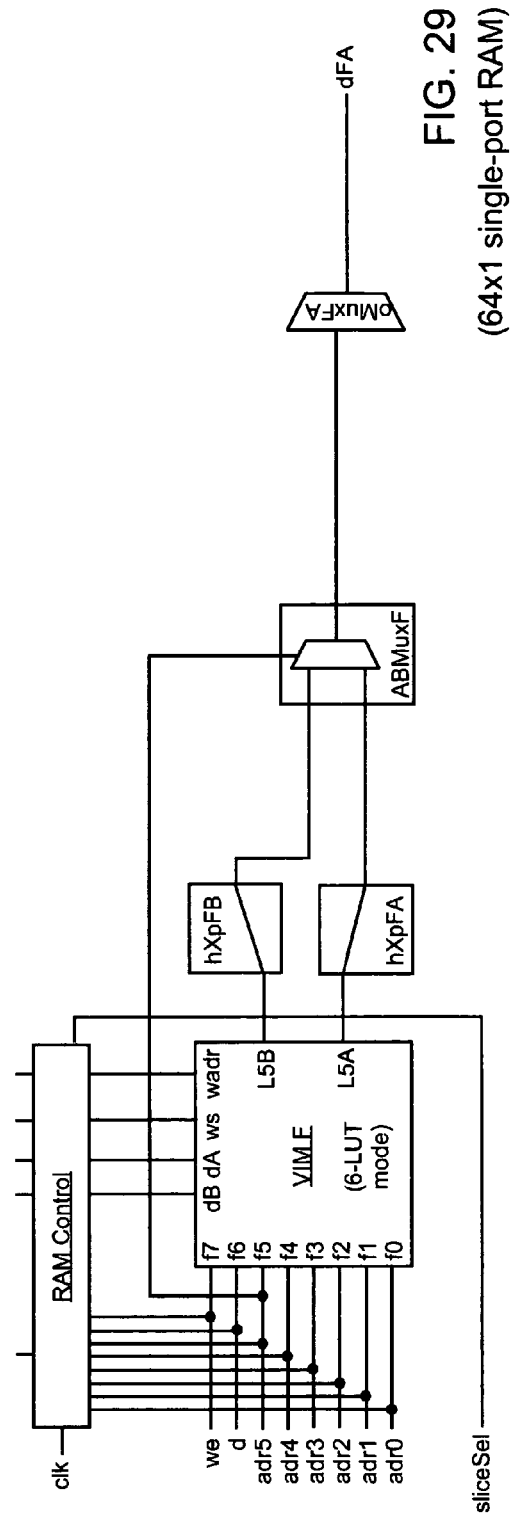

(128x1 single-port RAM)

(256x1 single-port RAM)

(512x1 single-port RAM)

(portion of >512x1 single-port RAM)

(32x2 dual-port RAM)

(64x1 dual-port RAM)

CONFIGURABLE LOGIC ELEMENT WITH EXPANDER STRUCTURES

FIELD OF THE INVENTION

The invention relates to Field Programmable Gate Arrays (FPGAs). More particularly, the invention relates to structures and methods for implementing user circuits by combining multiple logic blocks in an FPGA.

BACKGROUND OF THE INVENTION

Programmable logic devices (PLDS) are a well-known type of digital integrated circuit that may be programmed by a user to perform specified logic functions. One type of PLD, the field programmable gate array (FPGA), typically includes an array of configurable logic elements (CLEs) surrounded by a ring of programmable input/output blocks (IOBs). The CLEs and IOBs are interconnected by a programmable interconnect structure. (The programmable interconnect structure between CLEs and IOBs is also referred to as general interconnect). The CLEs, IOBs, and interconnect structure are typically programmed by loading a stream of configuration data (bitstream) into internal configuration memory cells that define how the CLEs, IOBs, and interconnect structure are configured. The configuration data may be read from memory (e.g., an external PROM) or written into the FPGA by an external device. The collective states of the individual memory cells then determine the function of the FPGA.

One significant task when implementing a user circuit in an FPGA is the assignment of user logic into the various CLEs and IOBs. This process includes "mapping", where the user circuit is divided into pieces that will fit into a single CLE, IOB, or a portion thereof, and "placement", where each mapped piece of logic is assigned to a particular CLE or IOB (or portion thereof) in a particular location on the FPGA. The final step in implementing the circuit is called "routing", where the mapped and placed logic is connected together using the programmable interconnect structure. The mapping, placement, and routing processes are typically performed by computer software, which reads in a description of the user circuit (for example, in the form of a netlist) and provides the bitstream that is used to program the device, as described above.

In practice, each CLE is typically formed from several smaller logic blocks, such as 4-input lookup tables (LUTs). Because each block has a fixed size, and the size of the block is usually fairly small to facilitate the efficient implementation of small logic functions, the implementation of larger user circuits requires the use of several logic blocks. Sometimes these logic blocks can be accommodated within a single CLE, in which case the general interconnect need not be used to connect the blocks. In other cases, the required number of logic blocks is too large for a single CLE. The necessary logic blocks must then be connected using the general interconnect, which is typically slower than connections within a single CLE. Thus, user circuits up to a certain size (i.e., the size that will fit in a single CLE) are typically faster than user circuits of a larger size. Further, user circuits that fit into a single logic block (e.g., a single 4-input LUT) result in the fastest implementations.

Therefore, it is desirable to provide structures and methods for combining two or more logic blocks in such a way as to permit user circuits too large for a single logic block to function at more nearly the same operating speed as user circuits within a single logic block.

SUMMARY OF THE INVENTION

The invention provides a configurable logic element (CLE) for a field programmable gate array (FPGA) that includes "expanders" (i.e., configurable connector circuits having two or more functions) that allow for fast signal communication between logic blocks. Expanders allow the configurable interconnection of a plurality of logic blocks, for example, a plurality of Versatile Implementation Modules (VIMs), to form a single logical entity including two or more VIMs (i.e., a "VIM complex") that can implement large user circuits such as PALs, lookup tables, multiplexers, tristate buffers, and memories.

A user circuit requiring two or more logic blocks that is implemented using expanders is significantly faster than other implementations enabled by prior art structures.

In one embodiment, a CLE according to the invention includes four "slices". Each slice includes two logic blocks—for example, the hybrid LUT/PAL logic elements first described by Wittig et al. in U.S. Pat. No. 6,150,838, entitled "FPGA Configurable Logic Block With Multi-Purpose Logic/Memory Circuit", which is incorporated herein by reference. The combination of Wittig's hybrid LUT/PAL structure with the novel expanders described herein allows for the construction of both large PALs (spanning multiple VIMs) and large user circuits requiring the combination of many look-up tables (LUTs) with minimal performance degradation. In this embodiment, VIMs can be combined within a single slice, between two or more slices, or even across CLE boundaries, and either vertically, horizontally, or both. Further, while adjacent slices or logic blocks are most commonly combined, non-adjacent elements can also be combined by configuring the expanders to bypass intervening elements.

In another embodiment of the invention, more limited logic blocks are used, such as those comprising only LUT functions or only product term generator functions.

One embodiment includes a configurable logic block having at least two configurable modes. In a first mode, the logic block provides two N-input LUTs having N shared inputs and two separate outputs. The outputs are then combined using an expander to generate an (N+1)-input function. In a second mode, the logic block provides two N-input LUTs having M unshared inputs, where M is less than N. In one embodiment, the logic block includes a third mode, in which it provides a plurality of product term output signals based on the values of the N input signals.

BRIEF DESCRIPTION OF THE DRAWINGS

The present invention is illustrated by way of example, and not by way of limitation, in the following figures, in which like reference numerals refer to similar elements.

FIG. 7 shows how the two VIMs of one slice can generate four output signals, each comprising one Pterm (i.e., product term) of 16 inputs.

FIG. 8 shows how horizontally adjacent VIMs (i.e., VIMs in two different slices) can be combined using expanders to generate four output signals, each comprising one Pterm of 32 inputs.

FIG. 9 shows how two or more slices can be combined using expanders to generate one OR'ed output signal comprising four Pterms of m*16 inputs (i.e., m times 16 inputs), where m is the number of slices.

FIG. 10 shows how multiple VIMs can be combined using expanders to implement PALs with more than 8 Pterms of more than 16 inputs.

FIG. 11 shows how a single VIM can implement two 5-input LUTs.

FIG. 12 shows how a single VIM can implement one 6-input LUT using an AB expander.

FIG. 13 shows how the two VIMs of one slice can be combined using expanders to implement one 7-input LUT.

FIG. 14 shows how the VIMs of two adjacent slices (e.g., one block) can be combined using expanders to implement one 8-input LUT.

FIG. 15 shows how the VIMs of four slices (e.g., one CLE) can be combined using expanders to implement one 9-input LUT.

FIG. 16 shows how the VIMs of multiple CLEs can be combined using expanders to implement LUTs with more than 9 inputs.

FIGS. 17–21 show how to implement exemplary multiplexers of various sizes using the CLE of FIG. 1 and the slice of FIG. 2.

FIG. 17 shows how a 4-to-1 multiplexer ("MUX") is implemented using one VIM and an AB expander.

FIG. 18 shows how the two VIMs of one slice can be combined using expanders to implement an 8-to-1 MUX.

FIG. 19 shows how two slices (e.g., one block) can be combined using expanders to implement a 16-to-1 MUX.

FIG. 20 shows how four slices (e.g., one CLE) can be combined using expanders to implement a 32-to-1 MUX.

FIG. 21 shows how the VIMs of multiple CLEs can be combined using expanders to implement MUXes that are larger than 32-to-1.

FIG. 22 shows a general tristate buffer ("TBuf") structure used in prior art FPGAs.

FIG. 23 shows a logical equivalent of the TBuf structure shown in FIG. 22, constructed using MUXes.

FIG. 24 shows a logical equivalent of the TBuf structure shown in FIG. 22, constructed using AND and OR gates.

FIG. 25 shows how multiple VIMs can be combined using horizontal expanders to implement the TBuf structure of FIG. 23.

FIG. 26 shows how multiple VIMs can be combined using horizontal expanders to implement the TBuf structure of FIG. 24.

FIG. 27 shows another way in which multiple VIMs can be combined using horizontal expanders to implement the TBuf structure of FIG. 24.

FIGS. 28–35 show how to implement exemplary random access memories (RAMs) of various sizes using the CLE of FIG. 1 and the slice of FIG. 2.

FIG. 28 shows how a single VIM can be used to implement a 32×2 single-port RAM.

FIG. 29 shows how a single VIM can be used to implement a 64×1 single-port RAM.

FIG. 30 shows how the two VIMs of one slice can be combined using expanders to implement one 128×1 single-port RAM.

FIG. 31 shows how two slices (e.g., one block) can be combined using expanders to implement one 256×1 single-port RAM.

FIG. 32 shows how four slices (e.g., one CLE) can be combined using expanders to implement one 512×1 single-port RAM.

FIG. 33 shows how the VIMs of multiple CLEs can be combined using expanders to implement single-port RAMs that are larger than 512×1.

FIG. 34 shows how the two VIMs of one slice can be combined using expanders to implement one 32×2 dual-port RAM.

FIG. 35 shows how the two VIMs of one slice can be combined using expanders to implement one 64×1 dual-port RAM.

DETAILED DESCRIPTION OF THE DRAWINGS

In the following description, numerous specific details of a preferred embodiment are set forth to provide a more thorough understanding of the present invention. However, it will be apparent to one skilled in the art that the present invention may be practiced without these specific details.

Configurable Logic Element (CLE)

Figure 1:
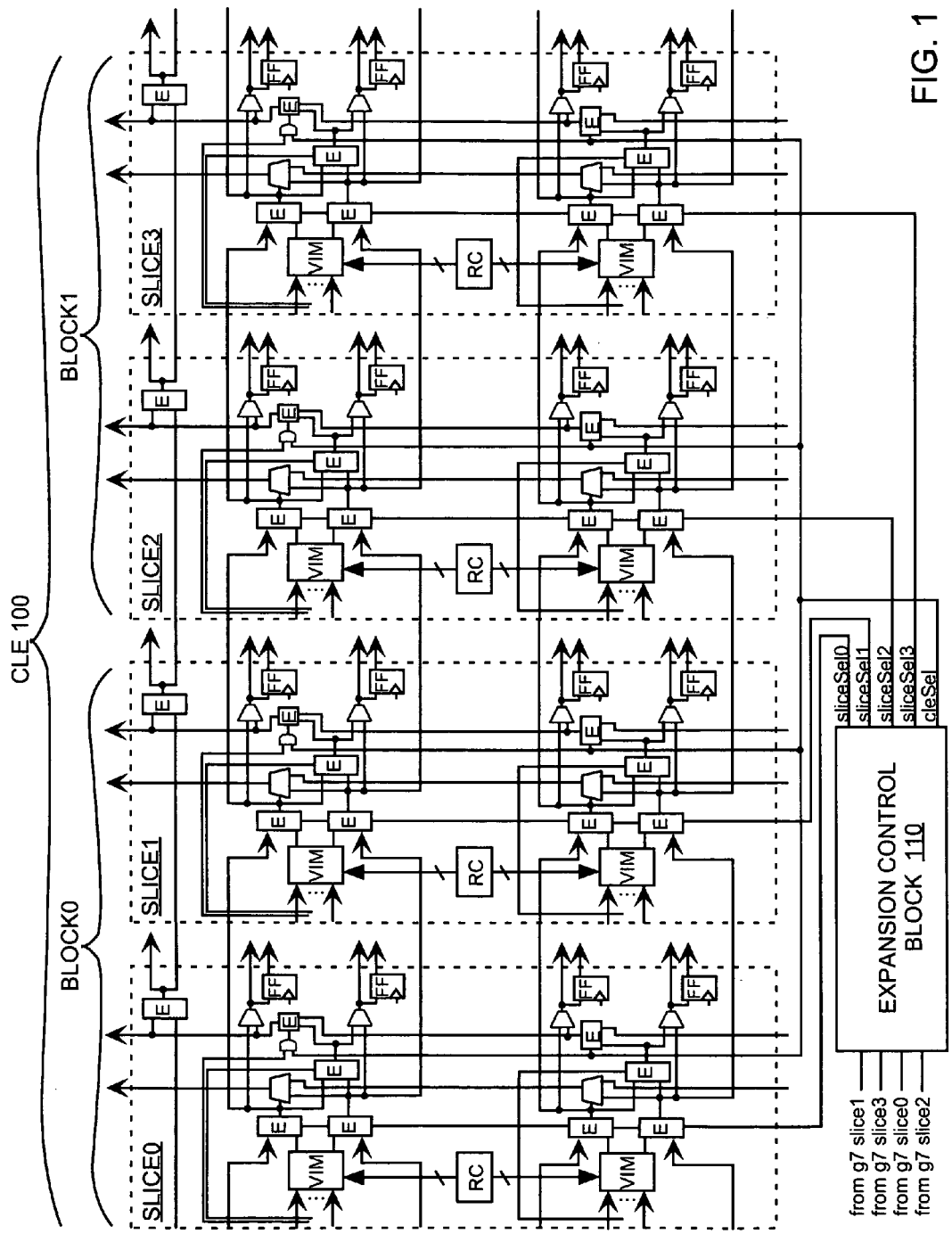
FIG. 1 is a high-level diagram for a CLE according to one embodiment of the present invention. The CLE includes four "slices".

FIG. 1 is a high-level diagram for a Configurable Logic Element (CLE) 100 according to one embodiment of the present invention. CLE 100 comprises four "slices", which in this embodiment are essentially identical. The slices are denoted slice 0, slice 1, slice 2, and slice 3. Two slices together form what is called a "block". Slices 0 and 1 together form block 0. Slices 2 and 3 together form block 1.

Each slice includes two Versatile Implementation Modules (VIMs), logic blocks that can function as either LUTs or product term generators. Therefore, each CLE includes eight VIMs. In one embodiment, the VIMs function as described below in conjunction with FIG. 3. In other embodiments (not pictured) logic blocks other than VIMs are used. For example, where PAL (Programmable Array Logic) functionality is not desired, standard lookup tables (LUTs) can be substituted for the VIMs in FIG. 1. Similarly, where LUT functionality is not desired, standard product term generator logic blocks can be substituted for the VIMs in FIG. 1.

The CLE also includes several "expanders" that allow the VIMs to be used together to form functions with more inputs than are available using a single VIM. In FIG. 1, elements acting as expanders in CLE 100 are designated with the letter "E". Using these expanders, each VIM can be grouped with any adjacent VIM, either vertically or horizontally. In some embodiments, non-adjacent VIMs can also be grouped, by setting the expanders associated with bypassed VIMs to "Feedthrough" modes. In the pictured embodiment, expanders can be used to interconnect VIMs within a single slice, between slices in the same CLE, or between two or more CLEs. Thus, the size of a VIM complex (i.e., a group of VIMs associated using expanders to implement a user circuit) is not limited to the number of VIMs in a single CLE.

Each slice also includes four memory elements (designated FF), and a RAM control block (designated RC) that controls the memory arrays within the two VIMs of the slice. In this embodiment, the memory elements and RAM control block are similar to known CLE elements and are not part of the expander network.

CLE 100 also includes an expansion control block 110 that controls the expanders in each slice using an associated slice select signal and a CLE select signal. The sliceSel0 signal selects slice 0, sliceSel1 selects slice 1, and so forth. (In the present specification, the same reference characters are used to refer to terminals, signal lines, and their corresponding signals.) The slice select signals control the horizontal expander chain. Expansion control block 110 also provides a CLE-wide expander control signal, cleSel. Signal cleSel controls the vertical expander chain, and also enables or disables the slice select signals, as shown in FIG. 4A. The functions of expansion control block 110 and the slice and CLE select signals are explained in detail in conjunction with FIG. 5. In addition, the slice and CLE control signals can be used to provide additional data inputs when implementing large user circuits, as shown in later exemplary figures.

Figure 2:
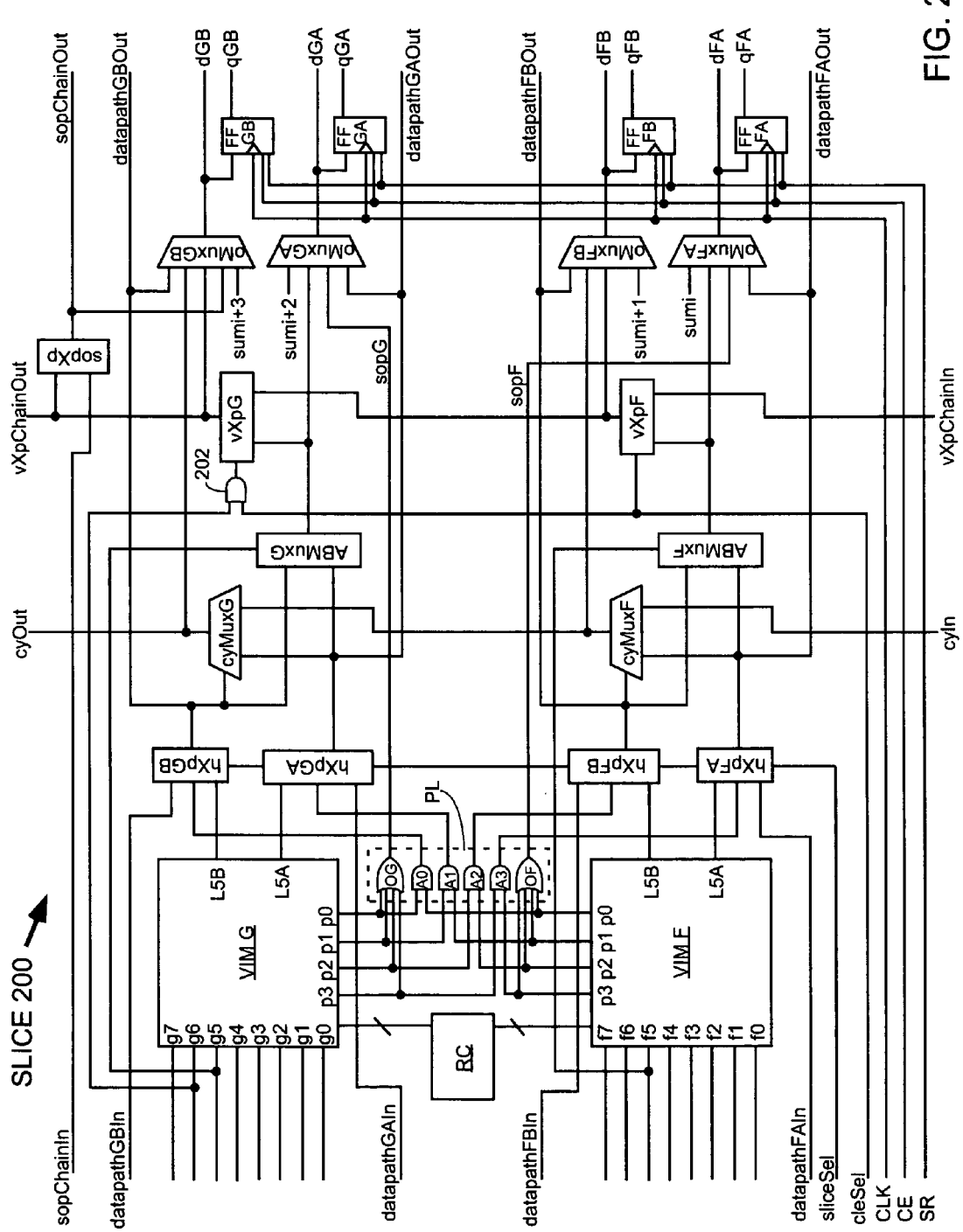
FIG. 2 is a more detailed view of a single slice from the CLE of FIG. 1.

FIG. 2 shows a more detailed view of a single slice according to one embodiment. The pictured slice 200 includes two VIMs, VIM F and VIM G. The RAM functionality of each VIM is controlled by the RAM control block RC. The RAM control block and RAM control signals can be, for example, similar to those included in the CLE of the Virtex(TM)-II family of FPGAs available from Xilinx, Inc. The Virtex-II CLE is described on pages 46–54 of the "Virtex(TM)-II PlatformFPGA Handbook", published January 2001 and available from Xilinx, Inc., 2100 Logic Drive, San Jose, Calif., which pages are hereby incorporated by reference.

Each VIM provides two 5-input LUTs with output signals L5A, L5B, or four 8-input product terms (Pterms) with output signals p0–p3. (The VIM is described in more detail in conjunction with FIG. 3, below.) The four Pterm output signals of each VIM drive PAL logic block PL, which combines the Pterm output signals to generate sum-of-product functions (using OR-gates OF and OG) and larger Pterms (using AND-gates A0–A3). OR-gate OF generates the OR-function of the four 8-input Pterms provided by VIM F. OR-gate OG generates the OR-function of the four 8-input Pterms provided by VIM G. AND-gates A0–A3 each provide a single Pterm of up to 16 inputs by combining 8-input Pterms from each of the two VIMs.

In one embodiment (not shown), AND-gates A0–A3 are also configurable as OR-gates. In this embodiment, a single slice can generate four sum-of-product functions, each having two 8-input Pterms.

Returning to FIG. 2, elements of the slice similar to those of known FPGA architectures include: carry multiplexers (cyMuxF, cyMuxG) implementing a vertical carry chain between carry input signal cyIn and carry output signal cyOut; output multiplexers (oMuxFA, oMuxFB, oMuxGA, oMuxGB) generating unregistered data output signals (dFA, dFB, dGA, dGB); and flip-flops (FA, FB, GA, GB) accepting the unregistered data signals and generating corresponding registered data output signals (qFA, qFB, qGA, qGB). In the described embodiment, other logic in the CLE (not shown) generates other optional output signals that are also supplied to the output multiplexers, e.g., arithmetic sum signals sumi, sumi+1, sumi+2, sumi+3.

Versatile Implementation Module (VIM)

Figure 3:
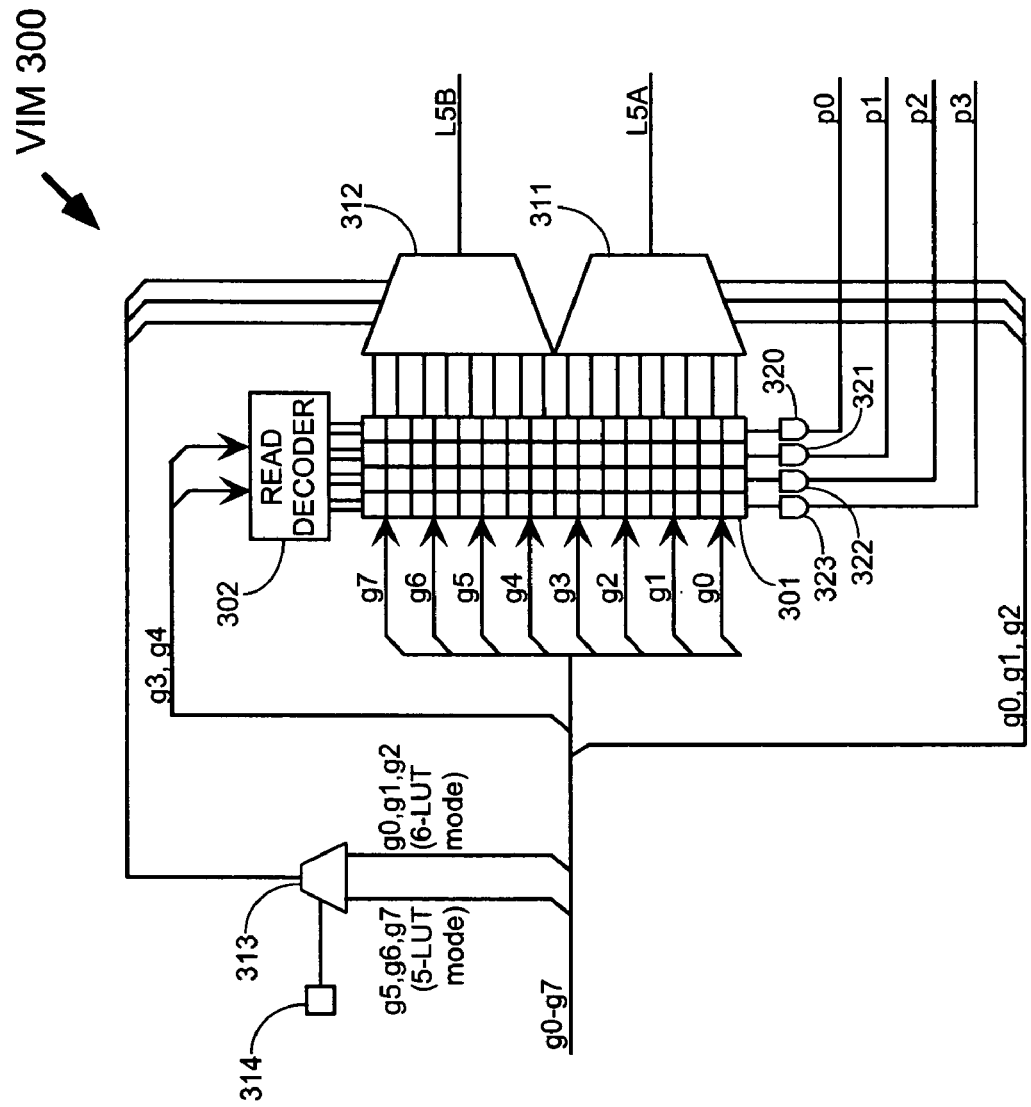
FIG. 3 is a simplified diagram of a combination LUT/PAL structure (a "VIM") that can be used with the slice of FIG. 2.

FIG. 3 is a functional diagram of a Versatile Implementation Module (VIM) 300. A VIM is a combination LUT/PAL structure that can be included in the slice of FIG. 2. The logical functions diagrammed in FIG. 3 can be implemented in many different ways. Further, logic blocks other than VIMs can be used with the expanders of the present invention. The VIM shown in FIG. 3 is provided for exemplary purposes only. Some portions of exemplary VIM 300 not described in detail herein are similar to those shown and described by Wittig et al. in U.S. Pat. No. 6,150,838.

The VIM of FIG. 3 operates either as two 5-input lookup tables (in 5-LUT mode and 6-LUT mode) or as an 8-input product term generator (in PAL mode). VIM 300 includes a memory cell array 301 with sixteen rows and four columns. In either of the LUT modes, read decoder 302 decodes two of the data inputs (g3, g4) to select the output of one of the four memory cells of each row. Three additional data inputs (g0, g1, g2) control 8:1 multiplexer 311 to select one of the bottom eight rows of memory cells to provide 5-LUT output L5A. Thus, 5-LUT output L5A implements a lookup table of the five data inputs g0–g4. Similarly, in 5-LUT mode three data inputs (g5, g6, g7) control 8:1 multiplexer 312 to select one of the top eight rows of memory cells to provide 5-LUT output L5B. Thus, when the VIM is in 5-LUT mode, 5-LUT output L5B implements a lookup table of the five data inputs g3–g7.

Whether the VIM is in 5-LUT mode or 6-LUT mode is controlled by multiplexer 313, which in turn is controlled by a value in configuration memory cell 314. Multiplexer 313 selects either data inputs g5, g6, g7 (in 5-LUT mode) or data inputs g0, g1, g2 (in 6-LUT mode) to control multiplexer 312.

When the VIM is in 6-LUT mode, the signals on the two L5 output terminals are controlled by the same multiplexer select signals. Therefore, data inputs g0, g1, g2 control both multiplexers 311 and 312 in 6-LUT mode, and each multiplexer provides a different function of data inputs g0–g4. These two 5-input function outputs are then combined using the AB expander (ABMux) shown in FIG. 2, configured as a multiplexer controlled by the g5 data input. Therefore, the AB expander provides the 6-input LUT function of data inputs g0–g5.

In PAL mode, pairs of the memory cells operate together as content addressable memory (CAM) cells. Each of eight data inputs (g0–g7) is provided to one pair of memory cells in each column. AND gate 320, coupled to the fourth column of memory cells, can provide any desired product term (Pterm) of any or all of the eight signals g0–g7 to output terminal p0. Similarly, AND gates 321–323 can provide any desired Pterm of signals g0–g7 to output terminals p1–p3, based on the contents of the third, second, and first columns of memory cells, respectively. Consequently, when in PAL mode, VIM 300 can implement four 8-input Pterms. The output signals from AND gates 320–323 (p0–p3) are then provided to 4-input OR gates OF and OG in FIG. 2 to implement sum-of-products functions. Alternatively, signals p0–p3 are provided to 2-input AND gates A0–A3, which are then combined using expanders to implement larger product terms and sum-of-product functions, as described in conjunction with FIGS. 5–8.

It is therefore seen that VIM 300 of FIG. 3 can be used to implement either two 5-input LUTs or one 6-input LUT (with the AB expander) when in LUT mode, or an 8-input Pterm generator providing four Pterms in a PAL mode. The VIM structure is efficient in that it uses common memory circuitry to implement either the LUT or the Pterm function. The structure is also relatively fast in either mode when implementing user circuits of no more than six inputs for a LUT or eight inputs for a Pterm. To implement user circuits with more than six or eight inputs, the VIMs can be cascaded or otherwise combined using programmable interconnect in traditional fashion. However, the present specification supplies a more desirable structure and method for implementing these larger circuits.

Expanders

The various VIM output signals, PAL logic output signals, and signals from other slices are configurably combined using expanders (see FIG. 2). The horizontal expanders (hXpFA, hXpFB, hXpGA, hXpGB) form four horizontal expander chains. For example, horizontal expander hXpFA forms a data path from datapathFAIn to datapathFAOut. The vertical expanders (vXpF, vXpG) form a vertical expander chain from vXpChainIn to vXpChainOut. The vertical expanders can be used to combine signals from the horizontal expander chains, by passing the output signals from the horizontal expanders through the AB expanders to the vertical expander input terminals. The "sum-of-products" or SOP expanders (sopXp) form a horizontal chain from sopChainIn to sopChainOut, driven by signals from the vertical expander chain. The AB expanders (ABMuxF, ABMuxG) can be used to combine two signals from the associated VIM, PAL logic, or horizontal expander chain, or to access the vertical expander chain.

Most expanders are the same for each of the two VIMs in the slice. For example, the horizontal expanders for VIM F (hXpFA, hXpFB) are the same as the horizontal expanders for VIM G (hXpGA, hXpGB). In fact, all four horizontal expanders function in the same way. When functioning as a 2:1 multiplexer, all are controlled by the slice select signal (sliceSel) associated with the slice. Similarly, the AB expander for VIM F (ABMuxF) is the same as the AB expander for VIM G (ABMuxG). When functioning as a 2:1 multiplexer, each AB expander (ABMuxF, ABMuxG) is controlled by a data input signal (f5, g5) from the corresponding VIM (F, G).

The two vertical expanders for the two VIMs are also similar. However, the vertical expanders are differently controlled. When functioning as 2:1 multiplexers, the vertical expander for VIM F (vXpF) is controlled by CLE select signal cleSel, while the vertical expander for VIM G (vXpG) is controlled by the AND function (provided by AND gate 202) of cleSel and VIM G data input signal g6. This difference is provided to allow the two VIMs in the slice to function as a single efficient unit, while also enabling the passage of data along the vertical expander chain from VIM G to VIM F in another slice, in another CLE positioned above SLICE 200.

There is only one SOP expander per slice (sopXp), which is used to combine signals formed using the vertical expander chain. In one embodiment (not pictured), the SOP expander is not included. In other embodiments (not pictured), only the horizontal expanders or only the vertical expanders are included.

Each expander has at least two configurable functions ("expander modes"). In one embodiment, the expander mode is selected by values stored in configuration memory cells similar to those used to control other functions in the CLEs, IOBs, and programmable interconnect structure of the FPGA. The expander modes available to the expanders of the pictured embodiment are shown in Table 1. FIGS. 4A–4D provide exemplary embodiments of the four expander types shown in Table 1. The different expander modes for each type of expander are now explained in conjunction with Table 1 and FIGS. 4A–4D. Note that the terminology "cleSel·g6" means the cleSel signal ANDed with the g6 signal.

TABLE 1

| Type | Names | Expander Modes | Data Inputs | Select Input |
| --- | --- | --- | --- | --- |
| Horizontal | hXpFA, hXpFB, hXpGA, hXpGB | 2:1 MUX | L5, datapathInm | sliceSel |
| | | 2-input AND | PAL AND, datapathIn | none |
| | | Get-On Feedthrough | L5 or PAL AND datapathIn | memory cell none |
| Certical | vXpF, vXpG | 2:1 MUX | ABMux output, vp chain in | vXpF: cleSel, vxpG: cleSel · g6 |
| | | 2-input OR | ABMux output, vXp chain in | none |
| | | Get-On Feedthrough | ABMux output vXp chain in | none none |
| AB | ABMuxF, ABMuxG | 2:1 MUX | hXpA output, hXpB output | ABMux: f5, ABMuxG: g5 |
| | | 2-input OR | hXpA output, hXpB output | none |
| SOP | sopXp | 2-input OR | vXpChainOut, sopChainIn | none |

TABLE 1-continued

| Type | Names | Expander Modes | Data Inputs | Select Input |
|------|-------|----------------|-------------|--------------|
|      |       | Get-On         | vXpChainOut | none         |
|      |       | Feedthrough    | sopChainIn  | none         |

FIG. 4A shows one embodiment of a horizontal expander (h-expander) hXp. In the pictured embodiment, two configuration memory cells 451, 452 control multiplexer 453 to provide the h-expander output signal datapathOut (e.g., datapathFAOut) from any of four MUX input signals representing the four expander modes. The various expanders can be implemented in many different ways, as will be apparent to one of ordinary skill in the art of circuit design. Preferably, for the h-expander the path from the datapathIn terminal to the datapathOut terminal is made as fast as possible within the constraints of the available area, because any additional delay on this path can occur many times along the horizontal expander chain. Next in the level of importance is the path from the PAL AND terminal to the datapathOut terminal. The speeds of other paths through the h-expander are preferably compromised to improve the speed of these two more critical paths.

When MUX select signals S1, S0 (from memory cells 451, 452, respectively) are both low (i.e., 0,0) the h-expander is in 2:1 MUX mode. MUX 453 provides the output of MUX 454. MUX 454 provides the multiplexed value of signals datapathIn (e.g., datapathFAIn) and signal L5 (e.g., L5A from VIM F). MUX 454 is controlled by signal sliceSel. When sliceSel is low, signal datapathIn is provided. When sliceSel is high, signal L5 is provided. 2:1 MUX mode is used, for example, in implementing large LUTs, multiplexers, RAMs, and some types of tristate buffers (TBufs).

When signals S1, S0 are 0,1, the h-expander is in 2-input AND mode. MUX 453 provides the AND function (provided by AND gate 455) of signals datapathIn and the PAL AND signal from the PAL logic PL (A0–A3). 2-Input AND mode is used, for example, in implementing large PAL structures and some types of TBufs.

When signals S1, S0 are 1,0, the h-expander is in Get-On mode, and MUX 453 provides either signal L5 or the PAL AND signal. The selection is made by MUX 456, which is controlled by signal S2 from memory cell 457. Get-On mode is used to "get onto" (i.e., to initiate) the horizontal expander chain.

When signals S1, S0 are 1,1, the h-expander is in Feedthrough mode, and MUX 453 provides signal datapathIn to the datapathOut terminal. In effect, the slice is bypassed by the h-expander chain. In some embodiments, Feedthrough mode can be used to combine non-adjacent slices into a VIM complex, by bypassing intervening slices.

In one embodiment, MUX 456 is omitted, and in Get-On mode MUX 453 always provides signal L5. In this alternative embodiment, Get-On mode cannot be used to place the PAL AND signal onto the datapath chain. To initiate a Pterm expander chain in this embodiment, the PAL AND signal is ANDed with a "1" using the 2-input AND mode. The "1" is provided either by placing a high value on the horizontal expander chain in a previous slice (i.e., a slice to the left of the present slice), or by attaching a pullup to the datapathIn terminal. Such a pullup can be either a programmable pullup (e.g., controlled by a configuration memory cell) or a weak pullup that is easily overcome by a low value placed on the horizontal expander chain.

Figure 4B:
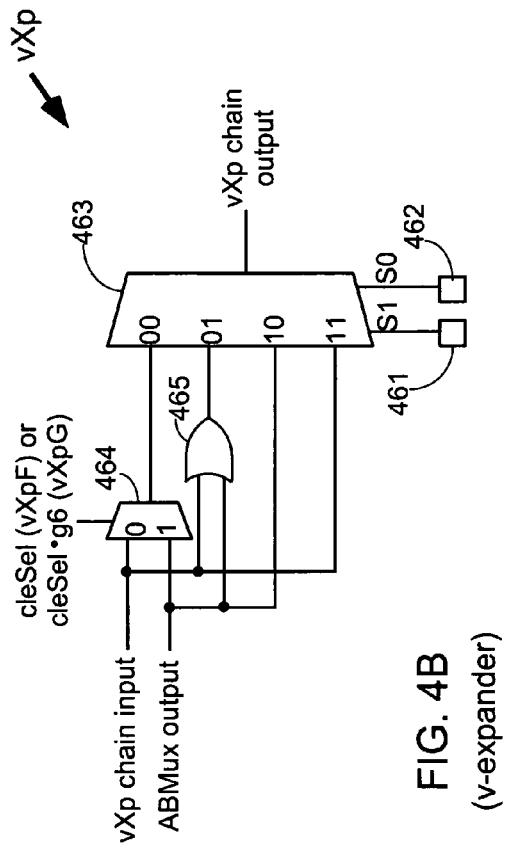
FIG. 4B shows one embodiment of a vertical expander that can be used with the slice of FIG. 2.
Figure 4A:
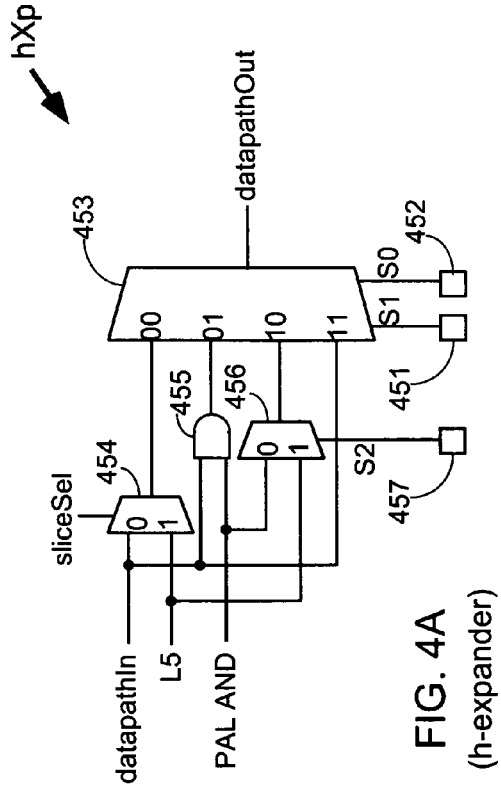
FIG. 4A shows one embodiment of a horizontal expander that can be used with the slice of FIG. 2.

FIG. 4B shows one embodiment of a vertical expander (v-expander) vXp. In the pictured embodiment, two configuration memory cells 461, 462 control multiplexer 463 to provide the v-expander output signal from any of four MUX input signals representing the four expander modes.

When MUX select signals S1, S0 (from memory cells 461, 462, respectively) are both low (i.e., 0,0) the v-expander is in 2:1 MUX mode. MUX 463 provides the output of MUX 464. MUX 464 multiplexes between the AB expander output and the input to the vertical expander chain from below (e.g., vXpChainIn for v-expander vXpF). MUX 464 is controlled by signal cleSel (vXpF) or cleSel ANDed with VIM G data input signal g6 (vXpG). When the select signal for MUX 464 is low, MUX 464 provides the input to the vertical expander chain from below. When the select signal is high, MUX 464 provides the output signal from the AB expander ABMux. Note that when signal cleSel is low, the signal from below is passed on up the vertical expander chain; therefore, both v-expanders in the slice are bypassed. For both F and G v-expanders, the 2:1 MUX mode is used, for example, in implementing large LUTs, multiplexers, and RAMs.

When signals S1, S0 are 0,1, the v-expander is in 2-input OR mode. MUX 463 provides the OR function (provided by OR gate 465) of the AB expander output and the input to the vertical expander chain from below. This mode is used, for example, in implementing large PAL structures.

When signals S1, S0 are 1,0, the v-expander is in Get-On mode, and MUX 463 provides the AB expander output signal. Get-On mode is used to initiate the vertical expander chain.

When signals S1, S0 are 1,1, the v-expander is in Feedthrough mode, and MUX 463 passes the vertical expander chain input signal to the vertical expander chain output. Therefore, the VIM and associated logic (the half-slice) is bypassed by the v-expander chain. In some embodiments, Feedthrough mode can be used to combine vertically non-adjacent VIMs into a VIM complex, bypassing intervening VIMs. When both v-expanders (vXpF and vXpG) are in Feedthrough mode, signal vXpChainIn is passed on to signal vXpChainOut.

Figure 4C:
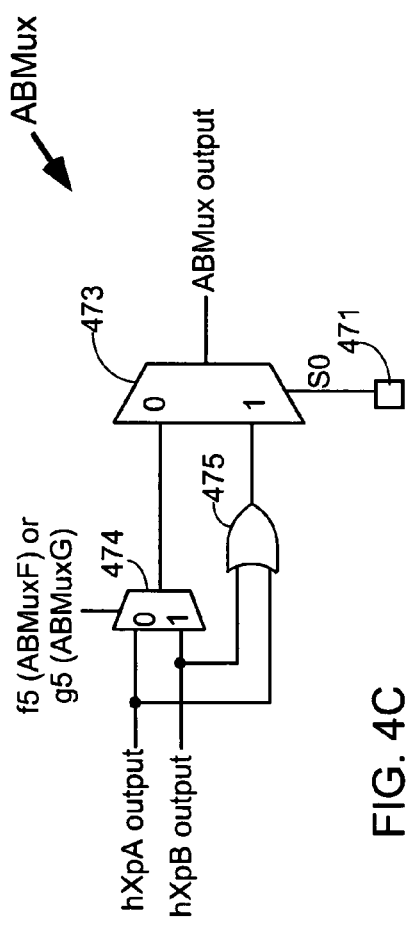
FIG. 4C shows one embodiment of an AB expander that can be used with the slice of FIG. 2.

FIG. 4C shows one embodiment of an AB expander ABMux. In the pictured embodiment, a configuration memory cell 471 controls multiplexer 473 to provide the AB expander output signal from either of two MUX input signals representing the two expander modes. When MUX select signal S0 from memory cell 471 is low (i.e., 0) the AB expander is in 2:1 MUX mode. MUX 473 provides the output of MUX 474, which multiplexes between the outputs of the two h-expanders (hXpA, hXpB) associated with the same VIM. For example, AB expander ABMuxG multiplexes between the outputs of h-expanders hXpGA and hXpGB. MUX 464 is controlled by the data input signal f5 or g5 of the associated VIM (VIM F or VIM G, respectively). For example, AB expander ABMuxG uses the g5 signal as the MUX select signal. This mode is used, for example, in combining the two 5-input LUT output signals L5A and L5B to create a 6-input LUT output signal. (The VIM is also in LUT6 mode, as was described in conjunction with FIG. 3.) This mode is also used in creating large LUTs, multiplexers, and RAMs.

When signal S0 is 1, the v-expander is in 2-input OR mode. MUX 473 provides the OR function (provided by OR gate 475) of the two h-expanders associated with the same VIM. This mode is used, for example, in implementing large PAL structures. In this embodiment, the AB expanders do not need a feedthrough mode, because the AB expander is easily bypassed, with the h-expander output signal being passed directly to the output multiplexers (see FIG. 2). Bypassing the AB expander generally results in a faster circuit implementation than passing the signal through the expander.

Figure 4D:
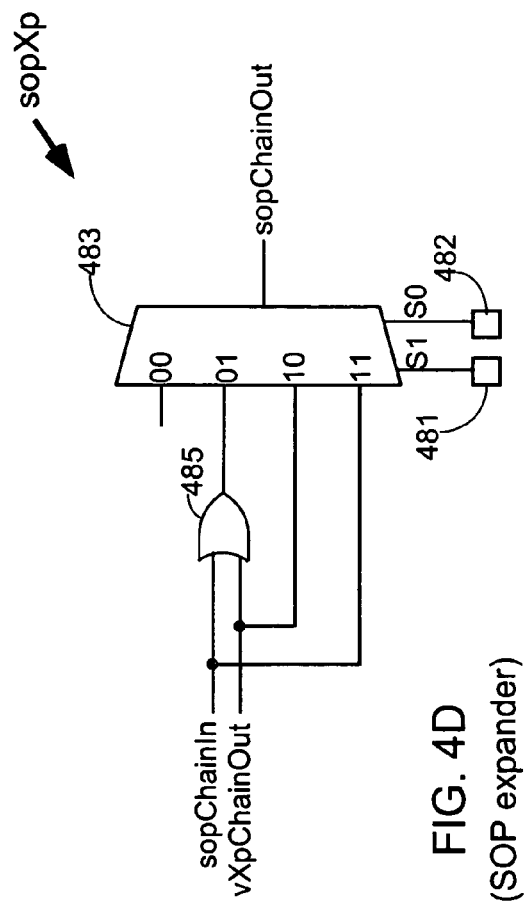
FIG. 4D shows one embodiment of a Sum-Of-Products expander that can be used with the slice of FIG. 2.

FIG. 4D shows one embodiment of a Sum-Of-Products expander (SOP expander) sopxp. In the pictured embodiment, two configuration memory cells 481, 482 control multiplexer 483 to provide the SOP expander output signal sopChainOut from any of three MUX input signals representing the three expander modes. In the pictured embodiment, MUX select signals S1, S0 (from memory cells 481, 482, respectively) are both low at the same time. In other embodiments (not pictured), the SOP expanders also have a 2:1 MUX mode, similar to that of the h-expanders and v-expanders, that is selected when signals S1, S0 are both low.

When signals S1, S0 are 0,1, the SOP expander is in 2-input OR mode. MUX 483 provides the OR function (provided by OR gate 485) of the output of the v-expander vXpG (vXpChainOut) and the input to the SOP chain (sopChainIn). This mode is used, for example, in implementing large PAL structures.

When signals S1, S0 are 1,0, the SOP expander is in Get-On mode, and MUX 483 places the output of the v-expander vXpG (vXpChainOut) on the SOP chain. Get-On mode is used, for example, to initiate SOP chains for large PALs.

When signals S1, S0 are 1,1, the v-expander is in Feedthrough mode, and MUX 483 passes the SOP expander chain input signal (sopChainIn) to the SOP expander chain output (sopChainOut). Therefore, the slice is bypassed by the SOP expander chain. In some embodiments, Feedthrough mode can be used to combine non-adjacent slices into a VIM complex, by bypassing intervening slices.

VIM Complexes

The expander modes provided by the configured functions of the h-expanders and the v-expanders, together with the selected expansion mode of the CLE, determine the size of the VIM complex that will be used to implement a user function. For example, in combining horizontally adjacent slices, a user can choose to combine one, two, three, four, or more slices to form a VIM complex.

To create a VIM complex including two or more horizontally positioned slices, the slice on the left edge of the complex is used to initiate the horizontal expander chain. A horizontal expander chain can be initiated by setting the h-expander to Get-On mode and selecting either the L5 signal or the PAL AND signal to be placed on the horizontal expander chain. Alternatively, a horizontal expander chain can be initiated by setting the h-expander to 2:1 MUX mode and setting the corresponding sliceSel signal high, to place the L5 output signal onto the datapathOut terminal of the slice. Which method to use to initiate the chain depends on the function to be implemented by the VIM complex. Exemplary functions are shown in FIGS. 7–35, and are described in conjunction with these figures.

Once the horizontal expander chain has been initiated, the h-expanders of the remaining slices in the VIM complex can be set to 2:1 MUX mode or 2-input AND mode, depending on the function to be implemented by the VIM complex. If the horizontal expander chain is to bypass a slice (i.e., if one or both of the VIMs in the slice are to be omitted from the VIM complex), the h-expander is set to Feedthrough mode.

The horizontal expander chain can be accessed simply by "extracting" the chain output through either the AB expander ABMux and the output multiplexer oMux, or via the carry multiplexer cyMux (see FIG. 2). Alternatively or additionally, to create larger or more complex functions, the horizontal expander chain values can be combined using the vertical expander chain. For example, the output from the h-expander hXp can be routed through the AB expander ABMux to the v-expander vXp. Thus, if the horizontal expander chain forms a "first level" of complexity for implementing user functions, the vertical expander chain can optionally be used to form a "second level" of complexity that builds on the "first level" logic implemented by the horizontal chains.

To create a VIM complex including more than one vertically positioned VIM, the v-expanders are used. First, note that each slice includes two VIMs and two horizontal expander chains. The two horizontal expander chains in a slice can be used independently or they can be combined, for example, by setting the vXpF v-expander to Get-On mode and the vXpG v-expander to 2:1 MUX mode or 2-input OR mode. The vertical expander chain can be accessed at this point, or can be extended into a slice located above slice 200 in an adjacent CLE, or both. When the horizontal expander chain is not in use, the vertical expanders can still be used, by deriving the output of the AB expander ABMux from the VIM L5 output or the PAL AND logic, then placing the output of the AB expander ABMux onto the vertical expander chain.

A v-expander chain can be initiated by setting the v-expander to Get-On mode, as described in the previous example. Alternatively, a v-expander chain can be initiated in VIM F by setting v-expander vXpF to 2:1 MUX mode and setting the cleSel signal high, to place the ABMuxF output signal onto the output terminal of the vXpF expander. Similarly, a v-expander chain can be initiated in VIM G by setting v-expander vXpG to 2:1 MUX mode and setting the cleSel and g6 signals high, to place the ABMuxG output signal onto the vXpChainOut terminal of the slice. As a third alternative, a vertical expander chain can be initiated by setting the v-expander to 2-input OR mode and providing a "0" (low) signal to the input signal of the chain (as shown, for example, in FIG. 7). Which method to use to initiate the chain depends on the function to be implemented by the VIM complex. Exemplary functions are shown in FIGS. 7–35, and are described in conjunction with these figures.

Once the vertical expander chain has been initiated, the remaining v-expanders in the VIM complex can be set to 2:1 MUX mode or 2-input OR mode, depending on the function to be implemented by the VIM complex. If the vertical expander chain is to bypass a VIM, the associated v-expander is set to Feedthrough mode.

The vertical expander chain can be accessed simply by "extracting" the chain output through the output multiplexer oMux (see FIG. 2). Alternatively or additionally, the vertical expander chain output can be included in the horizontal Sum-of-Products (SOP) chain using the SOP expander, to create even larger and/or more complex functions. Thus, the SOP expander chain forms an optional "third level" of complexity for implementing user functions that builds on the "second level" logic implemented by the vertical expander chains. Alternatively, the SOP expander chain can be used as a "second level" of complexity building on the "first level" logic of the vertical chains, if the horizontal expander chains are not in use.

The SOP expanders provide a second method of creating a VIM complex that spans multiple horizontally-positioned slices. The SOP expanders are primarily used for combining two or more vertical expander chains. However, if the vertical expander chain in a given slice is not in use, the SOP expander chain can still be used by setting the vXpG v-expander to Get-On mode, thus supplying the AB expander (ABMuxG) output to the SOP expander chain.

Figure 8:
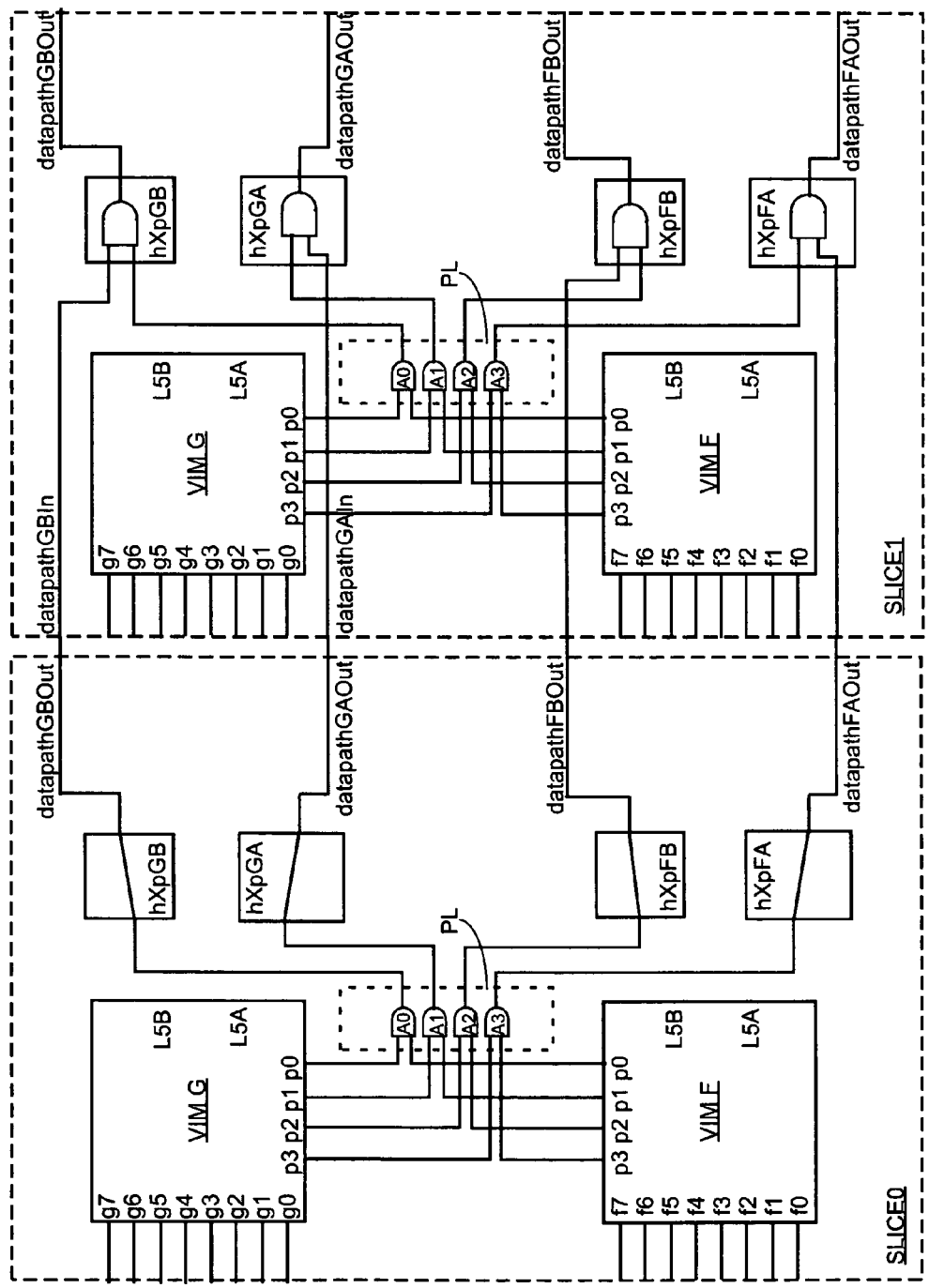

An SOP expander chain can be initiated by setting the SOP-expander sopXp to Get-On mode. Alternatively, an SOP expander chain can be initiated by setting the SOP expander sopXp to 2-input OR mode and supplying a "0" (low) signal to the sopChainIn terminal of the slice, as shown in FIG. 8.

Once the SOP expander chain has been initiated, the remaining SOP expanders in the VIM complex can be set to 2-input OR mode. If the SOP expander chain is to bypass an SOP expander, the SOP expander is set to Feedthrough mode.

The value on the SOP expander chain is available at the sopChainOut terminal of each slice.

Expansion Control Block

Figure 5:
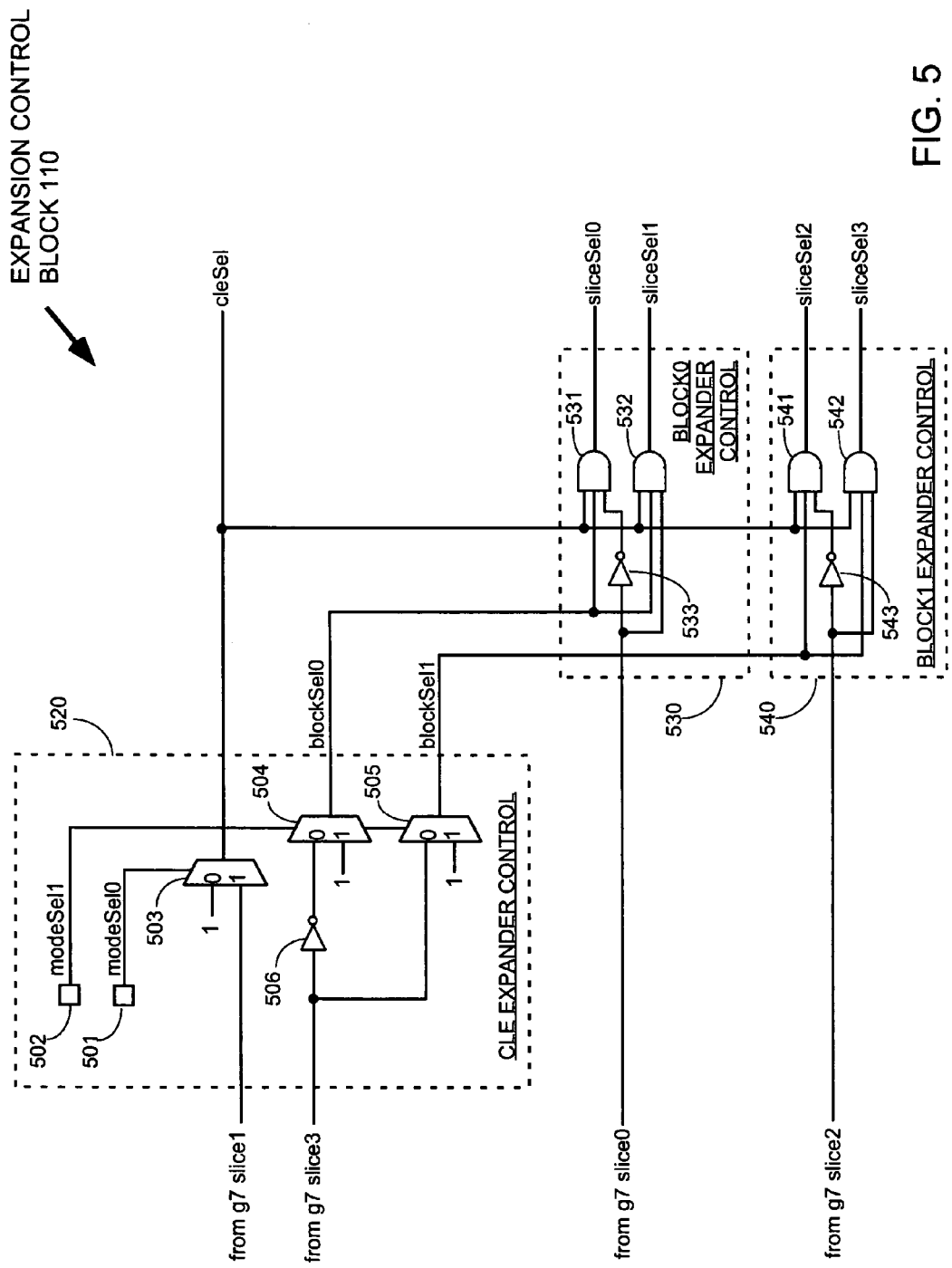
FIG. 5 shows an expansion control block that can be used with the slice of FIG. 2.

FIG. 5 shows one implementation of expansion control block 110. Expansion control block 110 generates the slice select signals that control the horizontal expanders when they are in 2:1 MUX mode, and also provides the CLE select signal that controls the vertical expanders when they are in 2:1 MUX mode. In the pictured embodiment, the various expanders are also controlled by data stored in configuration memory cells, and by signals supplied to the VIMs on the data input lines, e.g., f5, g5, g6, and g7.

In other embodiments of the invention, the expanders are controlled in other ways and by other sources. For example, in one embodiment (not shown), a CLE-wide control signal is provided that sets the horizontal, vertical, and SOP expanders to Feedthrough mode. (In one embodiment, this function is implemented by forcing the select signals of multiplexers 453, 463, and 483 high whenever the CLE-wide Feedthrough signal is high.) These and other variations on the inventive concept will become obvious to those of ordinary skill in the art on contemplation of the present description and figures. These variations fall within the scope and compass of the present invention.

Expansion control block 110 includes a CLE Expander Control portion 520, a Block 0 control portion 530, and a Block 1 control portion 540. CLE Expander Control portion 520 includes two configuration memory cells 501, 502 providing expansion mode control signals modeSel0 and modeSel1, respectively. Signal modeSel0 controls multiplexer 503, which provides a "1" (a high level) to signal cleSel when modeSel0 is low, and provides the signal on g7 of slice 1 to cleSel when modeSel0 is high. Signal modeSel1 controls multiplexer 504, which provides a "1" to signal blockSel0 when modeSel1 is high, and provides the signal on g7 of slice 3, inverted by inverter 506, to signal blockSel0 when modeSel1 is low. Multiplexer 505 provides a "1" to signal blockSel1 when modeSel1 is high, and provides the signal on g7 of slice 3 to signal blockSel1 when modeSel1 is low.

Block 0 control portion 530 includes AND gates 531, 532 and inverter 533. AND gate 531 provides slice select signal sliceSel0, and is driven by cleSel, blockSel0, and the signal on g7 of slice 0, inverted by inverter 533. AND gate 532 provides slice select signal sliceSel1, and is driven by cleSel, blockSel0, and the signal on g7 of slice 0. Note that signals sliceSel0 and sliceSel1 are not both high at the same time, because the signal on g7 of slice 0 cannot be both high and low at the same time.

Similarly, block 1 control portion 540 includes AND gates 541, 542 and inverter 543. AND gate 541 provides slice select signal sliceSel2, and is driven by cleSel, blockSel1, and the signal on g7 of slice 2, inverted by inverter 543. AND gate 542 provides slice select signal sliceSel3, and is driven by cleSel, blockSel1, and the signal on g7 of slice 2.

Expansion control block 110 can assume any of three different modes ("expansion modes"): Block mode, CLE mode, and Default mode. The expansion modes are only significant when the h-expanders are in 2:1 MUX mode, when the active expansion mode controls the behavior of the slice and CLE select signals. The active expansion mode is selected by the states of two mode control signals, modeSel0 and modeSel1, which in the pictured embodiments are controlled by values stored in two configuration memory cells. Table 2 shows the three different expansion modes, the corresponding states of the mode select signals, and the logic levels on the CLE, block, and slice control signals. Note that mode control signals modeSel0 and modeSel1 are not both high at the same time, as this is an unsupported configuration. The notation g7(3) means that the g7 signal of slice 3 is high, while the notation g7(3)' means that the g7 signal of slice 3 is low. The notation g7(1)·g7(3) represents the signal g7(1) ANDed with the signal g7(3).

TABLE 2

| Expansion Mode | mode-Sel0,1 | cle-Sel | block-Sel0,1 | sliceSel0,1,2,3 |
|---|---|---|---|---|
| Block | 0, 1 | 1 | 1, 1 | g7(0)', g7(0), g7(2)' g7(2) |
| CLE | 0, 0 | 1 | g7(3)', g7(3) | g7(3)' · g7(0)', g7(3) · g7(0), g7(3) · g7(2)', g7(3) · g7(2) |
| Default | 1, 0 | g7(1) | g7(3)', g7(3) | g7(1) · g7(3)' · g7(0)', g7(1) · g7(3)' · g7(0), g7(1) · g7(3) · g7(2)', g7(1) · g7(3) · g7(2) |

Multiplexer Chains

One advantageous use of the h-expanders is to implement long multiplexer chains. Multiplexer chains are used, for example, to implement large lookup tables, multiplexers, tristate buffers, and RAMs. Because expanders in 2:1 MUX mode are controlled by a signal not provided to the VIM (e.g., a slice select signal), they provide an opportunity to insert an additional input, thereby implementing functions that cannot be implemented in a single VIM, but without using additional VIMs. Therefore, multiplexer chains are a powerful tool that can reduce the on-chip resources required to implement large user functions.

When a series of h-expanders are configured in 2:1 MUX mode, the number of slices contributing to the resulting VIM complex depends on which slices are selected to initiate the horizontal expander chains. For example, if every other slice initiates a new chain, VIM complexes of 2 slices (e.g., one block) are formed. If every fourth slice initiates a new chain, VIM complexes of 4 slices (e.g., one CLE) are formed. The three expansion modes (Block, CLE, and Default modes) of expansion control block 110 control which slices initiate new horizontal expander chains, by way of the slice select signals.

When the h-expanders are in 2:1 MUX mode, Block expansion mode results in both blocks in the CLE being selected to initiate a multiplexer chain. For example, using Block mode, two VIM complexes can be created in a single CLE, each comprising a single block, or two slices. As can be seen by the slice select signal values in Table 2, the g7 signal from the left-hand slice in each block (i.e., slices 0 and 2) selects between the two slices in the block. In other words, because the two slice select signals within each block always have opposite values, only one slice in the block initiates a horizontal expander chain. For example, when the g7 signal from slice 0 (denoted "g7(0)" in Table 2) is low, slice 0 is selected to initiate the chain (i.e., signal sliceSel0 is high), but slice 1 is not selected (i.e., signal slicesel1 is low). If slice 2 is also selected to initiate a new horizontal expander chain (i.e., if g7(2) is low), slices 0 and 1 together form a single VIM complex.

As described, Block expansion mode can be used to create a VIM complex comprising the two slices in one block, e.g., to combine slices 0 and 1, and/or to combine slices 2 and 3. However, if the values on the g7 terminals are correctly selected, slices from different blocks can be combined. Therefore, the VIM complex can cross a block boundary.

When the h-expanders are in 2:1 MUX mode, the CLE expansion mode results in only one block in the CLE being selected to initiate a multiplexer chain, and only one slice in the selected block being selected. For example, using CLE mode, one VIM complex can be created from a single CLE (two blocks, or four slices). As can be seen by the slice select signal values in Table 2, the g7(3) signal selects between the two blocks in the CLE. For example, when g7(3) is low, either slice 0 or slice 1 is selected depending on the value of g7(0). When g7(3) is high, either slice 2 or slice 3 is selected depending on the value of g7(2). To use the entire CLE as a single VIM complex, slice 0 is selected to initiate the h-expander chain. Therefore, signals g7(3) and g7(0) are both low.

As described, CLE expansion mode can be used to create a VIM complex comprising slices 0–3 from a single CLE. However, if the values on the g7 terminals are correctly selected, slices from different CLEs can be combined. Therefore, the VIM complex can cross a CLE boundary.

When the h-expanders are in 2:1 MUX mode, the Default expansion mode results in either of two situations: 1) g7(1) is low, so no slices are selected to initiate the multiplexer chain; or 2) g7(1) is high, so the CLE reverts to CLE expansion mode and only one slice is selected to initiate the multiplexer chain. This mode can be used, for example, when the g7(1) input signal is required as an input to a complex function in a VIM complex larger than one CLE.

Implementing User Circuits

Clearly, the task of selecting and specifying the correct expansion mode for each CLE, the correct expander modes for each expander in each slice, and the correct values for the f5, g5, g6, and g7 data inputs for each VIM, can be time-consuming if manual methods are used. In one embodiment, FPGA implementation software (i.e., mapping and placement software) provided by the FPGA manufacturer selects and specifies these modes and values. In this embodi-ment, the presence of the expander capability is transparent to the user's schematics, HDL description, netlist, or other entry method.

In another embodiment, the FPGA manufacturer selects and specifies these modes and values for many common functions, e.g., PALs, lookup tables, multiplexers, tristate buffers, and memories of various sizes. The FPGA manu-facturer then provides these functions to the user as a collection of library elements that can be added to the user's circuit either as HDL elements or schematic symbols. Pref-erably, the library elements can also be inferred by software that converts HDL (Hardware Design Language) circuit descriptions to netlists and/or FPGA configuration bit-streams.

Figures 6A, 6B:
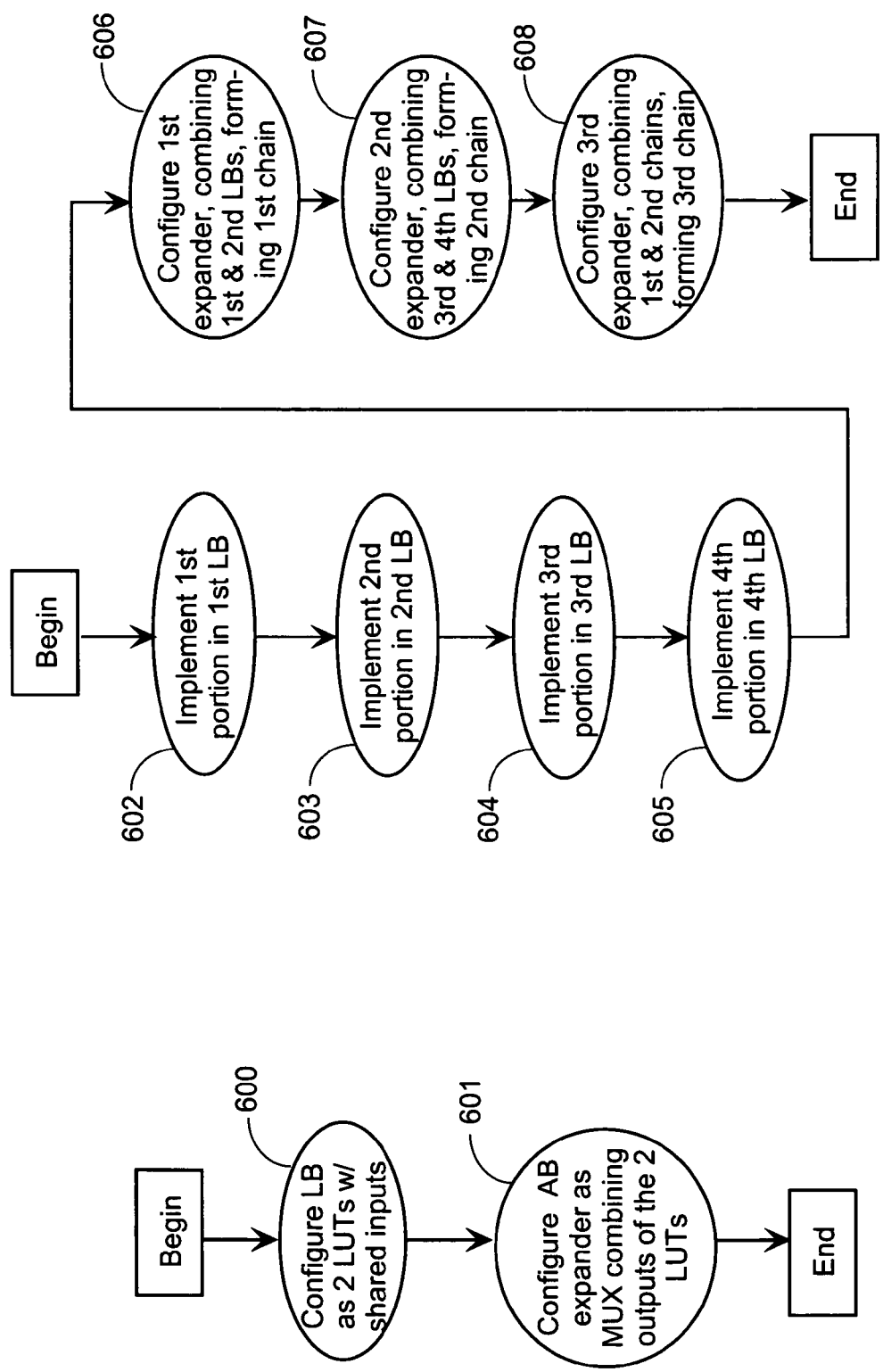
FIG. 6A is a flow diagram showing a method for implementing a user circuit in a PLD using (for example) the LUT of FIG. 3.
FIG. 6B is a flow diagram showing a method for implementing a user circuit in a PLD using expanders.

FIG. 6A is a flow diagram showing a method for imple-menting a user circuit in a PLD using (for example) the logic block of FIG. 3. In the described example, the user circuit is a 6-input LUT. (In other embodiments, user circuits other than LUTs, or LUTs with other numbers of inputs, are implemented.) In step 600, the logic block (LB) is config-ured to be in 6-LUT mode. In other words, as described in conjunction with FIG. 3, the logic block provides two outputs of two 5-input LUTs with five shared inputs. In step 601, an AB expander driven by the outputs of the two 5-input LUTs is configured as a multiplexer (see FIG. 2, for example). The resulting multiplexer is controlled by a signal that forms the 6th input to the 6-LUT user circuit.

FIG. 6B is a flow diagram showing a method for imple-menting a user circuit in a PLD using expanders. In step 602, a first portion of the user circuit is implemented in a first logic block (LB). In steps 603–605 second, third, and fourth portions of the user circuit are implemented in second, third, and fourth portions of the user circuit, respectively. Steps 602–605 can be performed in any order. In step 606, a first expander is configured to combine the first and second logic blocks, forming a first expander chain extending in a first direction (e.g., horizontally). (Step 606 occurs after steps 602 and 603, but can occur prior to step 604 and/or step 605.) In step 607, a second expander is configured to combine the third and fourth logic blocks, forming a second expander chain extending parallel to the first expander chain. In step 608, a third expander is configured to combine the first and second expander chains, forming a third expander chain extending in a direction orthogonal to the first and second chains (e.g., vertically).

The remainder of the present specification describes exemplary implementations of various user circuits using the CLE of FIG. 1, the slice of FIG. 2, and the VIM of FIG. 3.

Implementing Large PALs

FIGS. 7–10 show how to implement exemplary PALs of various sizes. In each of these examples, the VIMs are configured in PAL mode. In another embodiment, the VIMs are replaced by logic blocks always operating as product term generators, with LUT functionality not being provided by the logic blocks. In another embodiment, the Pterms are always provided, regardless of the configured LUT mode of the VIM (e.g., both Pterm outputs and LUT outputs are provided in 5-LUT and 6-LUT modes). In some embodi-ments, other functionalities than PALs and LUTs are also supported.

Figure 7:
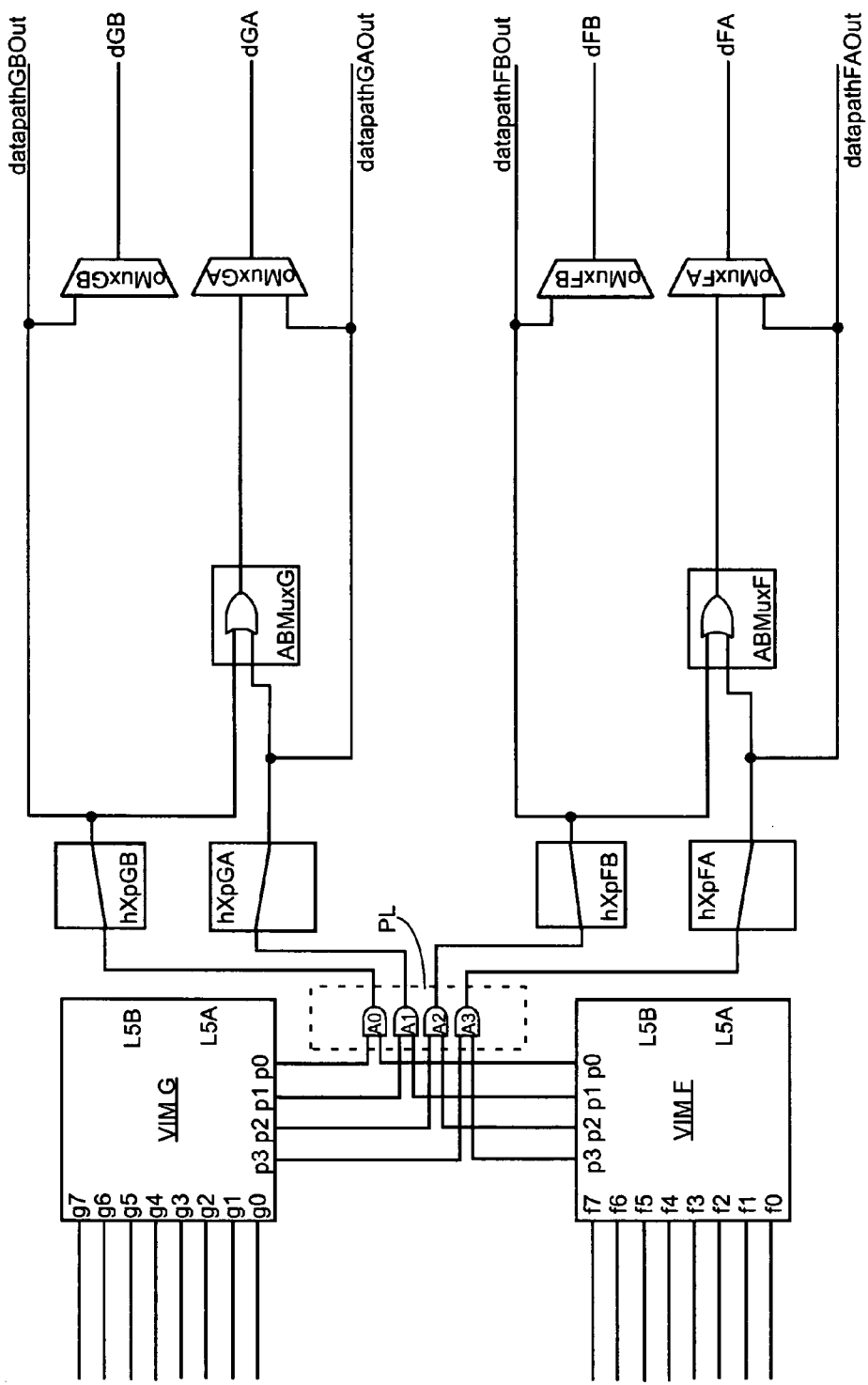
FIGS. 7–10 show how to implement exemplary PALs of various sizes using the CLE of FIG. 1 and the slice of FIG. 2.

FIG. 7 shows how the two VIMs of one slice can generate four output signals, each comprising one Pterm (i.e., product term) of 16 inputs. As shown in FIG. 7, the h-expanders hXp are placed in Get-On mode, with each one placing the associated PAL AND output onto the datapathOut terminal of the horizontal chain. The PAL AND output is available on either the datapathOut terminal or the data terminal "d" (via the output multiplexer oMux).

Alternatively, the 16-input Pterms can be combined in pairs within the slice using the AB expanders ABMuxF and ABMuxG in 2-input OR mode, thereby providing (again through the output multiplexers oMux) two PAL outputs of 2 Pterms with 16 inputs each.

FIG. 8 shows how horizontally adjacent VIMs (i.e., VIMs in two different slices) can be combined using expanders to generate four output signals, each comprising one Pterm of 32 inputs. This figure shows how to combine horizontally-positioned VIMs to increase the number of Pterm inputs, while the example of FIG. 7 shows how to combine two vertically-positioned VIMs in the same slice. In the example of FIG. 8, slice 0 and slice 1 of a single CLE are used. However, any two horizontally-positioned slices can be combined. They need not be in the same CLE, nor adjacent to each other.

In slice 0, the h-expanders are configured in Get-On mode, placing the PAL AND signal onto the horizontal expander chain. As in FIG. 7, each PAL AND output has 16 inputs. The output of the h-expander is then passed along the horizontal expander chain to slice 1, where the h-expander is configured in 2-input AND mode. Therefore, in slice 1, the PAL AND output from slice 0 is combined in an AND function with the PAL AND output from slice 1. Thus, the output of the h-expander in slice 1 is a 32-input Pterm. Of course, the 32-input Pterm can be placed on the "d" output terminal as in FIG. 7, as desired. Alternatively, the horizontal expander chain can be extended to yet another slice, as in FIG. 9, further increasing the number of inputs to the Pterms.

Figure 9:
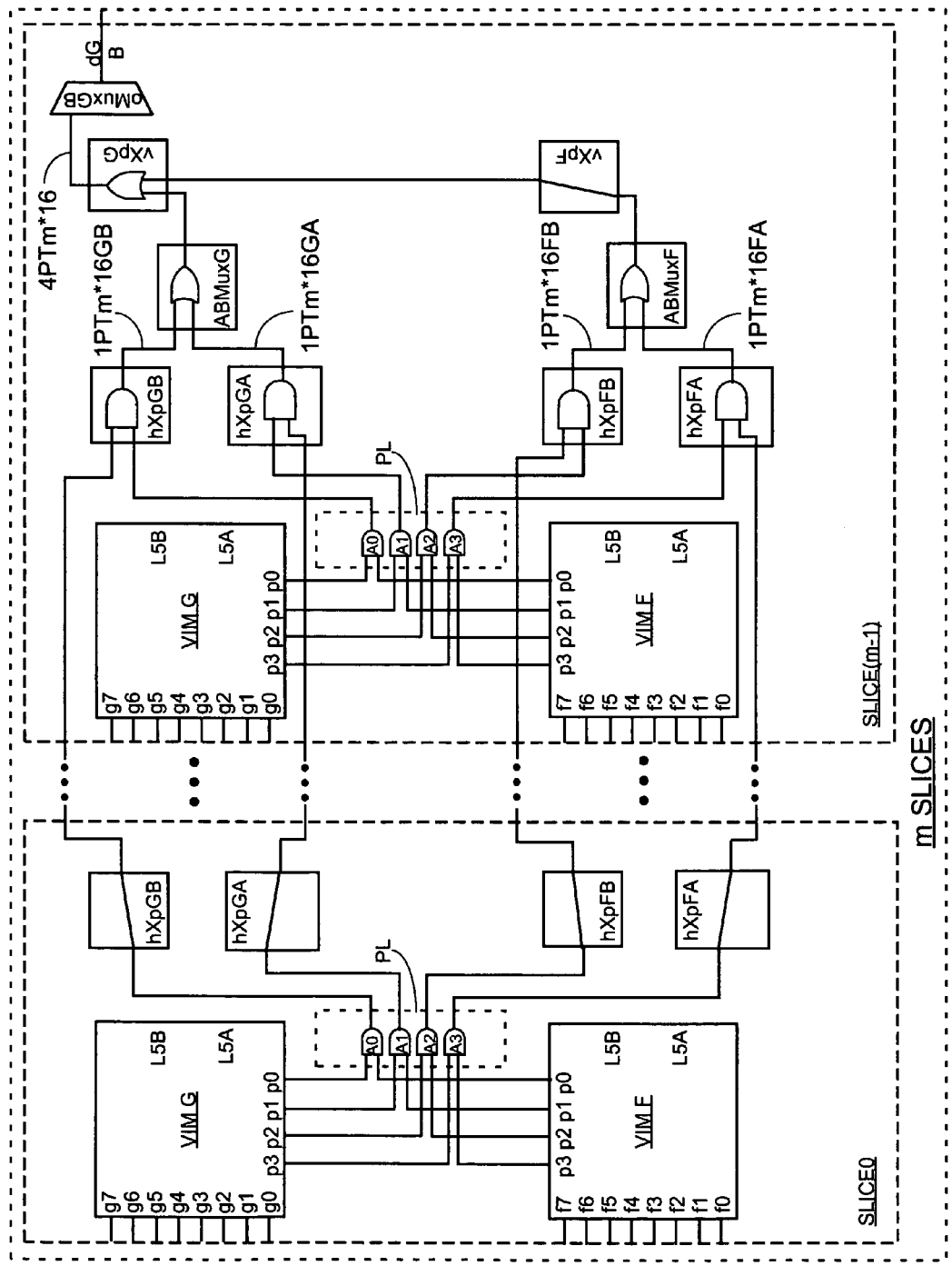
Figure 10:
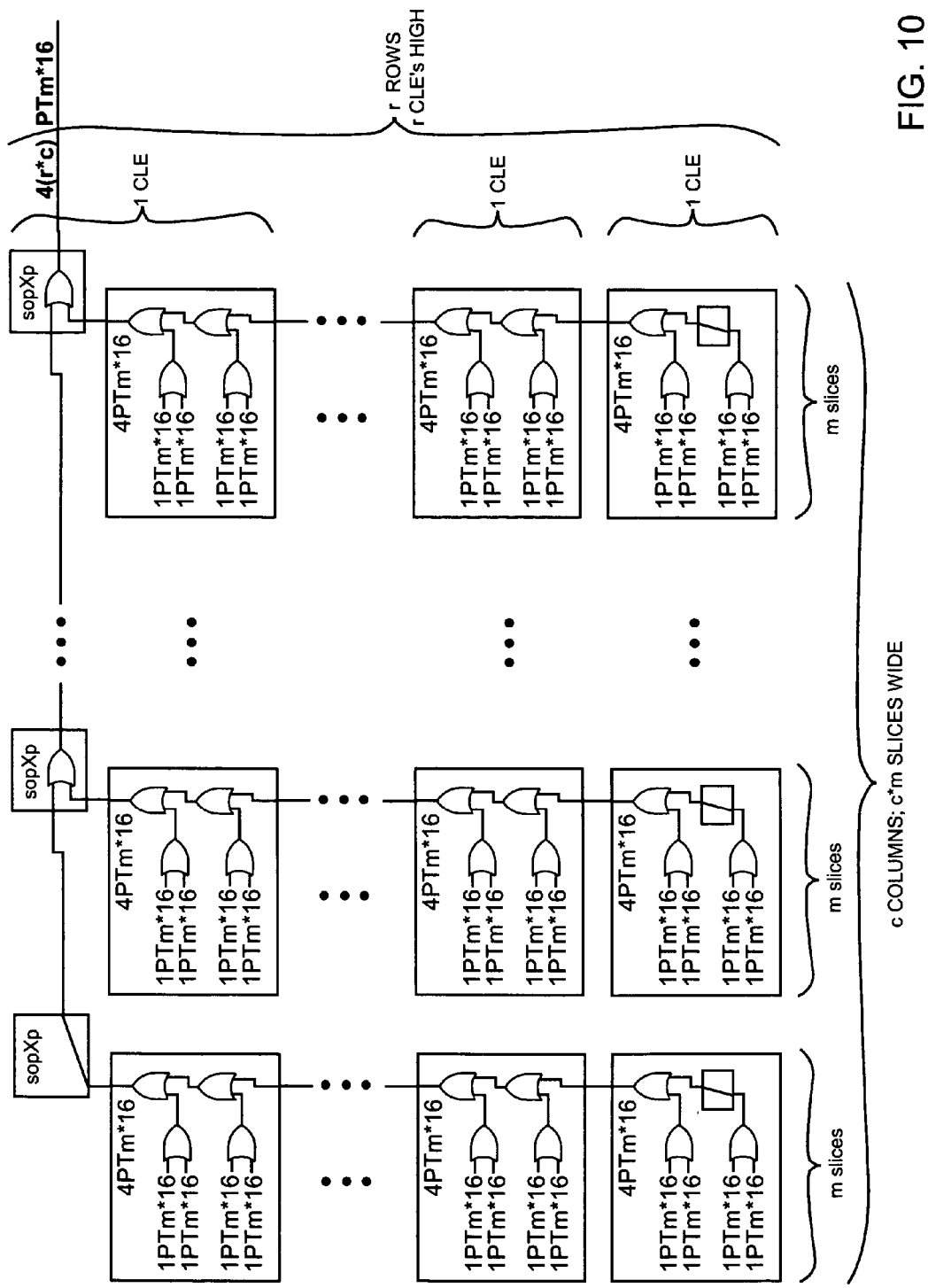

FIG. 9 shows how two or more slices can be combined using expanders to generate one OR'ed output signal (4 PTm*16) comprising four Pterms of m*16 inputs (1 PTm*16), where m is the number of slices. Slice 0 initiates the horizontal expander chain (as in FIGS. 7 and 8), while slices 1 through m-1 are each configured to add an additional 16 inputs to the PAL AND signal on the horizontal expander chain (as in slice 1 of FIG. 8). Each resulting Pterm (1 PTm*16) has m*16 inputs. Slice m-1 is further configured to combine the two horizontal expander chains associated with each VIM, using the AB expanders (ABMuxF and ABMuxG) configured in 2-input OR mode. The outputs of the AB expanders are then combined (also in slice m-1) using the vertical expander chain (vXpF and vXpG). The v-expander vXpG is configured in 2-input OR mode. The v-expander vXpF is configured in Get-On mode. (To create wider PALs, the v-expander vXpF is configured in 2-input OR mode, thereby adding Pterms from the slice below, as shown in FIG. 10.) Thus, the resulting circuit is a series of Pterms combined using an OR function, creating a PAL output.

In the pictured example, the vertical expander chain is initiated in v-expander vXpF by placing the expander in Get-On mode. Alternatively, for example in an embodiment where Get-On mode is not available, the vertical expander chain can be initiated by ORing the output of AB expander ABMuxF with a "0" logic level (i.e., logic low) on the vXpChainIn terminal. In one embodiment, a weak pulldown transistor is provided to pull the vXpChainIn signal low when no other value is provided. In another embodiment, a pulldown transistor on the vXpChainIn line is controlled by a configuration memory cell.

As has been seen by the previous examples, the horizontal expander chain can be used to increase the number of inputs for a Pterm. The vertical expander chain can then be used to combine a large number of Pterms to generate a wide PAL output signal. As shown in FIG. 10, several vertically-positioned CLEs can be combined by using the configuration of FIG. 9, but extending the vertical expander chain across CLE boundaries. The vertical expander chain can be made as long as necessary to implement any size of PAL logic, by configuring the initiating v-expander in Get-On mode and the subsequent expanders in 2-input OR mode. (Of course, v-expanders can be skipped by placing them in Feedthrough mode.) However, an extremely long expander chain would be very slow. Therefore, for very wide functions, the CLE of FIG. 2 provides a second type of horizontal expander chain—the SOP chain—that can be used to combine the outputs of several vertical expander chains.

FIG. 10 shows how multiple VIMs can be combined using the SOP expanders to implement very large PALs, e.g., PALs with more than 8 Pterms of more than 16 inputs. The VIM complex of FIG. 10 is "r" CLEs high and "c*m" slices wide. The VIM complex includes "c" columns of "m" slices each, with each group of "m" horizontally adjacent slices being configured to implement (m*16)-input Pterms. These Pterm outputs are then combined using the vertical expanders as shown in FIG. 9. Each group of "m" horizontally-positioned slices thus provides a PAL output of four Pterms with m*16 inputs (4 PTm*16). The outputs of the vertical expander chains (4 PTm*16) are fed into the SOP expanders (sopXp). The initiating SOP expander is placed in Get-On mode, which places the output of the associated v-expander on the SOP expander chain. The subsequent SOP expanders are configured in 2-input OR mode. (Of course, SOP expanders and their associated CLEs can be omitted from the SOP expander chain by placing the SOP expanders in Feedthrough mode.) Thus, the number of combined Pterms is 4*r*c.

Note that the delay through the OR function using SOP expanders in an array of CLEs as shown in FIG. 10 is:

horiz_delay+(vert_delay*r)+((SOP_delay)*c)

where "horiz_delay" is the delay through one CLE on the horizontal expander chain, "vert_delay" is the delay through one CLE on the vertical expander chain, and "SOP_delay" is the delay through one CLE on the SOP expander chain.

For the same size PAL implemented without the SOP chain (i.e., using only the horizontal and vertical expander chains in a single column of r*c CLEs), the delay is:

horiz_delay+(vert_delay*r*c)

Therefore, for large PALs, the SOP expander chain provides a much faster implementation than would otherwise be available.

Implementing Large Lookup Tables

FIGS. 11–16 show how to implement exemplary lookup tables (LUTs) of various sizes.

Figure 11:
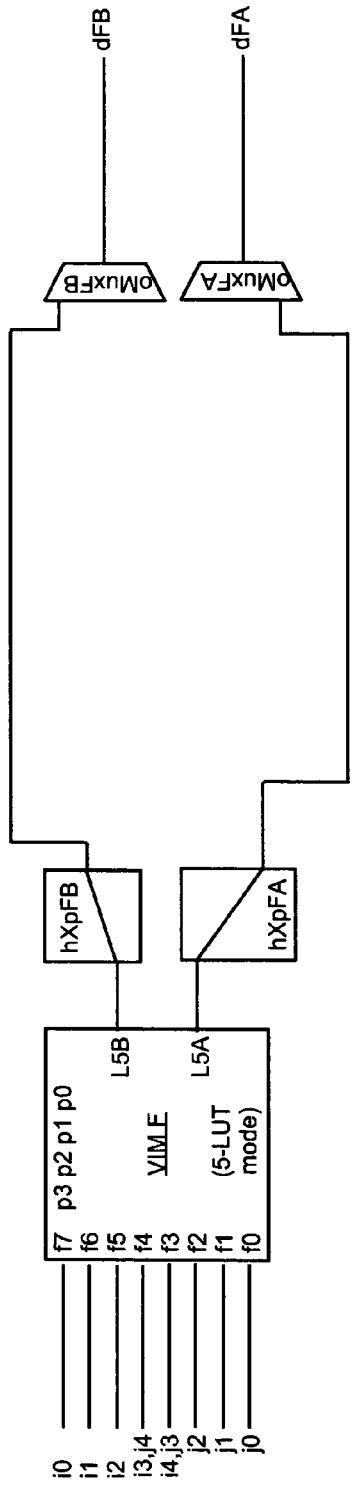
FIGS. 11–16 show how to implement exemplary lookup tables (LUTs) of various sizes using the CLE of FIG. 1 and the slice of FIG. 2.

FIG. 11 shows how a single VIM can implement two 5-input LUTs. In the embodiment of FIG. 2, both VIMs are the same, so only VIM F is shown in FIG. 11. The half-slice including VIM G can be similarly configured. The VIM (for example, a VIM as in FIG. 3) can be configured in either of two different modes. As described above, in 5-LUT mode the VIM provides the outputs of two 5-input lookup tables. Output L5A is based on the values of VIM data input signals f0–f4 (input signals j0–j4, respectively). Output L5B is based on the values of VIM data signals f7–f3 (input signals i0–i4, respectively). Therefore, the two LUTs share two input signals, f3 and f4. (In other words, i3 and j4 are the same signal, and i4 and j3 are the same signal.) The L5 output signals each drive an h-expander hXp in Get-On mode. Therefore, the L5 output signals are placed on the horizontal expander chain, from which they can be extracted onto the "d" output terminals via the output multiplexers oMuxFA and oMuxFB.

Figure 12:
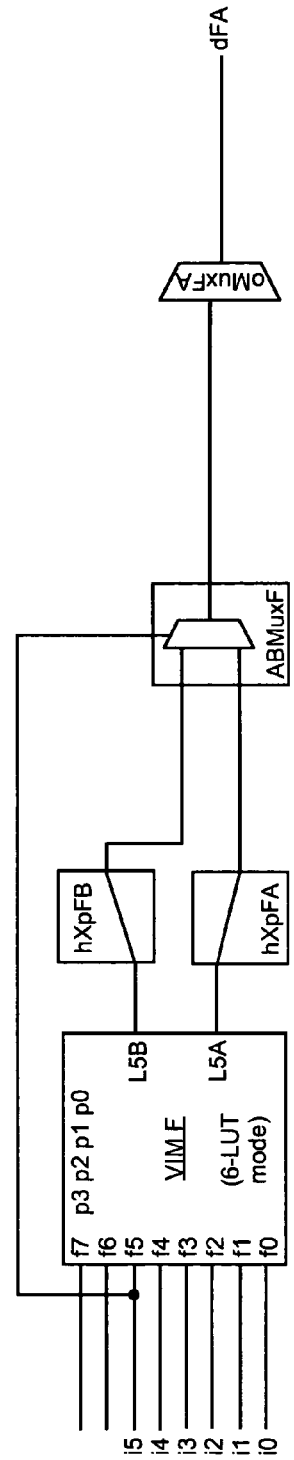

FIG. 12 shows how a single VIM can implement one 6-input LUT using an AB expander. Again, only the half-slice including VIM F is shown, but the half-slice including VIM G can be similarly configured. The VIM is configured in 6-LUT mode. As described above, in 6-LUT mode the VIM provides the outputs of two 5-input LUTs, but the two output signals L5A and L5B are each based on the same five input signals, VIM data input signals f0–f4 (input signals i0–i4, respectively). The selection between the two output signals L5A and L5B is performed by the AB expander ABMuxF, configured in 2:1 MUX mode. The select signal is comes from the f5 data input terminal of the VIM, and provides the sixth input for the 6-input LUT. The output of the AB expander ABMuxF can be extracted via the output multiplexer oMuxFA.

Figure 13:
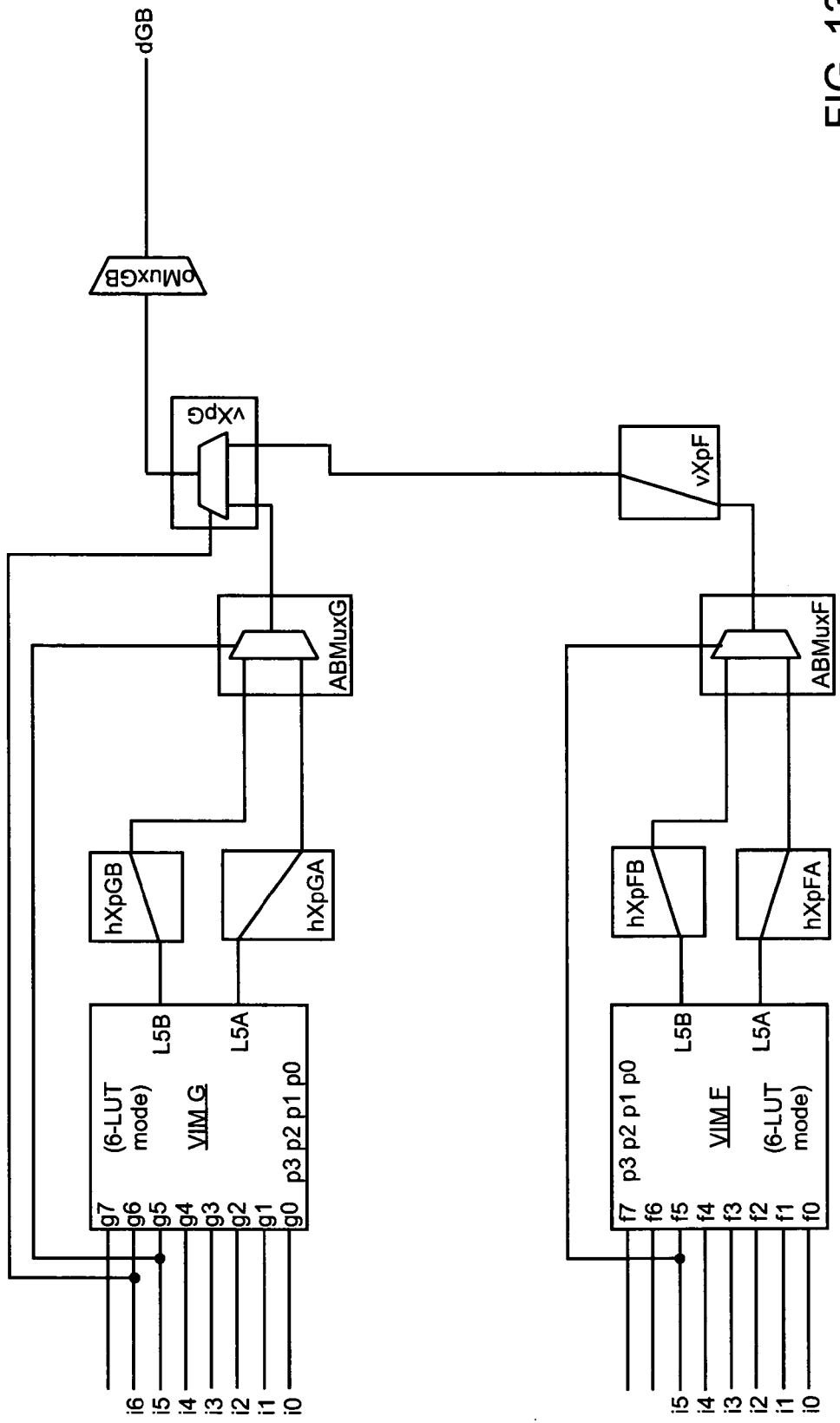

FIG. 13 shows how the two VIMs of one slice can be combined using expanders to implement one 7-input LUT. Both VIMs in the slice are configured in 6-LUT mode, with the AB expander being used to generate the 6-LUT output as in FIG. 12. However, the output of AB expander ABMuxF is placed on the vertical expander chain via v-expander vXpF in Get-On mode, then combined with the output of AB expander ABMuxG in v-expander vXpG, which is configured in 2:1 MUX mode. The control input i6 for the resulting multiplexer, which provides the seventh input for the 7-input LUT, comes from the g6 data input of VIM G. The output of the 7-input LUT can be extracted from the vertical expander chain via the output multiplexer oMuxGB.

As seen in FIG. 2, vXpG in 2:1 MUX mode is actually controlled by AND gate 202, which combines the g6 data input signal with the CLE select signal cleSel. However, in the example of FIG. 13 the cleSel signal is held high. Therefore, AND gate 202 is omitted, for clarity, from this and other figures where cleSel has a constant high value.

Figure 14:
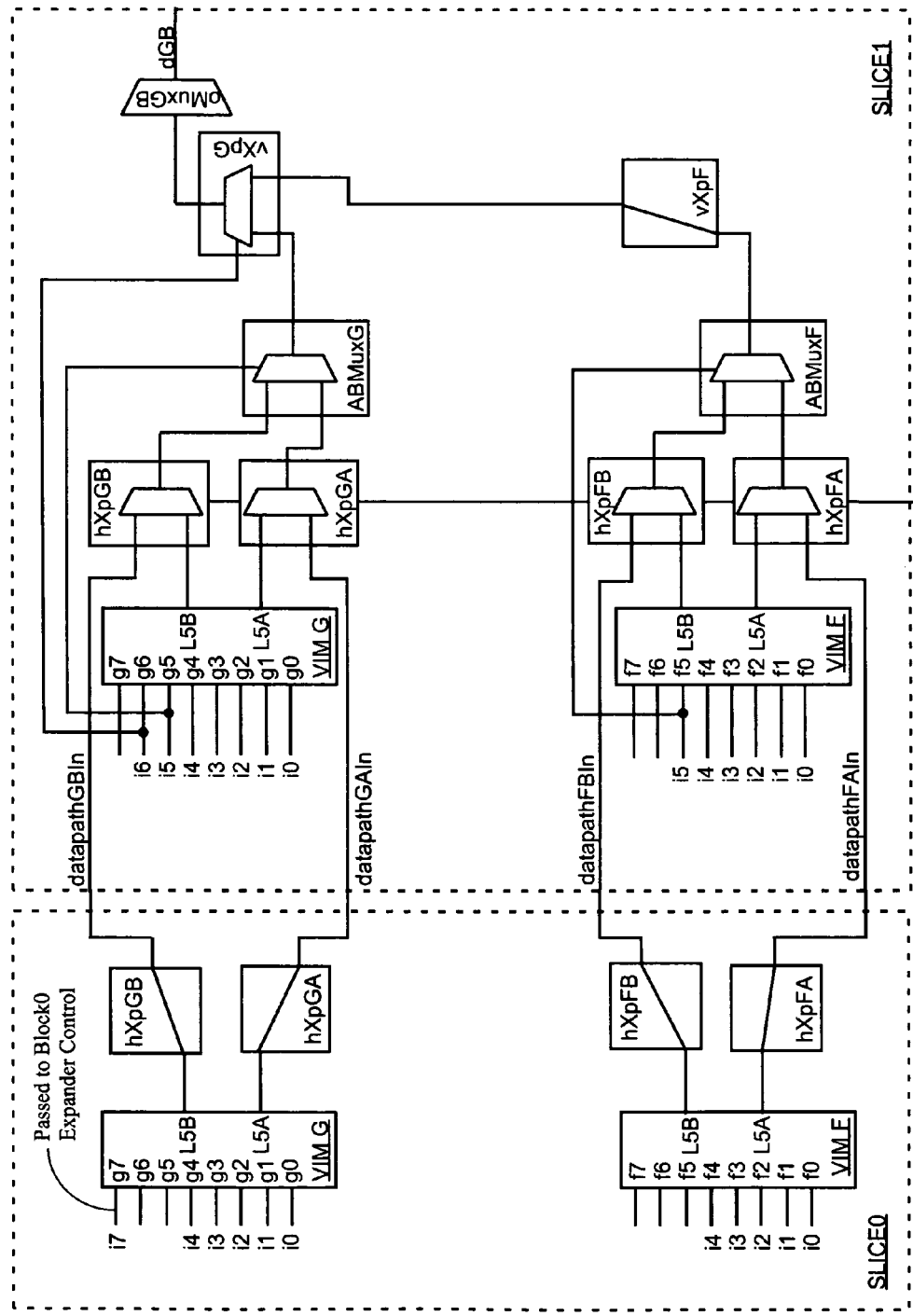

FIG. 14 shows how the VIMs of two horizontally-positioned slices (e.g., one block) can be combined using expanders to implement one 8-input LUT. As with the other examples that show two or more horizontally adjacent slices, the slices need not be adjacent. If the h-expanders of intervening slices are placed in feedthrough mode, non-adjacent slices can be combined to implement the functions described herein. However, the slice select signals must be correctly adjusted to account for the change, and the use of adjacent slices is generally the preferred implementation. For these reasons, all examples shown herein use horizontally adjacent slices to implement the desired user circuits.

All VIMs in this example are configured in 6-LUT mode. Further, the CLE expansion control block is placed in Block mode. See the "Multiplexer Chains" section, above, for a description of the Block expansion mode and its effect on the function of h-expanders in 2:1 MUX mode.

In slice 0, each half-VIM implements a function of five input signals i0–i4, which is placed on the horizontal expander chain via h-expanders hXp configured in Get-On mode. In slice 1, each half-VIM implements a function of the same five input signals i0–i4. These functions are combined with the values from the four horizontal expander chains, using the h-expanders of slice 1 configured in 2:1 MUX mode. The select signal for the 2:1 MUX mode of the h-expanders is the slice select signal sliceSel1. Signal sliceSel1 is based on the g7 data input signal from slice 0 (see FIG. 5), so the i7 input signal is placed on the g7(0) data input terminal. Thus, each of the four h-expanders in slice 1 provides an independent function of the six input signals i0–i4 and i7.

The outputs of the h-expanders are now combined, in pairs associated with each VIM. The outputs of h-expanders hXpFA and hXpFB are combined using AB expander ABMuxF configured in 2:1 MUX mode. The outputs of h-expanders hXpGA and hXpGB are combined using AB expander ABMuxG configured in 2:1 MUX mode. Each of the resulting multiplexers is controlled by the is signal, which is placed on the f5, g5 data input terminal of the associated VIM. Thus, each of the two AB expanders in slice 1 provides an independent function of the seven input signals i0–i5 and i7.

The outputs of the AB expanders are now combined using the vertical expander chain. V-expander vXpF is configured in Get-On mode, in which mode it places the output of AB expander ABMuxF onto the vertical expander chain. V-expander vXpG is configured in 2:1 MUX mode, in which it selects between the outputs of the two AB expanders. The control signal for this multiplexer is the i6 signal, which is placed on the g6 data input terminal of VIM G (g6(1)). Thus, the output of v-expander vXpG in slice 1 is a function of the eight input signals i0–i7. This 8-LUT output signal can be extracted via the output multiplexer oMuxGB.

Figure 15:
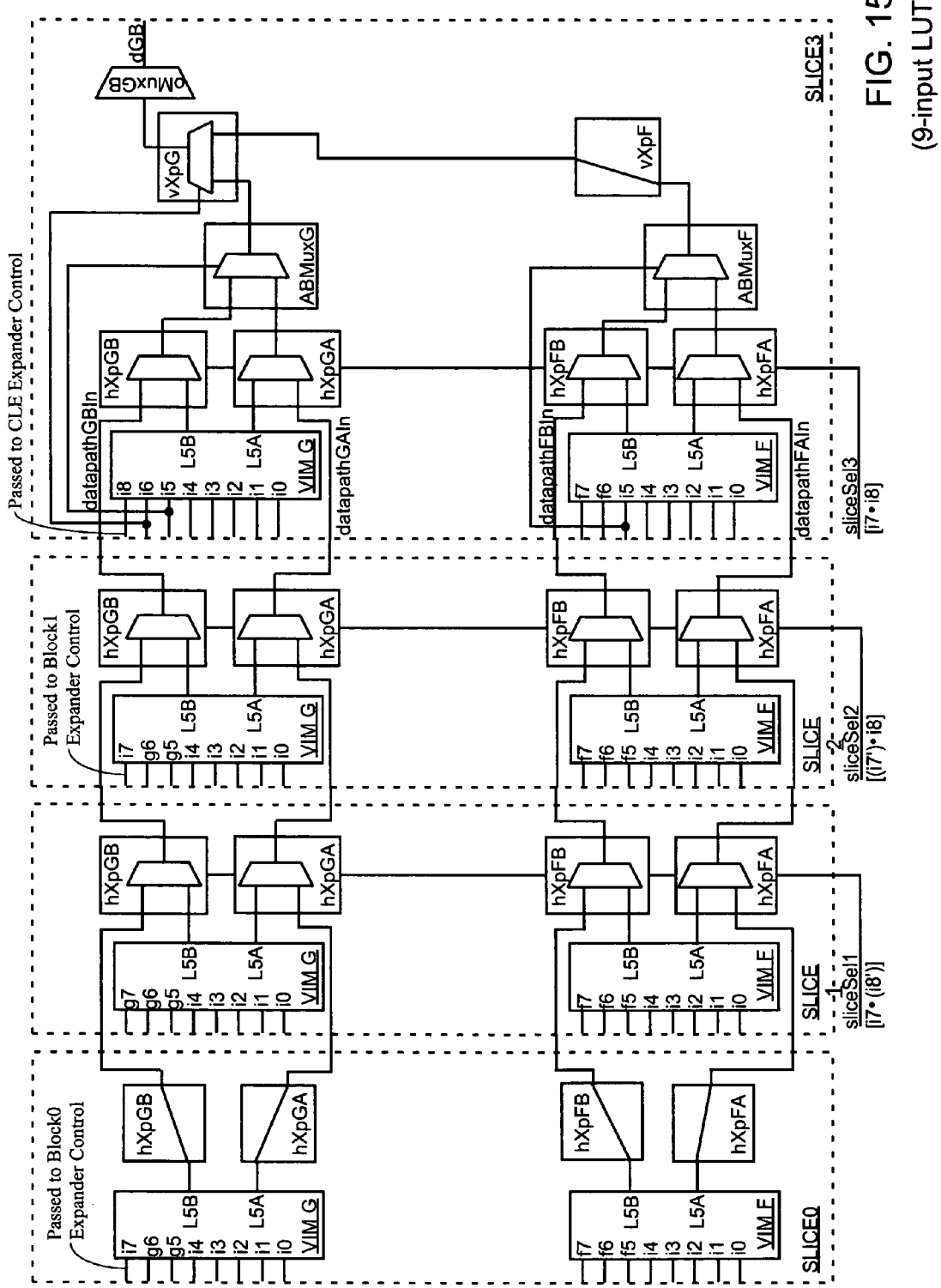

FIG. 15 shows how the VIMs of four slices (e.g., one CLE) can be combined using expanders to implement one 9-input LUT. All VIMs in this example are configured in 6-LUT mode. Further, the CLE expansion control block is placed in CLE mode. See the "Multiplexer Chains" section, above, for a description of the CLE expansion mode and its effect on the function of h-expanders in 2:1 MUX mode.

In the example of FIG. 15, input signals i0–i4 are provided to all VIMs. Therefore, each VIM generates two functions of the same five input signals i0–i4. Two more input signals are provided on the g7 input terminals of slices 0 and 2 (i7 in both cases) and the g7 input terminal of slice 3 (i8). These two signals i7, i8 are used to generate the slice select signals sliceSel1, sliceSel2, and sliceSel3 (see FIG. 5). These slice select signals control the h-expanders in slices 1–3, respectively, which are configured in 2:1 MUX mode. (The h-expander in slice 0 is configured in Get-On mode, to initiate the h-expander chain.) Thus, each of the four h-expanders in slice 3 provides an independent function of the seven input signals i0–i4, i7, and i8.

The AB expanders and v-expanders in slice 3 are configured as in slice 1 in the example of FIG. 14. The AB expanders in 2:1 MUX mode are controlled by input signal i5, which is provided on the associated f5, g5 data input terminal of the associated VIM. Therefore, each of the two AB expanders in slice 3 provides an independent function of the eight input signals i0–i5, i7, and i8. V-expander vXpG in 2:1 MUX mode is controlled by the i6 signal, which is placed on the g6 data input terminal of VIM G. Thus, the output of v-expander vXpG in slice 3 is a function of the nine input signals i0–i8. This 9-LUT output signal can be extracted via the output multiplexer OMuxGB.

Figure 16:
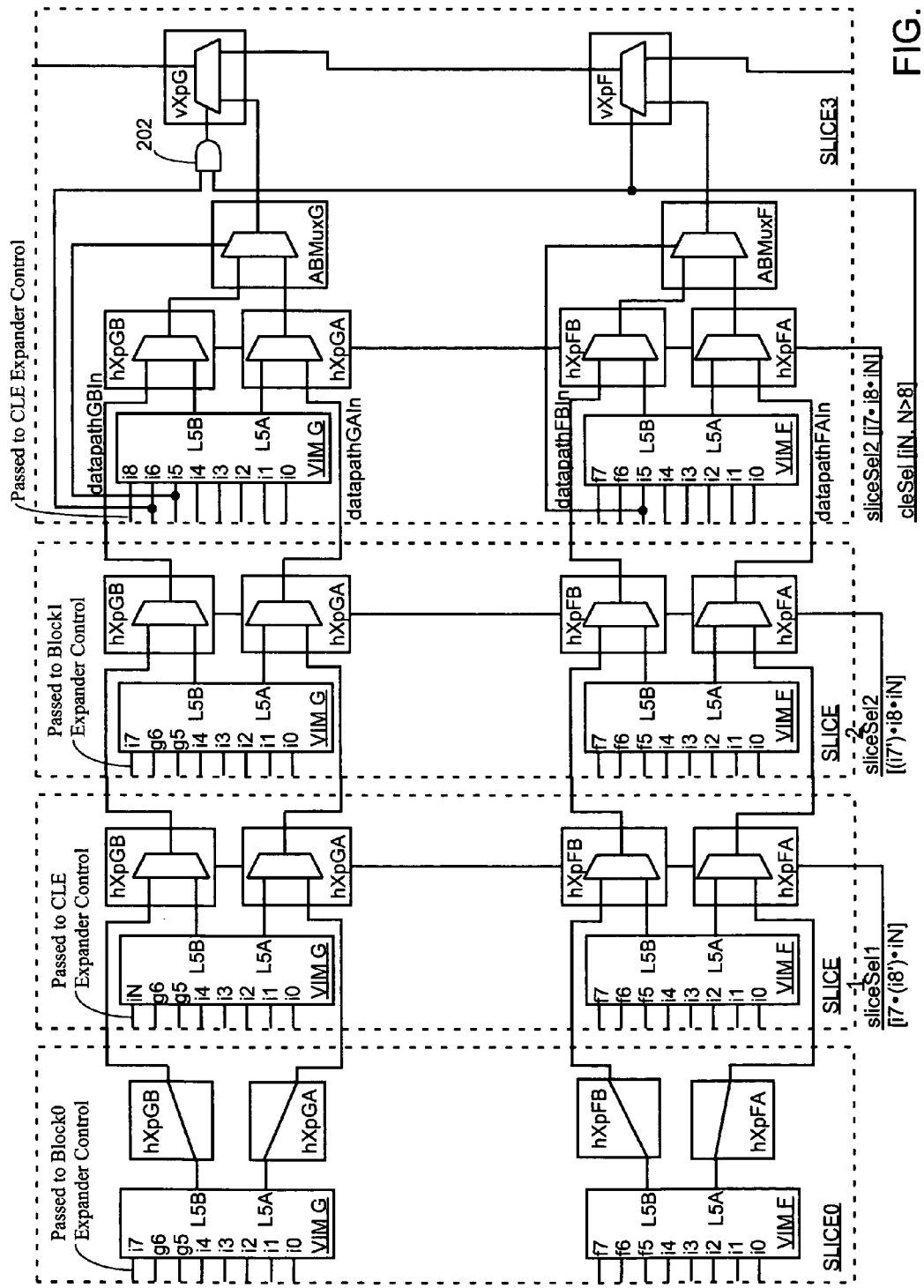

FIG. 16 shows how the VIMs of multiple CLEs can be combined using expanders to implement LUTs with more than 9 inputs. As in the example of FIG. 15, all VIMs are configured in 6-LUT mode. However, in this example the CLE expansion control block is placed in the Default mode. Thus, the cleSel control signal is an active contributor to the functionality of the CLE. See the "Multiplexer Chains"

section, above, for a description of the Default expansion mode and its effect on the function of h-expanders in 2:1 MUX mode.

To implement a LUT having more than 9 inputs, an Nth input signal iN is provided using the g7 data input terminal of VIM G in slice 1 (g7(1)). This input signal iN is then ANDed with input signals i7 and i8 in the expansion control block of FIG. 5, and is included in the slice select signals controlling the h-expanders in 2:1 MUX mode. Also, the CLE select signal cleSel now comes into play. Rather than being held high, as in the previous examples, cleSel reflects the value of the iN input signal (see FIG. 5 and Table 2). As shown in slice 3 of FIG. 16, several CLEs can then be combined by extending the vertical expander chain across the CLE boundaries.

For example, to implement a 10-input LUT (i.e., N=9), two vertically-positioned CLEs can be used, with i9 being provided to one CLE (at g7(1)) and the inverse of signal i9 (i9') being provided to the other CLE (also at g7(1)). To implement an 11-input LUT, four vertically-positioned CLEs are required, with the signals i9 and i10 being combined using other VIMs to generate four different CLE select signals for the four CLEs. Using this technique, LUTs of any size can be generated.

In another embodiment (not pictured), the SOP expanders have a 2:1 MUX expander mode. In this embodiment, the SOP expander of slice 3 can be used to add additional inputs. For example, a 10-input LUT can be created by combining two horizontally-positioned CLEs.

Implementing Large Multiplexers

FIGS. 17–21 show how to implement exemplary multiplexers of various sizes. In these examples, the VIMs are all configured in 6-LUT mode. In other words, as described in conjunction with FIG. 3, each VIM provides two 5-input LUT output signals L5A and L5B based on the same five input signals.

Figure 17:
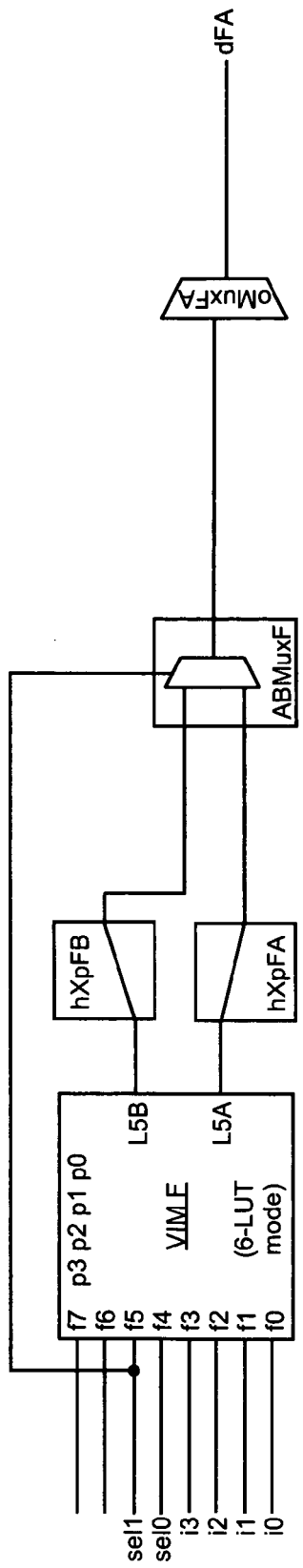

FIG. 17 shows how a 4:1 multiplexer is implemented using one VIM and an AB expander. Each half-VIM (5-LUT) implements a 2:1 MUX having two data inputs and a select input. For example, L5A can provide the result of input signals i0 and i1 MUXed together under the control of a first select signal sel0. Similarly, L5B can provide the result of input signals i2 and i3 MUXed together under the control of the same select signal sel0. The outputs of these 2:1 MUXes (L5A and L5B) are then multiplexed together using the AB expander ABMuxF under the control of a second select signal sel1 provided on the f5 data input terminal of the VIM. Thus, the half-slice shown in FIG. 17 is configured to implement a 4:1 MUX. The output of the 4:1 MUX can be extracted via the output multiplexer oMuxFA.

Figure 18:
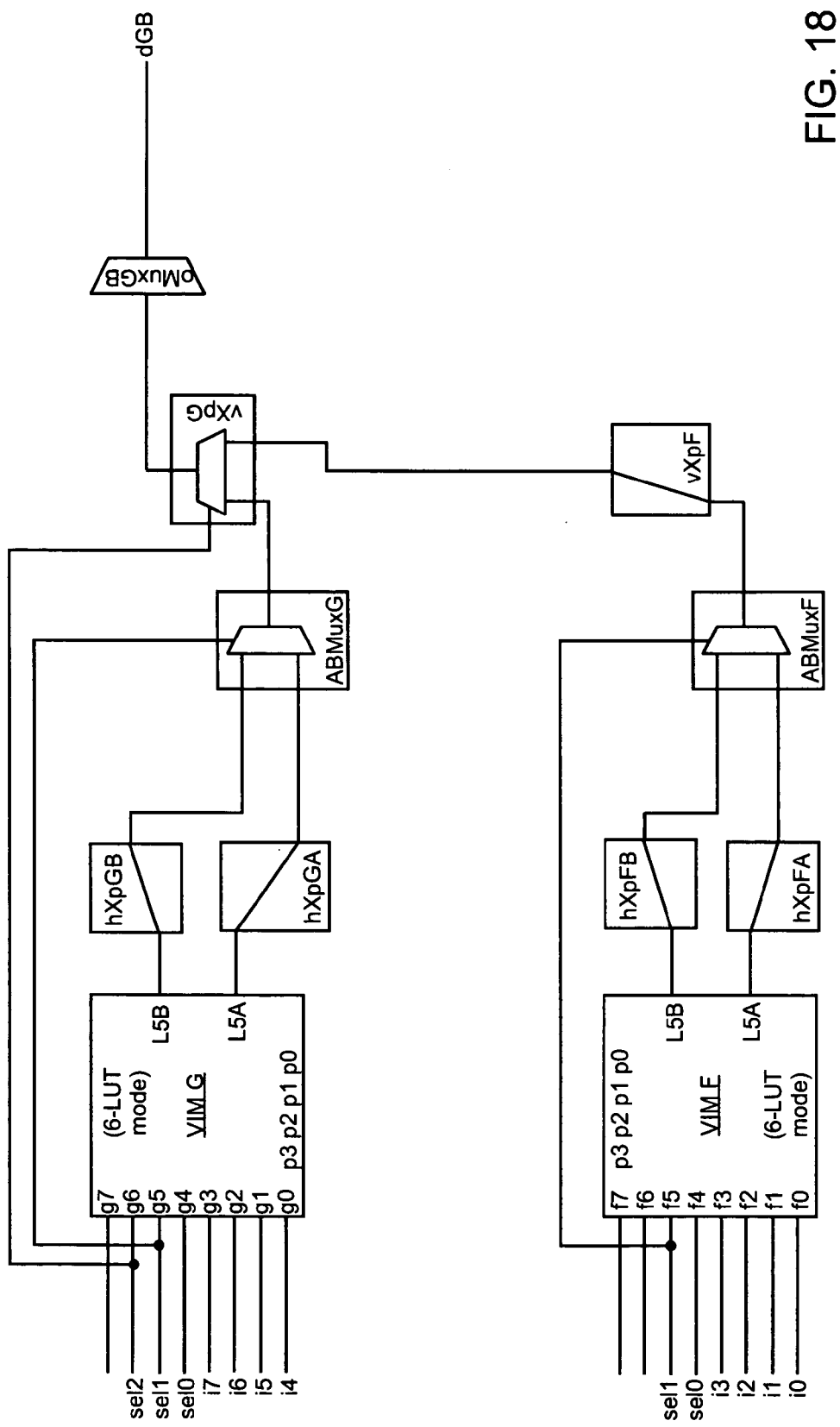

FIG. 18 shows how the two VIMs of one slice can be combined using expanders to implement an 8-to-1 MUX. The h-expanders and AB expanders are configured as in the half-slice of FIG. 17. AB expander ABMuxF provides the output of a 4:1 MUX acting on data inputs i0–i3 and controlled by select signals sel0 and sel1. Similarly, AB expander ABMuxG provides the output of a 4:1 MUX acting on data inputs i4–i7 and controlled by select signals sel0 and sel1. However, the output of AB expander ABMuxF is placed on the vertical expander chain via v-expander vXpF in Get-On mode, then combined with the output of AB expander ABMuxG in v-expander vXpG, which is configured in 2:1 MUX mode. The third select signal sel2 for the resulting multiplexer comes from the g6 data input of VIM G. Thus, an 8:1 MUX controlled by three select signals sel0, sel1, sel2 is implemented. The output of the 8:1 MUX can be extracted from the vertical expander chain via the output multiplexer oMuxGB.

Figure 19:
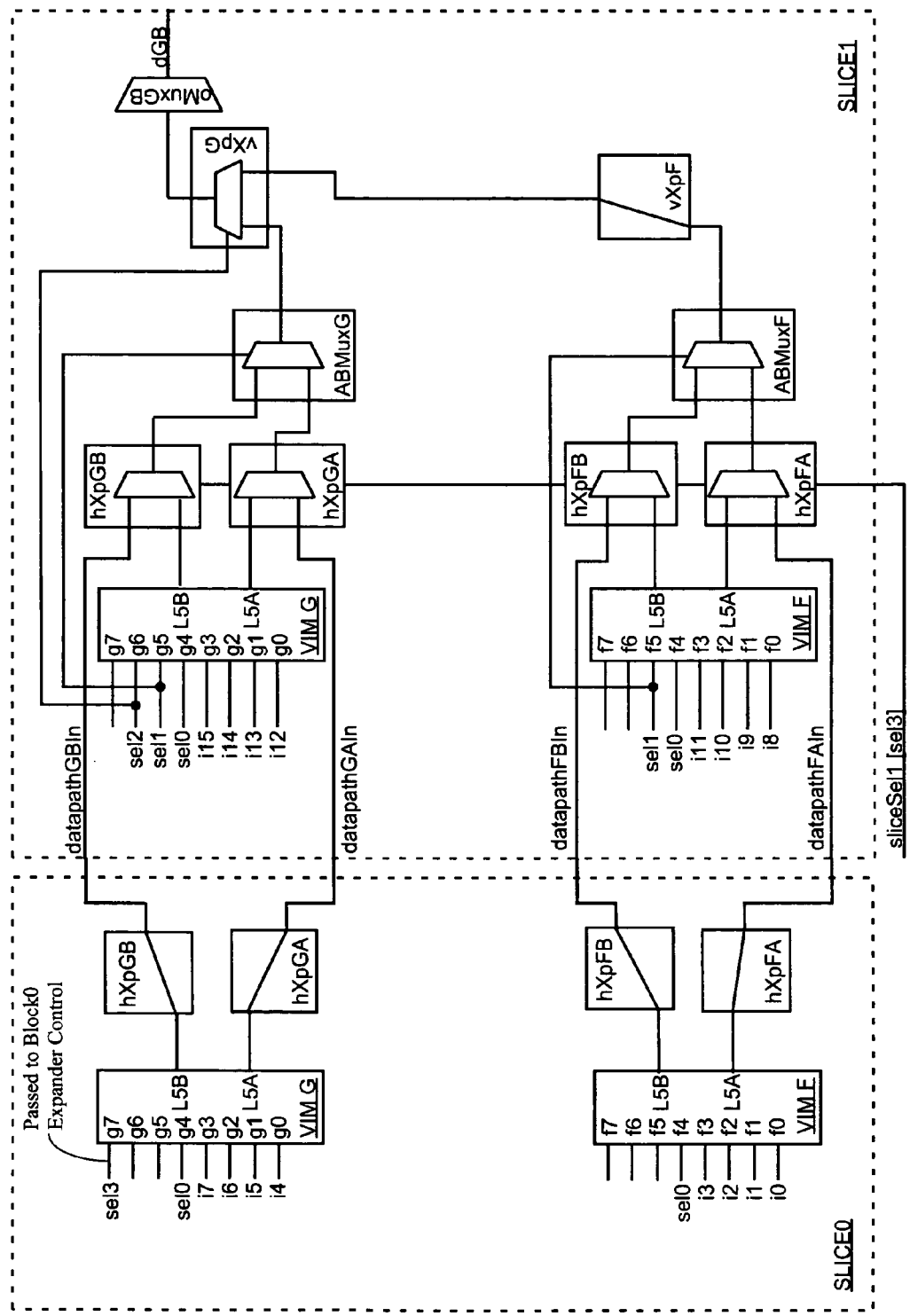

FIG. 19 shows how two horizontally-positioned slices (e.g., one block) can be combined using expanders to implement a 16:1 MUX. In this example, the CLE expansion control block is placed in Block mode.

In slice 0, each half-VIM implements a 2:1 MUX, the outputs of which are placed on the horizontal expander chain via h-expanders hXp configured in Get-On mode. For example, VIM F of slice 0 can provide on the L5A output terminal the 2:1 MUX function of input signals i0 and i1, under the control of a first select signal sel0, while providing on the L5B output terminal the 2:1 MUX function of input signals i2 and i3, also controlled by the sel0 signal. Similarly, VIM G of slice 0 can provide on the L5A and L5B output terminals the 2:1 MUX functions of input signals i4 and i5, i6 and i7, respectively, also under the control of sel0. In slice 1, four additional 2:1 MUX functions under the control of sel0 are provided, thus introducing eight additional input signals i8–i15.

In slice 1, the outputs of horizontally-positioned half-LUTs are combined in pairs using the h-expanders configured in 2:1 MUX mode. The control signal for each h-expander is slice select signal sliceSel1, which is a second select signal sel3 provided on the g7 data input terminal of slice 0 (see FIG. 5 and Table 2). Thus, each of the four h-expanders in slice 1 provides an independent 4:1 MUX function controlled by select signals sel0 and sel3.

The outputs of the h-expanders are now combined, in pairs associated with each VIM. The outputs of h-expanders hXpFA and hXpFB are combined using AB expander ABMuxF configured in 2:1 MUX mode. The outputs of h-expanders hXpGA and hXpGB are combined using AB expander ABMuxG configured in 2:1 MUX mode. Each of the resulting multiplexers is controlled by a third select signal sel1, which is placed on the f5 or g5 data input terminal of the associated VIM. Thus, each of the two AB expanders in slice 1 provides an independent 8:1 MUX function controlled by select signals sel0, sel1, and sel3.

The outputs of the AB expanders are now combined using the vertical expander chain. V-expander vXpF is configured in Get-On mode, in which mode it places the output of AB expander ABMuxF onto the vertical expander chain. V-expander vXpG is configured in 2:1 MUX mode, in which it selects between the outputs of the two AB expanders. The control signal for this multiplexer is a fourth select signal sel2, which is placed on the g6 data input terminal of VIM G (g6(1)). Thus, the output of v-expander vXpG in slice 1 is a 16:1 MUX function of the 16 input signals i0–i15, under control of the four select signals sel0–sel3. This 16:1 MUX output signal can be extracted via the output multiplexer oMuxGB.

Figure 20:
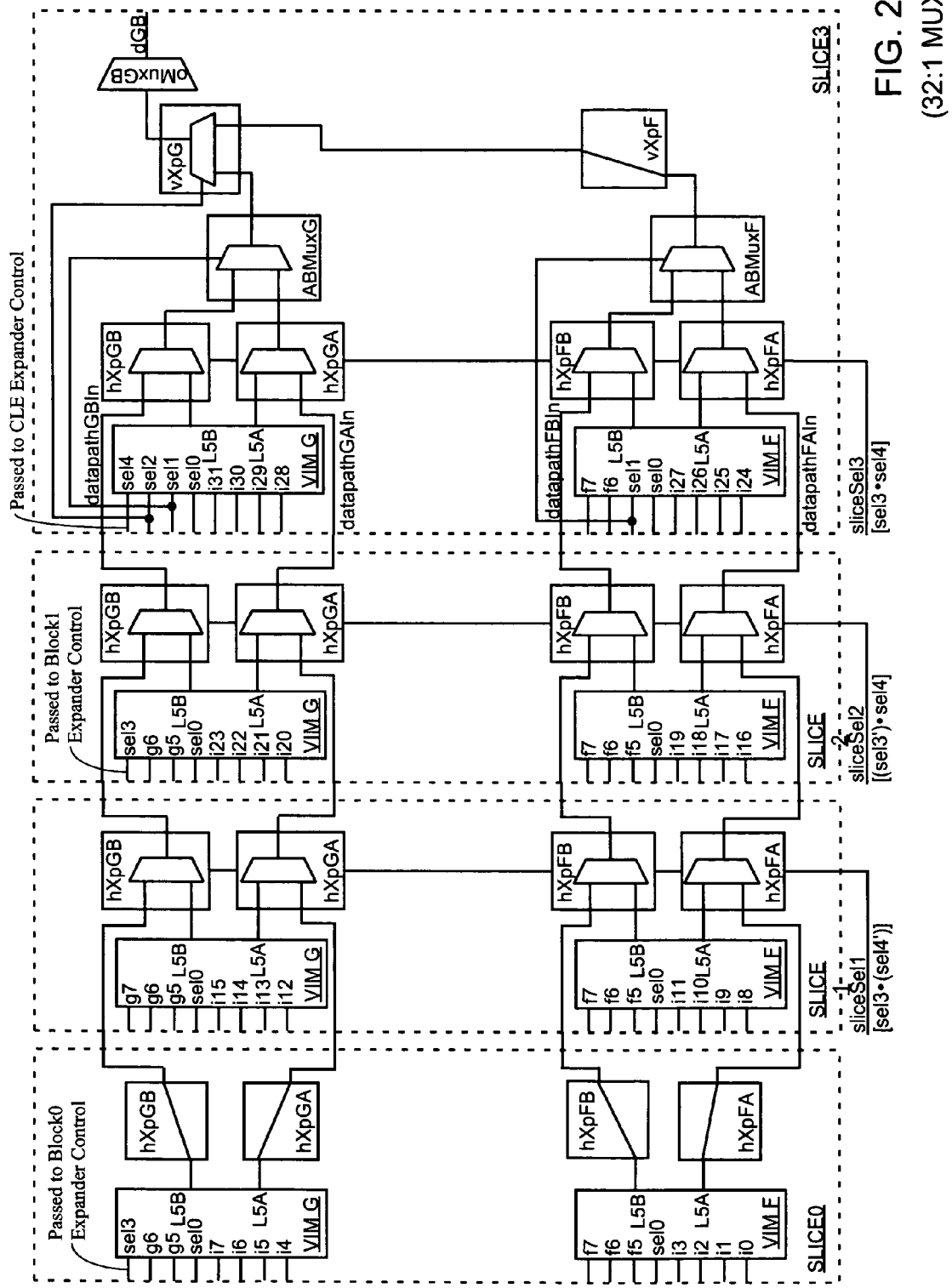

FIG. 20 shows how four slices (e.g., one CLE) can be combined using expanders to implement a 32:1 MUX. In this example, the CLE expansion control block is placed in CLE mode.

In the example of FIG. 20, each VIM provides two 2:1 MUXes under control of the same select signal sel0. Two more select signals are provided on the g7 input terminals of slices 0 and 2 (sel3 in both cases) and the g7 input terminal of slice 3 (sel4). These two signals sel3, sel4 are used to generate the slice select signals sliceSel1, sliceSel2, and sliceSel3 (see FIG. 5). These slice select signals control the h-expanders in slices 1–3, respectively, which are configured in 2:1 MUX mode. (The h-expander in slice 0 is configured in Get-On mode, to initiate the h-expander chain.)

The h-expanders in slice 0 each provide the output of a 2:1 MUX. The h-expanders in each succeeding slice (slices 1–3) each select between the value on the horizontal expander chain and the value provided by the associated VIM. Thus, the h-expanders in slice 1 provide the output of a 4:1 MUX; the h-expanders in slice 2 provide the output of a 6:1 MUX; and the h-expanders in slice 3 provide the output of an 8:1 MUX. There are four such 8:1 MUXes, each controlled by select signals sel0, sel3, and sel4.

The AB expanders and v-expanders in slice 3 are configured as in slice 1 in the example of FIG. 19. The AB expanders in 2:1 MUX mode are controlled by select signal sel1, which is provided on the associated f5 or g5 data input terminal of the associated VIM. Therefore, the AB expanders each provide a 16:1 MUX function controlled by the select signals sel0, sel1, sel3, and sel4. V-expander vXpG in 2:1 MUX mode is controlled by select signal sel2, which is placed on the g6 data input terminal of VIM G. Thus, the output of v-expander vXpG in slice 3 is a 32:1 MUX function of the 32 input signals i0–i31, under the control of five select signals sel0-sel4. This 32:1 MUX output signal can be extracted via the output multiplexer OMuxGB.

FIG. 21 shows how the VIMs of multiple CLEs can be combined using expanders to implement MUXes that are larger than 32:1. In this example, the CLE expansion control block is placed in the Default mode. Thus, the cleSel control signal is an active contributor to the functionality of the CLE.

To implement a MUX having more than 32 inputs, an Nth select signal selN is provided using the g7 data input terminal of VIM G in slice 1 (g7(1)). This select signal iN is then ANDed with select signals sel3 and sel4 in the expansion control block of FIG. 5, and is included in the slice select signals controlling the h-expanders in 2:1 MUX mode. Also, the CLE select signal cleSel now comes into play. Rather than being held high, as in the previous examples, cleSel reflects the value of the iN select signal (see FIG. 5 and Table 2). As shown in slice 3 of FIG. 21, several CLEs can then be combined by extending the vertical expander chain across the CLE boundaries. The vertical expander chain can be initiated using a v-expander (e.g., vXpF) in Get-On mode, and the final result can be extracted using an output multiplexer (e.g., oMuxGB), as shown in FIG. 20.

For example, to implement a 64:1 MUX (i.e., N=5), two vertically-positioned CLEs can be used, with select signal sel5 being provided to one CLE (at g7(1)) and the inverse of signal sel5 (sel5') being provided to the other CLE (also at g7(1)). To implement a 128:1 MUX, four vertically-positioned CLEs are required, with select signals sel5 and sel6 being combined using other VIMs to generate four different CLE select signals for the four CLEs. Using this technique, multiplexers of any size can be generated.

In another embodiment (not pictured), the SOP expanders have a 2:1 MUX expander mode. In this embodiment, the SOP expander of slice 3 can be used to add additional MUX select signals. For example, a 64:1 MUX can be created by combining two horizontally-positioned CLEs.

Another method of creating large multiplexers (not pictured) is to extend the horizontal expander chain past the boundaries of the CLE. Referring to FIG. 21, the slice 0 h-expanders are configured in 2:1 MUX mode. The sliceSel0 signal then becomes active, and the value of sliceSel0 is already set 6to (sel3')·(sel4')·selN (see FIG. 5 and Table 2). Thus, additional input and select signals can be provided in slices to the left of the pictured slice. The expander chains can thus be extended either vertically, horizontally, or both, to form VIM complexes having any desired aspect ratio.

Implementing Large Tristate Buffers

Figure 24:
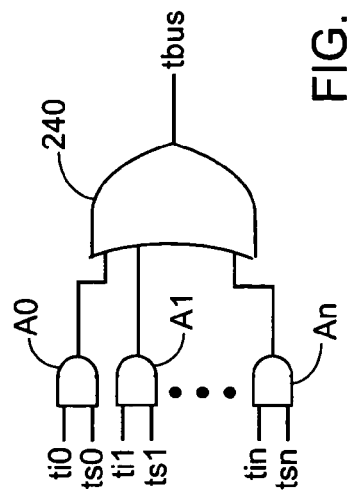
FIGS. 22–27 show how to implement various exemplary tristate buffers using the CLE of FIG. 1 and the slice of FIG. 2.
Figure 22:
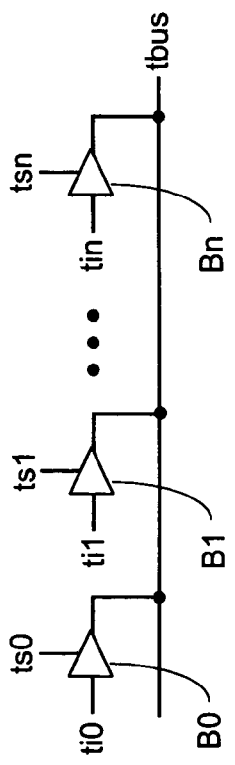
Figure 23:
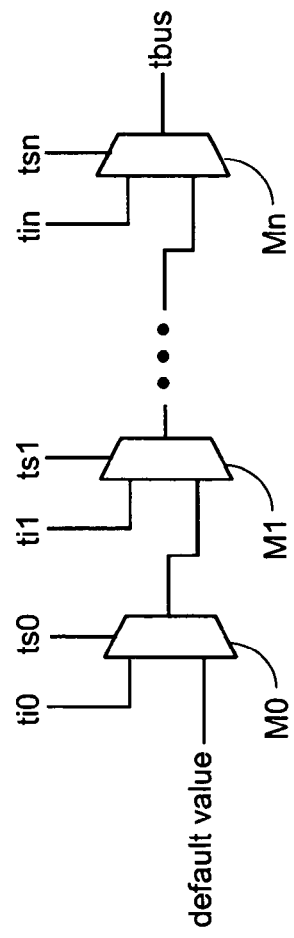

FIGS. 22–24 show various known methods of implementing wide tristate buffers.

FIG. 22 shows a general tristate buffer ("TBuf") structure used in prior art FPGAs. In these FPGAs, each CLE optionally drives one or more tristate buffers B0–Bn, any of which can place a value on a signal line tbus running parallel to a row of CLEs. Each tristate buffer B0–Bn is controlled by a tristate control signal ts0–tsn, respectively, to place one of the input signals ti0–tin, respectively, on the tbus line. A default value is sometimes provided by adding a weak pullup (not shown) to the tbus line. This weak pullup can be overcome by any of the tristate buffers 220–22n driving a value onto the line.

FIG. 23 shows an equivalent multiplexer implementation to the TBuf structure of FIG. 22. MUXes M0–Mn are controlled by tristate control signals ts0–tsn, respectively, to pass either the current input signal ti0–tin or the output of the previous MUX in the chain. A default value is provided on one input of the first MUX 230 in the chain.

Note that the multiplexer circuit shown in FIG. 23 differs from the tristate buffer circuit of FIG. 22 in that the multiplexer circuit of FIG. 23 is not bidirectional. In other words, the "tbus" output of the multiplexer chain in FIG. 23 can only be accessed at the right hand end of the chain, while the "tbus" output of the circuit in FIG. 22 is accessible at any point along its length. The exemplary TBuf structure shown in FIG. 25 (described below) implements the multiplexer circuit of FIG. 23 rather than the TBuf structure of FIG. 22.

FIG. 24 shows another equivalent structure using AND and OR gates. Each input signal ti0–tin is ANDed with the corresponding tristate control signal ts0–tsn in AND gates A0–An. The resulting values are ORed together using wide OR gate 240 to provide the output signal on the tbus line.

Figure 25:
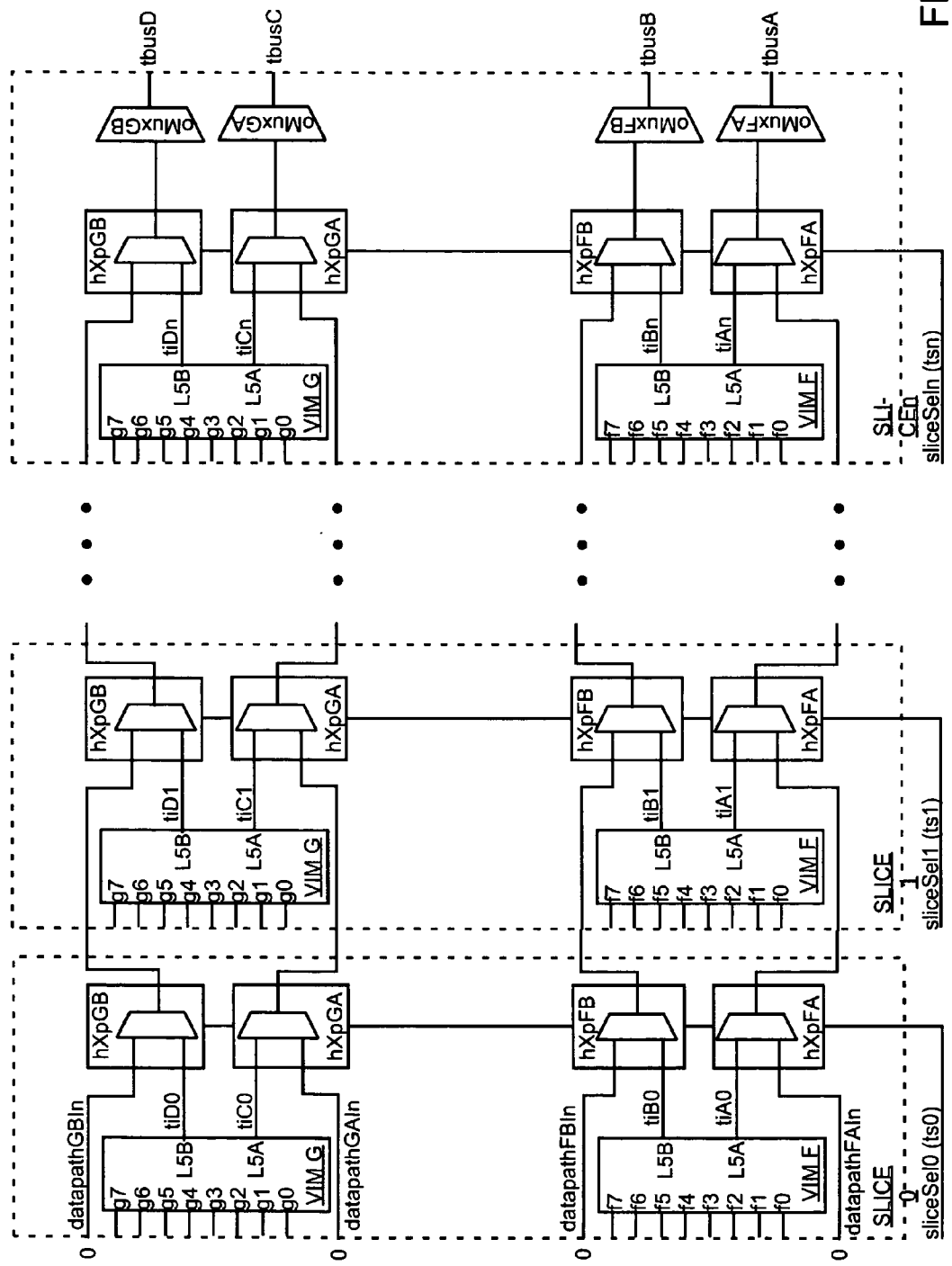
Figure 26:
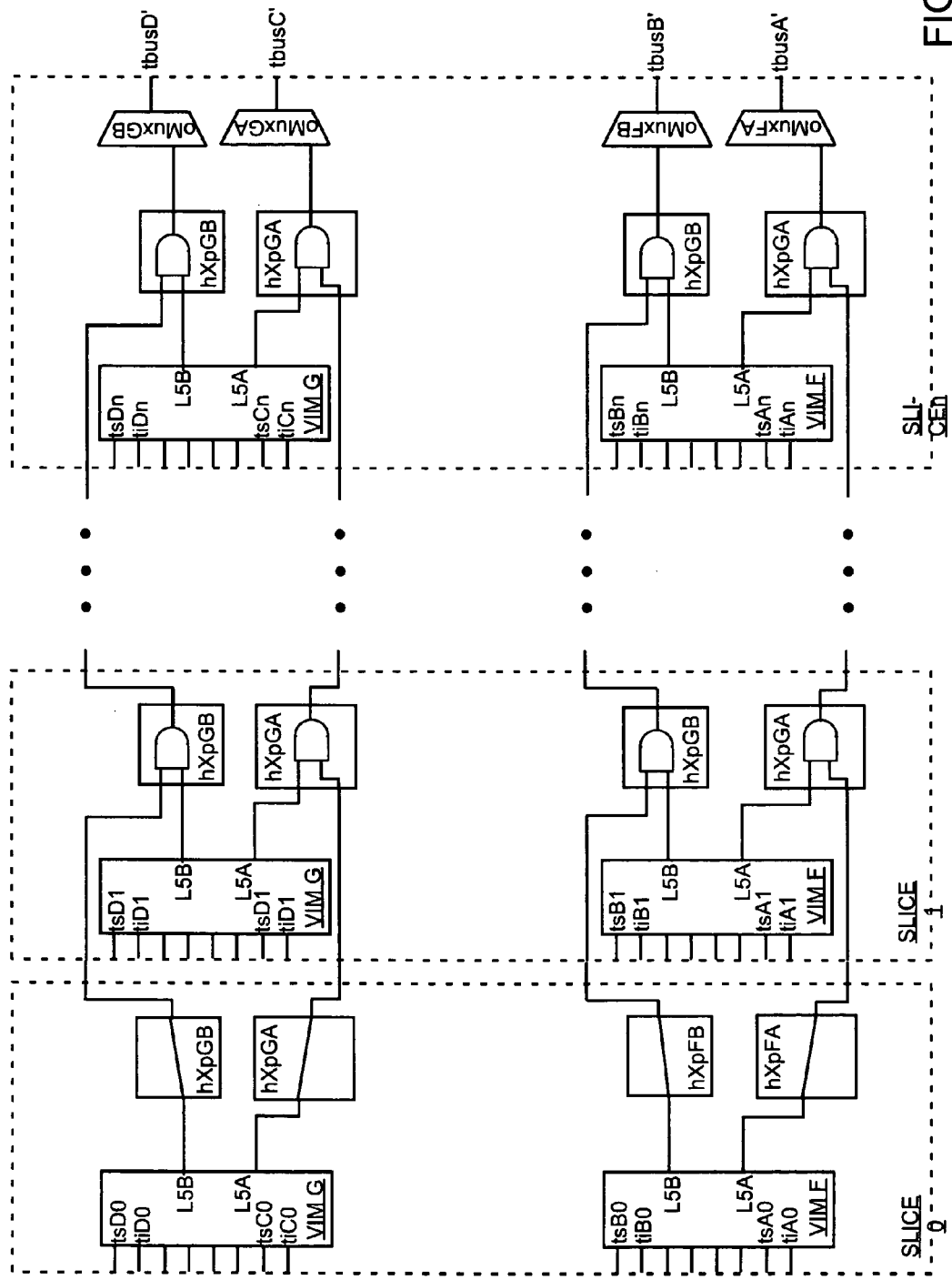
Figure 27:
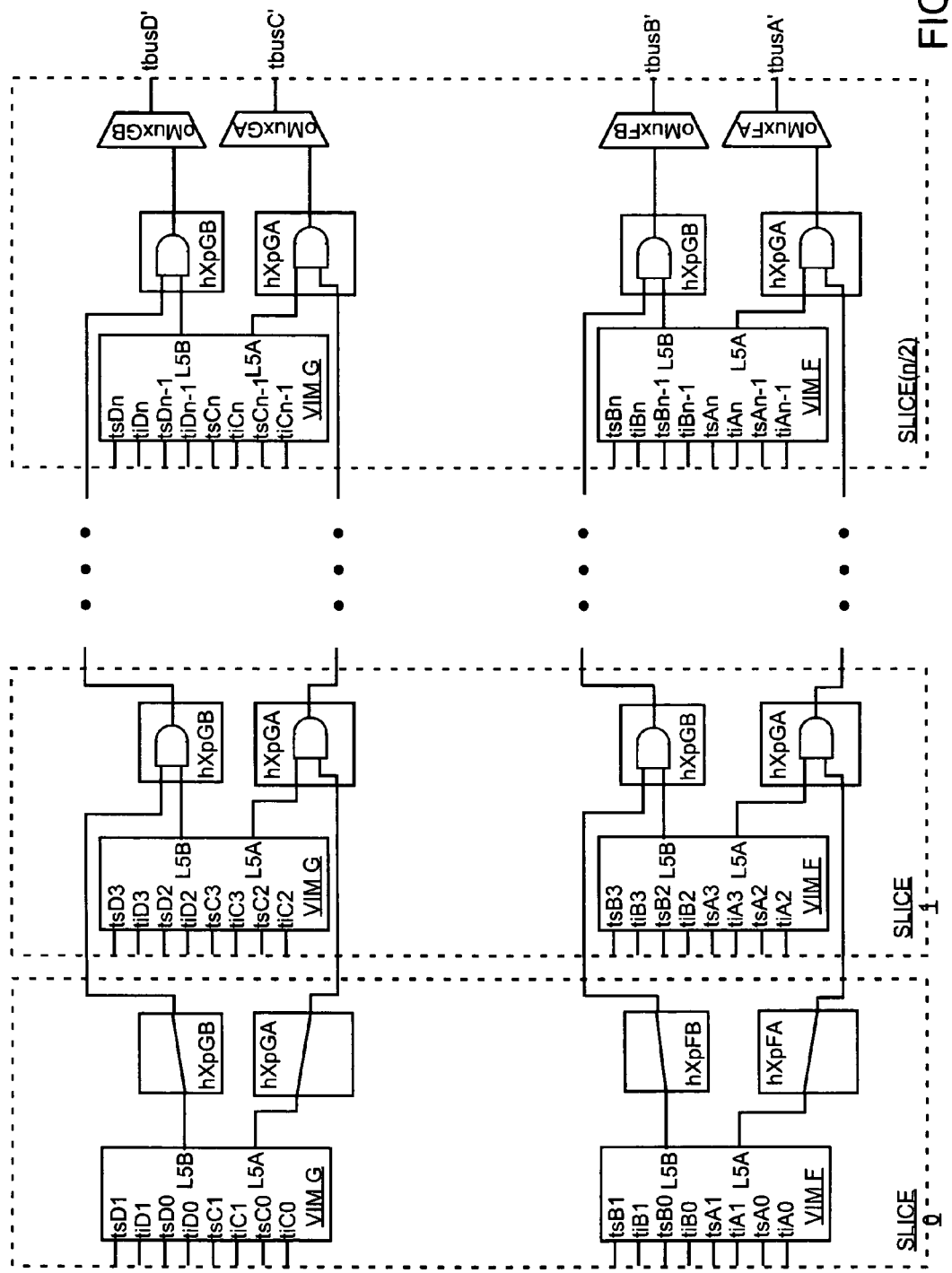

FIGS. 25–27 show how to implement various exemplary TBuf structures using the expander chains in the slice of FIG. 2. Because wide tristate buffers can be implemented using the expander chains, dedicated tristate buffers (such as buffers B0–Bn in FIG. 22) need not be included in the CLE. Instead, any of the following three implementations can be used, with the choice preferably being made by FPGA mapping and placement software or synthesis software to maximize speed or to consume the least amount of CLE resources, as required by the customer.

FIG. 25 shows how multiple VIMs can be combined using horizontal expanders to implement the MUX-based TBuf structure of FIG. 23. The h-expanders are configured in 2:1 MUX mode to perform the functions of MUXes M0–Mn in FIG. 23. The tristate control signals ts0–tsn are provided via the slice select signals sliceSel0–sliceSeln, respectively. Appropriate signals are placed on the g6 and g7 terminals of the various slices, from which they are routed to the expansion control block, where they are decoded to provide the slice select signals.

The input signals ti0–tin are generated by the VIMs operating in 5-LUT mode. In the example of FIG. 25, a default value of "0" (i.e., logic low) is provided by placing this value on the datapathIn terminals of slice 0. In the pictured embodiment, the "0" value is generated in another LUT (not shown) and routed onto the horizontal expander chain using an h-expander in Get-On mode, with the L5 signal being placed on the horizontal expander chain. In other embodiments, the "0" value is provided by a pulldown controlled by a memory cell, by a weak pulldown that is always active but is easily overridden by a high value placed on the datapathIn terminal, or by providing another mode to the h-expander that places a "0" value on the horizontal expander chain.

Each slice can provide four TBuf chains, provided that the tristate select signals ts0–tsn are shared among the four chains. This is not a severe limitation, because tristate buffer structures are often used to generate busses (e.g., groups of 8 or 16 bits), where each bit of a bus is controlled by the same tristate control signals ts0–tsn acting on different input signals ti0–tin.

FIG. 26 provides a first example of how multiple VIMs can be combined using horizontal expanders to implement the AND/OR TBuf structure of FIG. 24. Note that this structure includes a potentially large number of 2-input AND gates, followed by a single potentially large OR gate. Clearly, the small 2-input AND gates could be efficiently implemented using half-VIMs, while the large OR gate could be implemented using a horizontal expander chain that can be extended as long as necessary. In one embodiment, the h-expanders can be configured as OR gates. However, in the pictured embodiment the h-expanders do not have this capability, so the logic of FIG. 24 is converted using de Morgan's theorem to equivalent logic using a wide AND gate, as shown in FIG. 26A.

Figure 26A:
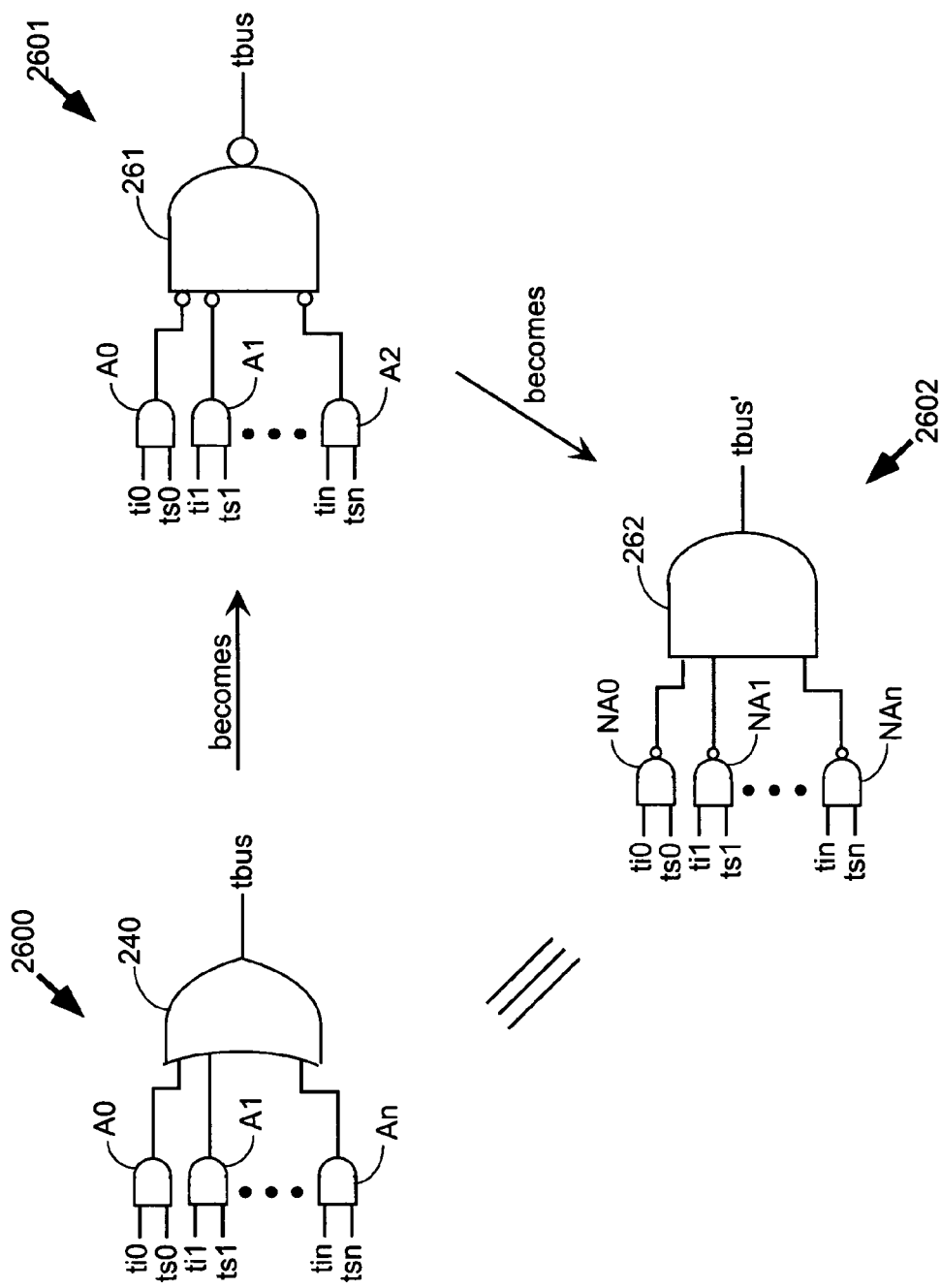
FIG. 26A shows how the TBuf structure of FIG. 24 has been modified to a logically equivalent structure to obtain the implementation used in the VIM complex of FIG. 26.

In FIG. 26A, implementation 2600 of the TBuf structure is the same as that of FIG. 24. In implementation 2601, wide OR gate 240 is replaced by an equally wide NAND gate 261 having inverted (or "bubbled") inputs. In implementation 2602, the bubbles on the inputs of NAND gate 261 have been pushed back into AND gates A0–An, resulting in NAND gates NA0–NAn. NAND gate 261 providing output signal tbus has been replaced by AND gate 262 providing output signal tbus' (the inverse of tbus). Implementation 2602 is well-suited to efficient implementation in the pictured embodiment.

FIG. 26 shows how implementation 2602 is implemented using the horizontal expander chain. NAND gates NA0–NAn are implemented in half-VIMs in 5-LUT mode, with their output signals being provided on the L5A, L5B output terminals of the VIMs. The h-expander in the first slice (e.g., slice 0) is placed in Get-On mode, with the L5 signal being placed on the horizontal expander chain. Each subsequent h-expander (e.g., slice 1 to n) is configured in 2:1 AND mode, ANDing between the associated L5 output signal and the value on the horizontal expander chain. Thus, AND gate 262 is implemented on the horizontal expander chain.

Note that with only one 2-input NAND-gate being implemented in each half-VIM, other user logic can potentially be included in the half-VIM as well.

FIG. 27 provides a second example of how multiple VIMs can be combined using horizontal expanders to implement the AND/OR TBuf structure of FIG. 24. This example makes more efficient use of the VIM lookup tables, by placing more TBuf logic into each VIM. However, there is less opportunity to add user logic to the VIM. In one embodiment, the implementation software selects among the three implementations of FIGS. 25, 26, and 27 based on the suitability of associated user logic to be included in the VIMs, among other factors.

Figure 27A:
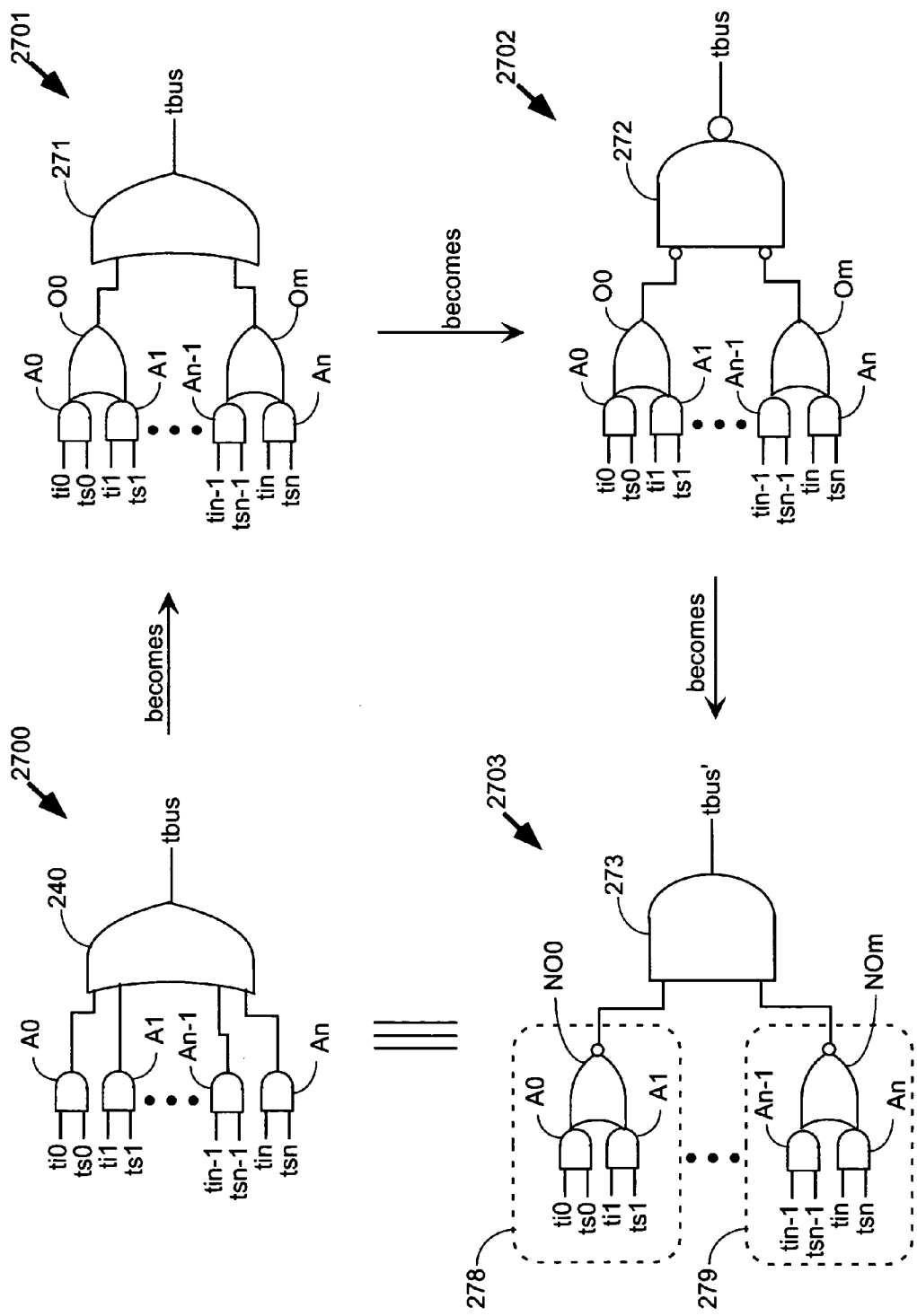
FIG. 27A shows how the TBuf structure of FIG. 24 has been modified to a logically equivalent structure to obtain the implementation used in the VIM complex of FIG. 27.

FIG. 27A shows the conversion of the TBuf structure of FIG. 24 to a second form more suitable for implementation in the pictured embodiment. Implementation 2700 of the TBuf structure is the same as that of FIG. 24. In implementation 2701, wide OR gate 240 is replaced by an OR gate 271 with half as many inputs, with the outputs of AND gates A0–An being paired and combined using OR gates O0–Om. In implementation 2702, OR gate 271 is replaced by a NAND gate 272 having inverted (or "bubbled") inputs. In implementation 2703, the bubbles on the inputs to NAND gate 272 have been pushed back into OR gates O0–Om, resulting in NOR gates NO0–NOm. NAND gate 272 providing output signal tbus has been replaced by AND gate 273 providing output signal tbus' (the inverse of tbus). Implementation 2703 is well-suited to efficient implementation in the pictured embodiment.

FIG. 27 shows how implementation 2703 is implemented using the horizontal expander chain. AND gates A0–An and their associated NOR gates NO0–NOm are implemented in half-VIMs in 5-LUT mode, with their output signals being provided on the L5A, L5B output terminals of the VIMs. For example, logic grouping 278, comprising AND gates A0, A1 and NOR gate NO0, can be placed in a single half-VIM. Logic grouping 279, comprising AND gates An-1, An and NOR gate NOm, can be placed in the other half of the same VIM. Although a VIM in 5-LUT mode shares two input terminals between the two 5-LUTs, in this embodiment each 5-LUT uses only one of the two shared terminals, so two 4-input functions having fully independent input signals can be implemented in the same VIM.

The h-expander in the first slice (e.g., slice 0) is placed in Get-On mode, with the L5 signal being placed on the horizontal expander chain. Each subsequent h-expander (e.g., slice 1 to n/2) is configured in 2:1 AND mode, ANDing between the associated L5 output signal and the value on the horizontal expander chain. Thus, AND gate 273 is implemented on the horizontal expander chain.

Note that this example uses only half as many slices as the example of FIG. 26, because twice as many tristate buffers are implemented in each VIM.

Implementing Large RAMs

FIGS. 28–35 show how to implement exemplary random access memories (RAMs) of various sizes and configurations. Note that these examples are very similar to the examples of implementing large lookup tables (see FIGS. 11–16). The reason for this similarity is that the functionality of a lookup table and a RAM can be virtually identical. In fact, LUTs are usually implemented as memory cell arrays. The data in the memory cells is provided by programming the memory cells with configuration data representing the function to be implemented by the LUT. The data inputs to the LUT are then decoded and used to address the memory array, selecting from among the programmed data values the one value representing the desired function of the input values provided (see FIG. 3). Thus, a LUT is simply a RAM array that can be read from at any time, although sometimes it can be written to only through the FPGA configuration process.

The LUTs of presently available FPGAs typically have the additional feature that the RAM array can be written, as well as read, during operation of the user circuit. This capability is imparted by adding a RAM control circuit that provides timing and control signals for writing to the RAM. A RAM array can be read at any time, and usually provides output data (read data) at all times based on the values of the input signals. However, a write operation must be controlled to occur only when valid write data is available and a write operation is desired. Otherwise, the contents of the RAM array could be overwritten constantly and unpredictably. In the slice of FIG. 2, this RAM control function is provided by the RAM control block RC.

RAM control block RC performs the following functions. Firstly, when the VIM implements a 2-bit wide RAM, it forwards address bits adr0–adr4 to VIM F and VIM G and forwards data bits dA and dB to VIM inputs dA and dB, respectively. The VIM is configured to write these bits into the two locations defined by adr0–adr4. Secondly, when the VIM implements a 1-bit wide RAM, it forwards address bits adr0–adr5 to VIM F and VIM G and forwards data bit "d" to both VIM inputs dA and dB. The VIM is configured to write the data to the single bit defined by adr0–adr5. Thirdly, the RAM control block gates the clock input signal "clk" with the write enable signal "we" to provide write strobe signal ws. Write strobe signal ws is controlled by address bit adr6 and the sliceSel signal to select one, both, or neither VIM in the slice. Note that data input dA and address bit adr5 are never needed at the same time; therefore, they share a common input terminal (see, for example, FIGS. 28 and 29). Similarly, data inputs "d" and dB also use the same VIM input terminal.

RAM control blocks are well known in the art of FPGA design. The slice of FIG. 2 could use, for example, a RAM control block broadly similar to that used in the Virtex-II FPGA available from Xilinx, Inc.

The LUTs of some presently-available FPGAs have various RAM operating modes. For example, some LUTs can be configured as either single-port RAMs or dual-port RAMs. In single-port RAM mode, the RAM keeps only a single copy of each data value stored in the memory array. Thus, a RAM with n address inputs can implement a (2\*\*n)×1 single-port RAM, where 2\*\*n is 2 to the nth power. If the same RAM is configured as two bits wide instead of one, the "height" of the RAM is cut in half, and the single-port RAM can implement a (2\*\*(n−1))×2 RAM.

A single-port RAM has one read port (i.e., provides one read value at a time) and one write port (i.e., can write only one value to the RAM at one time). Sometimes applications require a RAM to have more than one read port and/or write port. In the present embodiment, a dual-port RAM with two read ports and a single write port is supported. As is well-known in the arts of RAM and FPGA design, such a dual-port RAM can be emulated using a pair of single-port RAMs. The described dual-port RAM keeps duplicate copies of the data stored in each single-port RAM. Thus, two values can be read from two different addresses at the same time, one from each single-port RAM. The data is provided at the output terminals of the two RAMs, thereby providing two read ports. Only a single write port is provided, i.e., only one value can be written at a time, and only to one address. The data is written simultaneously to the same address in both single-ported RAMs. Clearly, because each data value is stored in two single-port RAMs, a dual-port RAM requires twice as many resources to implement as a single-port RAM with the same capacity.

Figure 34:
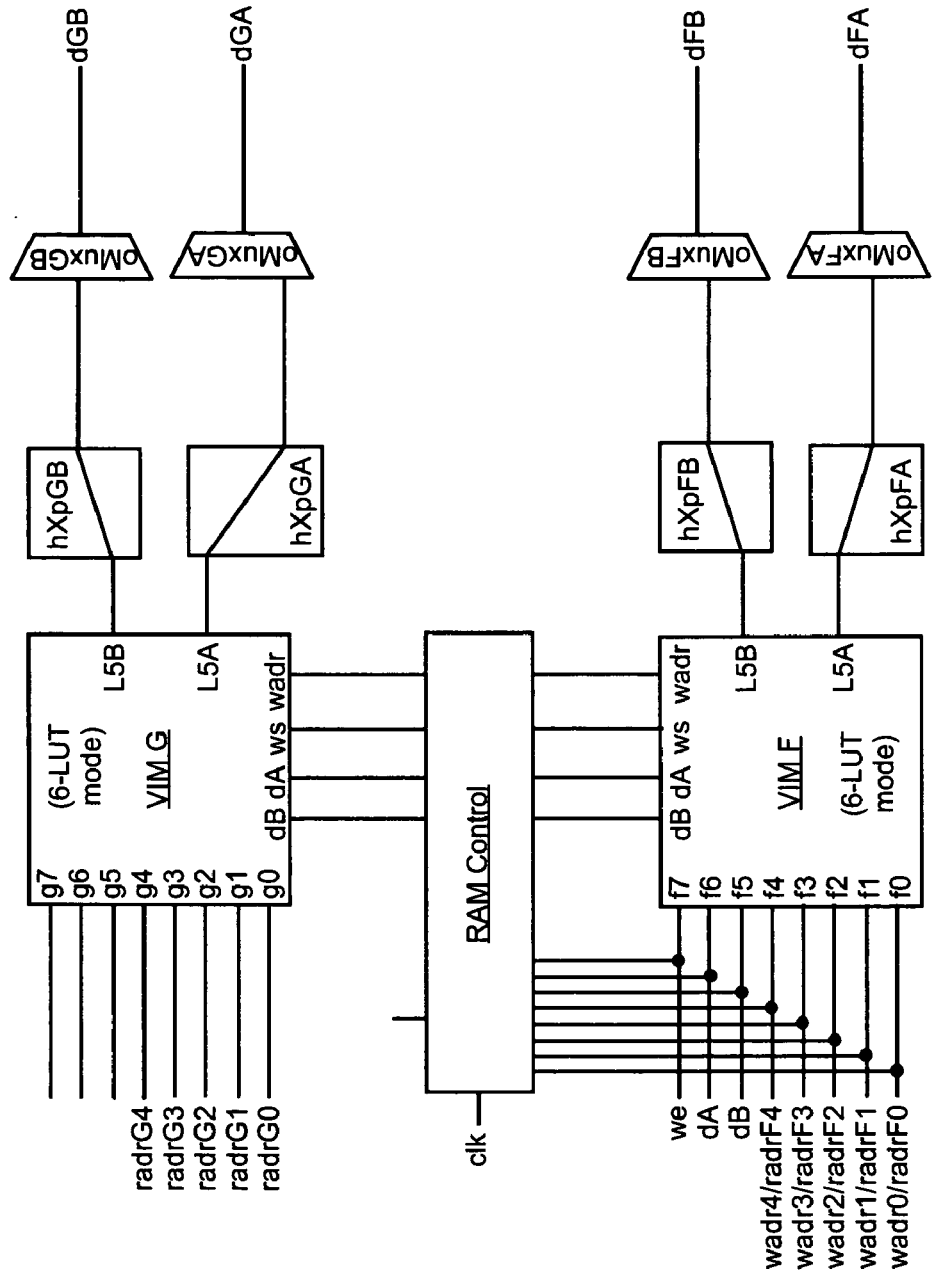
Figure 35:
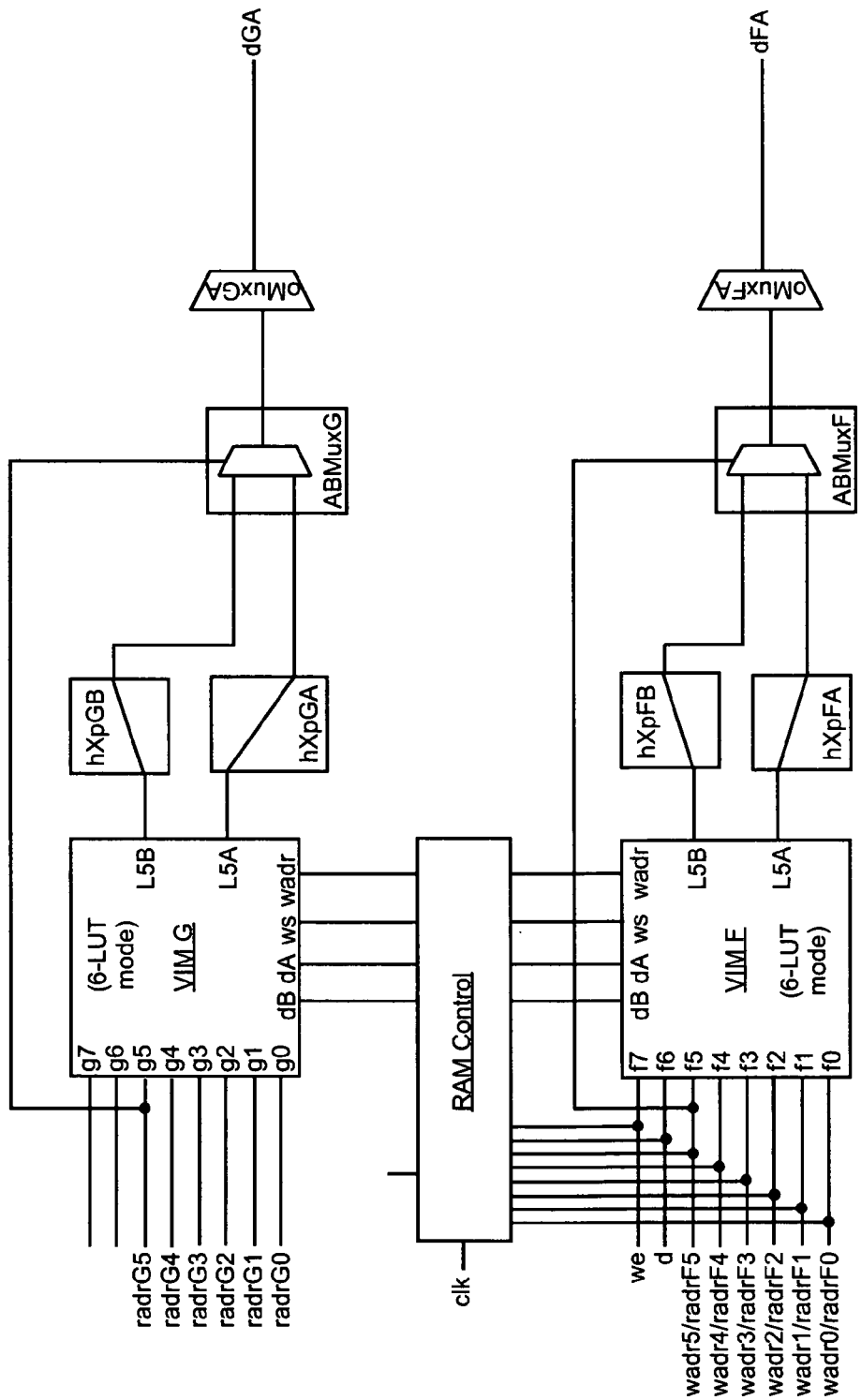

FIGS. 28–33 show examples of single-port RAMs that can be implemented in the pictured embodiment. FIGS. 34–35 show examples of dual-port RAMs. In all of these examples, all VIMs are in 6-LUT mode.

FIG. 28 shows how a single VIM can be used to implement a 32×2 single-port RAM. Because 32=2\*\*5, there are five address inputs adr0–adr4, which are provided on VIM data input terminals f0–f4. The two write data inputs dA and dB are provided on VIM data input terminals f5 and f6. Essentially, each half-VIM acts as a 32×1 RAM, with write data input dA being provided to the half-VIM generating the L5A output, and write data input dB being provided to the half-VIM that generates the L5B output. The write enable signal we is provided on the f7 data input terminal. All of these RAM input signals are also provided to the RAM control block. In this embodiment, the slice select signal sliceSel is also provided to the RAM control block and acts as a RAM enable signal. The RAM control block provides the dA and dB signals to the VIM, along with a write strobe signal ws and a write address signal wadr.

The expanders in the example of FIG. 28, which implements a 32×2 memory, are configured the same as the example of FIG. 11, which implements two 5-input LUTs. This correlation is logical, based on the remarks above. However, note that the 32×2 RAM implementation uses a VIM in 6-LUT mode, so that the address inputs can be shared between the two bits of the memory.

FIG. 29 shows how a single VIM can be used to implement a 64×1 single-port RAM. Because 64=2\*\*6, there are six address inputs adr0–adr5, which are provided on VIM data input terminals f0–f5. Because the memory is only one bit wide, only one write data input is needed. The write data input d is provided on VIM data input terminal f6. Essentially, each half-VIM acts as a 32×1 RAM addressed by the address inputs adr0–adr4. Which half-VIM is written is determined by the RAM control block based on address bit adr5, as described above. For reading, the two 32×1 RAMs are combined into one 64×1 RAM using the AB expander configured in 2:1 MUX mode, with the address input adr5 being used to control the resulting multiplexer. The expanders in the example of FIG. 29, which implements a 64×1 memory, are configured the same as the example of FIG. 12, which implements a 6-input LUT.

Figure 30:
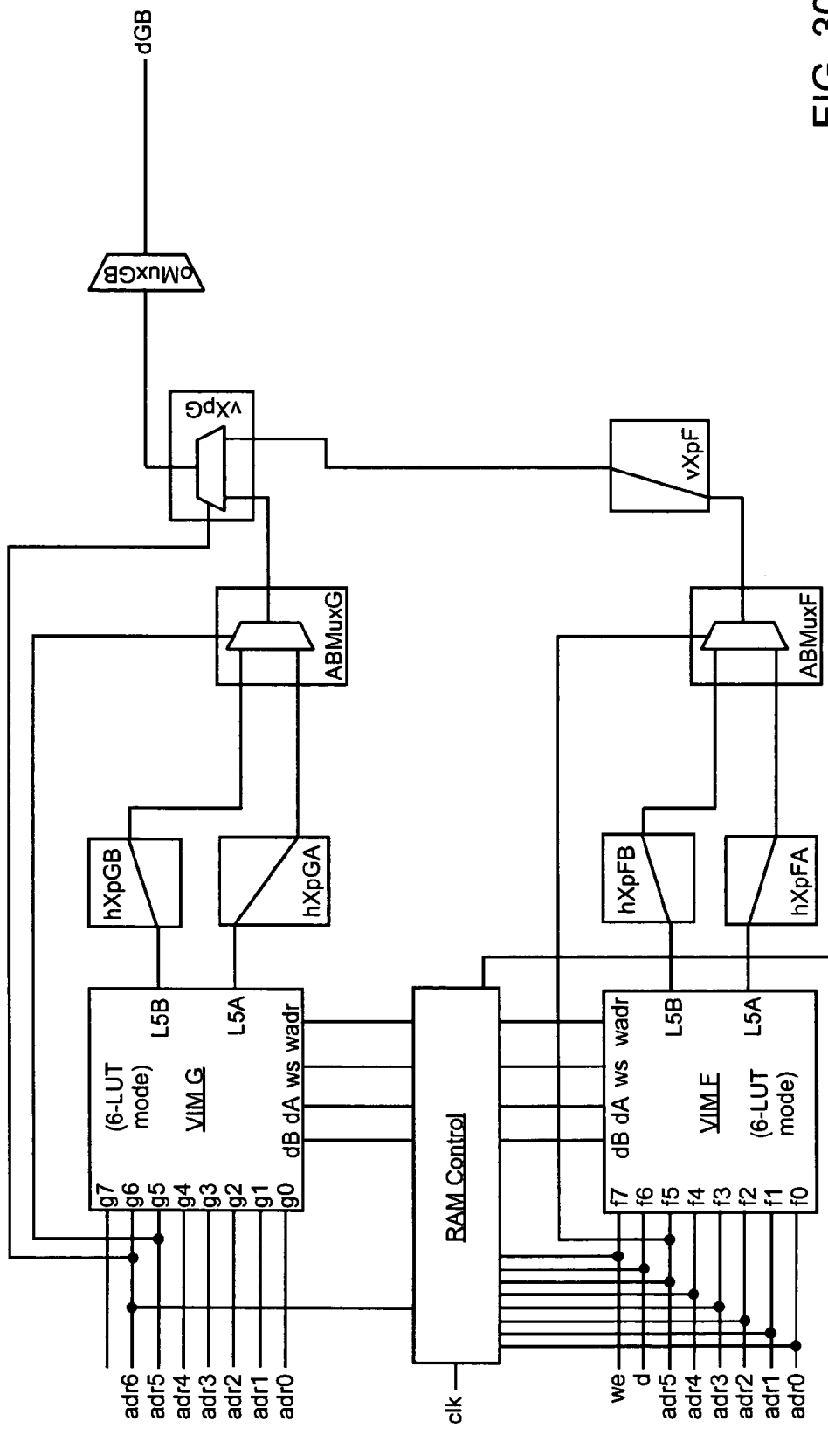

FIG. 30 shows how the two VIMs of one slice can be combined using expanders to implement one 128×1 single-port RAM. Because 128=2\*\*7, there are seven address inputs adr0–adr6. The first six address inputs, adr0–adr5, are provided on VIM data input terminals f0–f5 and g0–g5, as in the example of FIG. 29. The seventh address input, adr6, is provided on the g6 data input terminal and is used to control the v-expander in 2:1 MUX mode. The write data input d is provided on VIM data input terminal f6. Essentially, each VIM and associated AB expander act as a 64×1 RAM, with the two 64×1 RAMs being combined into one 128×1 RAM using the v-expanders. The expanders in the example of FIG. 30, which implements a 128×1 memory, are configured the same as the example of FIG. 13, which implements a 7-input LUT.

Figure 31:
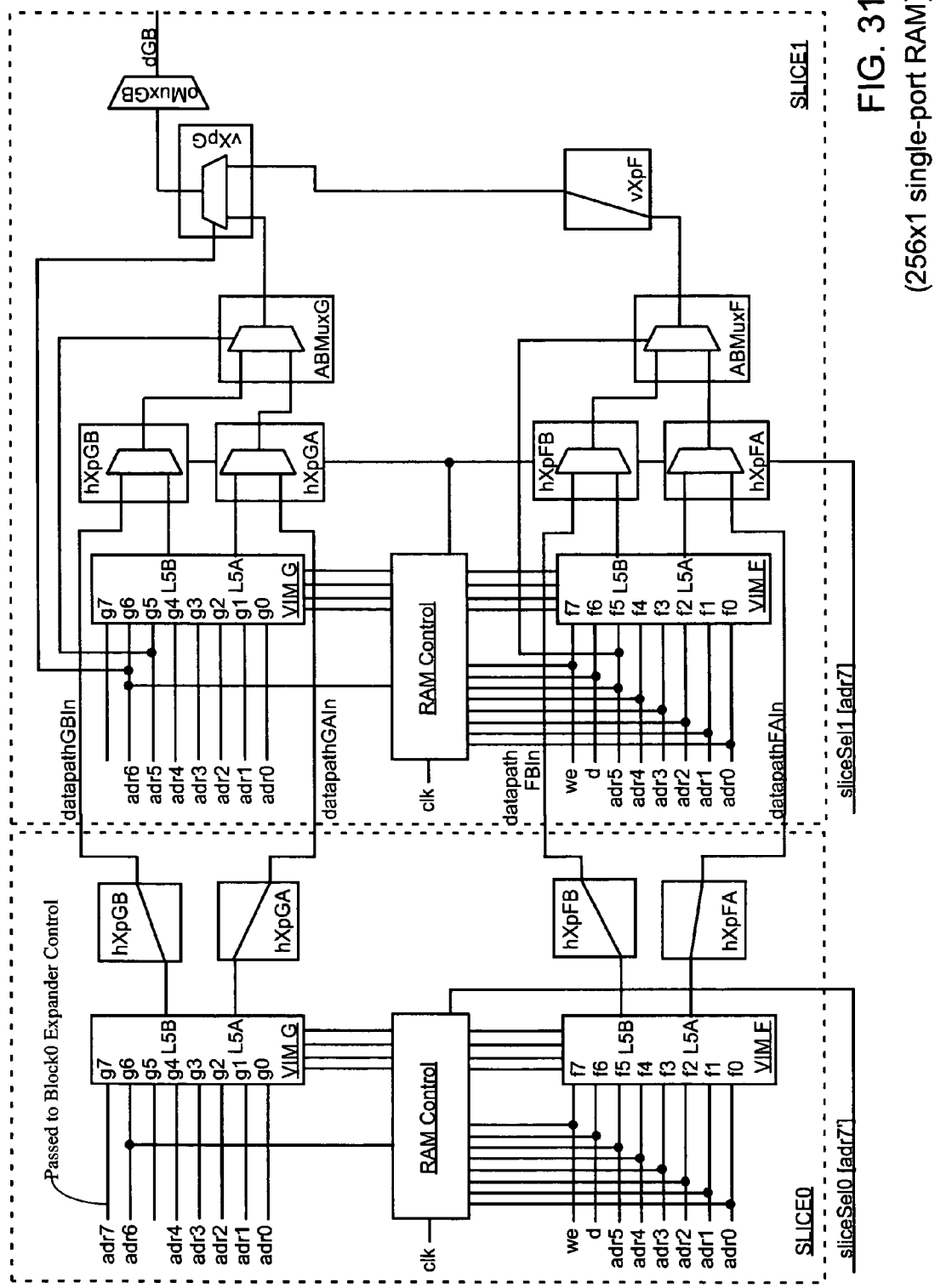

FIG. 31 shows how two slices (e.g., one block) can be combined using expanders to implement one 256×1 single-port RAM. This example closely resembles the 8-input LUT of FIG. 14. As in the example of FIG. 14, the CLE expansion control block is placed in Block mode.

Because 256=2\*\*8, there are eight address inputs adr0–adr7. In slice 0, the first five address inputs, adr0–adr4, are provided on VIM data input terminals f0–f4 and g0–g4. Each half-VIM implements a 32×1 RAM of five address inputs adr0–adr4, the output of which is placed on the horizontal expander chain via h-expanders hXp configured in Get-On mode. In slice 1, each half-VIM implements a 32×1 RAM with the same five address inputs adr0–adr4 (provided on VIM data input terminals f0–f4 and g0–g4). These 32×1 RAM values are combined with the values from the four horizontal expander chains, using the h-expanders of slice 1 configured in 2:1 MUX mode. The select signal for the 2:1 MUX mode of the h-expanders is the slice select signal sliceSel1. Signal sliceSel1 is based on the g7 data input signal from slice 0 (see FIG. 5), so the adr7 input signal is placed on the g7(0) data input terminal. Thus, each of the four h-expanders in slice 1 provides the output of a 64×1 RAM addressed by the six address signals adr0–adr4 and adr7.

Note that the adr5 and adr6 address inputs are also provided to slice 0, on data input terminals f5 and g6, respectively. These inputs are provided to the RAM control block of slice 0, where they are used to decode the write address when writing RAM data into the VIMs. During the read process, some of the decoding is done outside the VIMs, where the expanders are used to decode the adr5, adr6, and adr7 signals. However, during the write process these three address signals must be taken into account when determining in which VIM to write the data. Therefore, they are all provided to the RAM control block, where the decoding takes place. The RAM control block only enables a write to an associated VIM if the values of adr5, adr6, and adr7 address the VIM. Therefore, the RAM control blocks for the four slices differ slightly, in that they decode different addresses based on these signals. The write data input d is provided on VIM data input terminal f6 of each slice, and the write enable signal we is provided on the f7 data input terminal of each slice. These signals are also provided to the RAM control block.

The outputs of the h-expanders are now combined using the AB expanders configured in 2:1 MUX mode. The seventh address input, adr5, is provided to the f5 and g5 data input terminals in slice 1, where it is used to control the resulting multiplexer. Thus, each horizontal expander chain and associated AB expander act as a 128×1 RAM addressed by the seven address signals adr0–adr5 and adr7.

The outputs of the AB expanders are now combined using the vertical expander chain. The eighth address input, adr6, is provided on the g6 data input terminal of slice 1, and is used to control the v-expander in 2:1 MUX mode. Thus, the two 128×1 RAMs from the horizontal expander chains and the AB expanders are combined into one 256×1 RAM using the v-expanders. The 256×1 RAM is addressed by address signals adr0–adr7.

Figure 32:
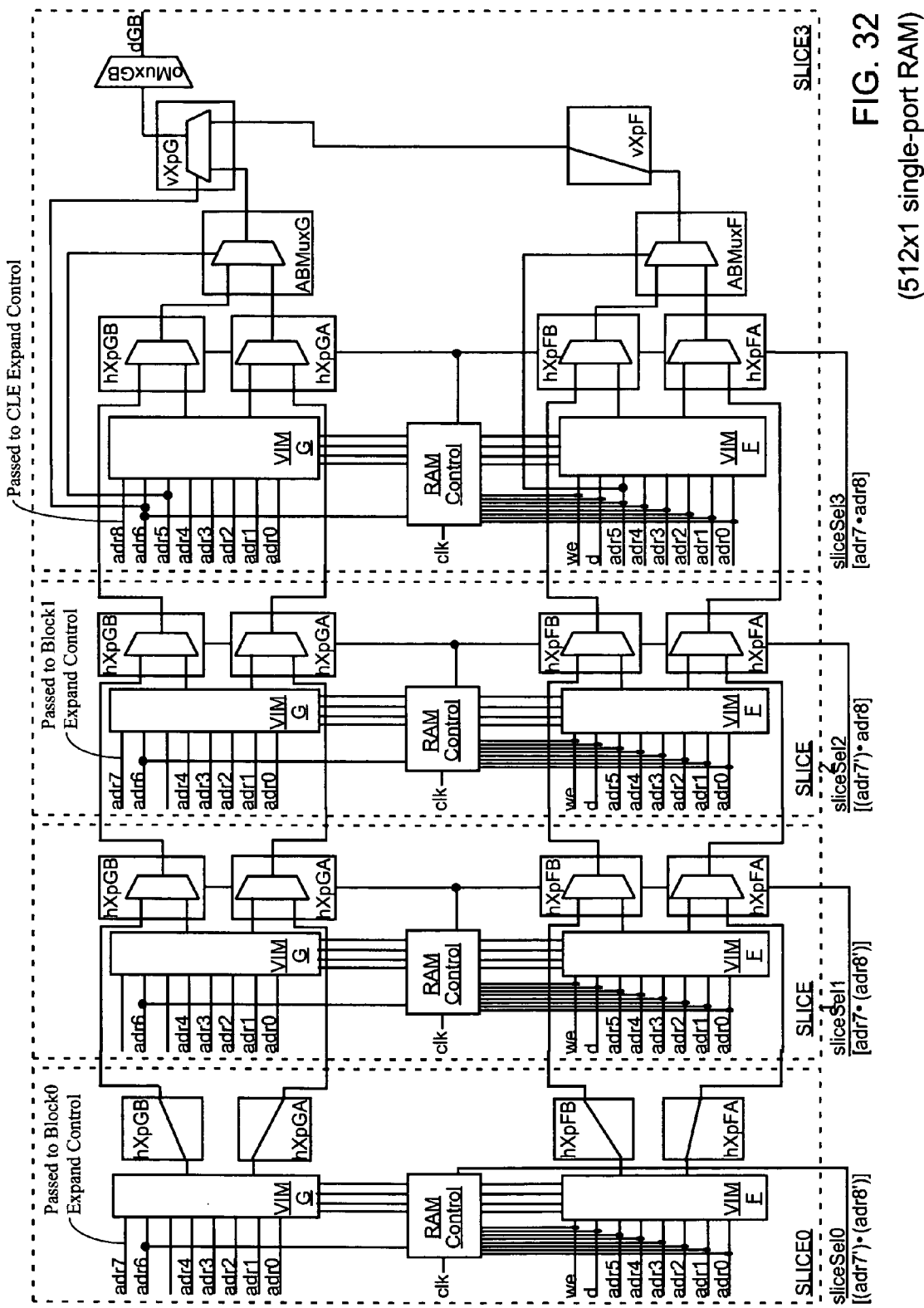

FIG. 32 shows how four slices (e.g., one CLE) can be combined using expanders to implement one 512×1 single-port RAM. This example closely resembles the 9-input LUT of FIG. 15. As in the example of FIG. 15, the CLE expansion control block is placed in CLE mode.

Because 512=29, there are nine address inputs adr0–adr8. Address inputs adr0–adr4 are provided to all VIMs. Therefore, each VIM provides two 32×1 RAMs addressed by the same five address signals adr0–adr4. Two more address signals are provided on the g7 input terminals of slices 0 and 2 (adr7 in both cases) and the g7 input terminal of slice 3 (adr8). These two address signals adr7, adr8 are used to generate the slice select signals sliceSel1, sliceSel2, and sliceSel3 (see FIG. 5). These slice select signals control the h-expanders in slices 1–3, respectively, which are configured in 2:1 MUX mode. (The h-expander in slice 0 is configured in Get-On mode, to initiate the h-expander chain.) Thus, each of the four h-expanders in slice 3 provides the output of a 128×1 RAM addressed by the seven address signals adr0–adr4, adr7, and adr8**.

As in the example of FIG. 31, the adr5 and adr6 address inputs are also provided to each slice, on data input terminals f5 and g6, respectively. The write data input d is provided on VIM data input terminal f6 of each slice, and the write enable signal we is provided on the f7 data input terminal of each slice.

The AB expanders and v-expanders in slice 3 are configured as in slice 1 in the example of FIG. 31. The AB expanders in 2:1 MUX mode are controlled by address signal adr5, which is provided on the f5 or g5 data input terminal of the associated VIM. Therefore, each of the two AB expanders in slice 3 provides the output of a 256×1 RAM addressed by the eight address signals adr0–adr5, adr7, and adr8. V-expander vXpG in 2:1 MUX mode is controlled by the adr6 signal, which is placed on the g6 data input terminal of VIM G. Thus, the output of v-expander vXpG in slice 3 is a 512×1 RAM function addressed by the nine address signals adr0–adr8.

Figure 33:
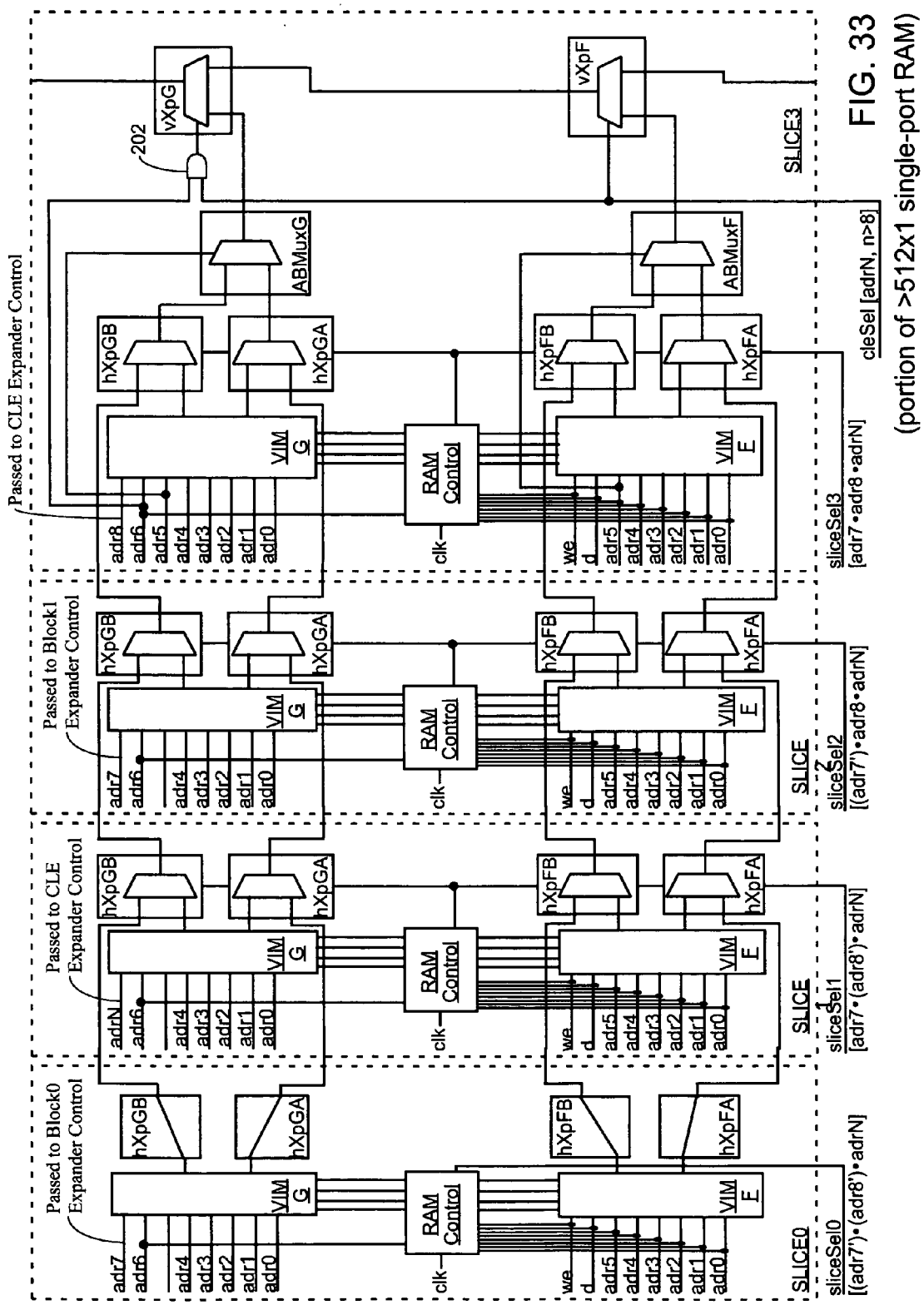

FIG. 33 shows how the VIMs of multiple CLEs can be combined using expanders to implement single-port RAMs that are larger than 512×1. This example closely resembles the example of FIG. 16. As in the example of FIG. 16, the CLE expansion control block is placed in Default mode. Thus, the cleSel control signal is an active contributor to the functionality of the CLE.

To implement a single-port RAM larger than 512×1, an Nth address signal adrN is provided using the g7 data input terminal of VIM G in slice 1 (g7(1)). This address signal adrN is then ANDed with address signals adr7 and adr8 in the expansion control block of FIG. 5, and is included in the slice select signals controlling the h-expanders in 2:1 MUX mode. Also, the CLE select signal cleSel now comes into play. Rather than being held high, as in the previous examples, cleSel reflects the value of the adrN address signal (see FIG. 5 and Table 2). As shown in slice 3 of FIG. 33, several CLEs can then be combined by extending the vertical expander chain across the CLE boundaries. The vertical expander chain can be initiated using a v-expander (e.g., vXpF) in Get-On mode, and the final result can be extracted using an output multiplexer (e.g., oMuxGB), as shown in FIG. 32.

For example, to implement a 1024×1 RAM (i.e., N=9), two vertically-positioned CLEs can be used, with adr9 being provided to one CLE (at g7(1)) and the inverse of address signal adr9 (adr9') being provided to the other CLE (also at g7(1)). To implement a 2048×1 RAM, four vertically-positioned CLEs are required, with address signals adr9 and adr10 being combined using other VIMs to generate four different CLE select signals for the four CLEs. Using this technique, RAMs of any size can be generated.

In another embodiment (not pictured), the SOP expanders have a 2:1 MUX expander mode. In this embodiment, the SOP expander of slice 3 can be used to add additional address inputs. For example, a 1024×1 RAM can be created by combining two horizontally-positioned CLEs.

FIG. 34 shows how the two VIMs of one slice can be combined using expanders to implement one 32×2 dual-port RAM with two read ports and one write port. The 32×2 dual-port RAM of FIG. 34 resembles two copies of the 32×2 single-port RAM of FIG. 28, placed in the same slice. Both VIMs are controlled by the same RAM control block, so they have shared control signals. Also, only one set of VIM data input terminals (f0–f4) is used to provide a write address (wadr0–wadr4). There are two read ports, with read addresses radrF0–4 being provided to VIM F on data input terminals f0–f4, and read addresses radrG0–4 being provided to VIM G on data input terminals g0–g4. Write data inputs dA and dB are provided on VIM data input terminals f5 and f6, respectively, with the write enable control signal we being provided on data input terminal f7.

FIG. 35 shows how the two VIMs of one slice can be combined using expanders to implement one 64×1 dual-port RAM with two read ports and one write port. The 64×1 dual-port RAM of FIG. 35 resembles two copies of the 64×1 single-port RAM of FIG. 29, placed in the same slice. Both VIMs are controlled by the same RAM control block, so they have shared control signals. Also, only one set of VIM data input terminals (f0–f5) is used to provide a write address (wadr0–wadr5). There are two read ports, with read addresses radrF0–5 being provided to VIM F on data input terminals f0–f5, and read addresses radrG0–5 being provided to VIM G on data input terminals g0–g5. Address signals radrF5 and radrG5 are used to control the associated AB expanders in 2:1 MUX mode, thereby providing the sixth address input. Only one write data input d is required, which is provided on VIM data input terminal f6. The write enable control signal we is provided on VIM data input terminal f7.

To implement larger dual-port RAMs, techniques similar to those shown in FIGS. 31–33 are used.

CONCLUSION

Those having skill in the relevant arts of the invention will now perceive various modifications and additions that may be made as a result of the disclosure herein. For example, CLEs, logic blocks, slices, logic elements, lookup tables, VIMs, LUTs, PAL logic, control circuits, expanders, expander modes, expansion modes, memories, RAMs, and multiplexers other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims.

The invention claimed is:

1. A configurable circuit, comprising:
   a plurality of data input terminals comprising first, second, and third sets of data input terminals;
   a programmable multiplexer having first and second sets of input terminals coupled respectively to the first and second sets of data input terminals, and further having output terminals;
   a memory array having a plurality of input terminals coupled to the plurality of data input terminals, a plurality of address terminals coupled to the third set of data input terminals, and a plurality of output terminals; and
   an output multiplexer having a plurality of input terminals coupled to the output terminals of the memory array, a plurality of control terminals coupled to the output terminals of the programmable multiplexer, and a first output terminal.

2. The configurable circuit of claim 1, wherein the memory array comprises rows and columns of memory cells, the configurable circuit further comprising:
   a plurality of AND structures, each AND structure being coupled to the memory cells in one of the columns of the memory array; and
   a plurality of product term output terminals each coupled to an output terminal of one of the AND structures.

3. The configurable circuit of claim 1, wherein the output multiplexer comprises:
   a first multiplexer having a plurality of input terminals coupled to a first subset of the output terminals of the memory array, a plurality of control terminals coupled to the output terminals of the programmable multiplexer, and an output terminal coupled to the first output terminal of the output multiplexer; and
   a second multiplexer having a plurality of input terminals coupled to a second subset of the output terminals of the memory array, a plurality of control terminals coupled to the second set of data input terminals, and an output terminal coupled to a second output terminal of the output multiplexer.

4. The configurable circuit of claim 3, further comprising:
   an AB expander having a first input terminal coupled to the output terminal of the first multiplexer, a second input terminal coupled to the output terminal of the second multiplexer, and an output terminal, the AB expander having at least two configurable functions one of which is a multiplexer function.

5. The configurable circuit of claim 4, wherein the configurable functions of the AB expander include an OR function.

6. The configurable circuit of claim 1, wherein the plurality of data input terminals comprises eight input terminals.

7. The configurable circuit of claim 6, wherein the first and second sets of data input terminals each comprise three data input terminals, and the third set of data input terminals comprises two data input terminals.

8. A configurable circuit, comprising:
   a plurality of data input terminals comprising first, second, and third sets of data input terminals;
   a programmable multiplexer having first and second sets of input terminals coupled respectively to the first and second sets of data input terminals, and further having output terminals;
   a first memory array having a plurality of input terminals coupled to a first subset of the data input terminals, a plurality of address terminals coupled to the third set of data input terminals, and a plurality of output terminals;
   a second memory array having a plurality of input terminals coupled to a second subset of the data input terminals, a plurality of address terminals coupled to the third set of data input terminals, and a plurality of output terminals;
   a first output multiplexer having a plurality of input terminals coupled to the output terminals of the first memory array, a plurality of control terminals coupled to the output terminals of the programmable multiplexer, and an output terminal; and
   a second output multiplexer having a plurality of input terminals coupled to the output terminals of the second memory array, a plurality of control terminals coupled to the second set of data input terminals, and an output terminal.

9. The configurable circuit of claim 8, wherein the first and second memory arrays each comprise rows and columns of memory cells, the configurable circuit further comprising:
   a plurality of AND structures, each AND structure being coupled to the memory cells in one of the columns of each of the first and second memory arrays; and
   a plurality of product term output terminals each coupled to an output terminal of one of the AND structures.

10. The configurable circuit of claim 8, further comprising:
    an AB expander having a first input terminal coupled to the output terminal of the first output multiplexer, a second input terminal coupled to the output terminal of the second output multiplexer, and an output terminal, the AB expander having at least two configurable functions one of which is a multiplexer function.

11. The configurable circuit of claim 10, wherein the configurable functions of the AB expander include an OR function.

12. The configurable circuit of claim 8, wherein the plurality of data input terminals comprises eight input terminals.

13. The configurable circuit of claim 12, wherein the first and second sets of data input terminals each comprise three data input terminals, and the third set of data input terminals comprises two data input terminals.

* * * * *